(12) United States Patent
Kim et al.

(10) Patent No.: US 11,894,369 B2
(45) Date of Patent: Feb. 6, 2024

(54) SEMICONDUCTOR DEVICE

(71) Applicant: SAMSUNG ELECTRONICS CO., LTD., Suwon-si (KR)

(72) Inventors: Ho-Jun Kim, Suwon-si (KR); Hyungjin Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 52 days.

(21) Appl. No.: 17/570,979

(22) Filed: Jan. 7, 2022

(65) Prior Publication Data
US 2022/0415887 A1    Dec. 29, 2022

(30) Foreign Application Priority Data
Jun. 29, 2021  (KR) .................. 10-2021-0085032

(51) Int. Cl.
*H01L 27/085* (2006.01)
*H01L 27/088* (2006.01)
*H01L 21/8234* (2006.01)

(52) U.S. Cl.
CPC .. *H01L 27/0886* (2013.01); *H01L 21/823431* (2013.01); *H01L 21/823481* (2013.01)

(58) Field of Classification Search
CPC ......... H01L 27/0886; H01L 21/823431; H01L 21/8234; H01L 27/088; H01L 21/823481; H01L 29/42392; H01L 29/78696; H01L 21/823437; H01L 29/0673; H01L 29/775; H01L 21/823418; H01L 21/823462; H01L 21/823475; B82Y 10/00

USPC ........................................................ 257/128
See application file for complete search history.

(56) References Cited

U.S. PATENT DOCUMENTS

| | | | |
|---|---|---|---|
| 6,391,673 | B1 | 5/2002 | Ha et al. |
| 6,873,854 | B2 | 3/2005 | Crockett et al. |
| 6,898,436 | B2 | 5/2005 | Crockett et al. |
| 10,504,791 | B2 | 12/2019 | Liou et al. |
| 10,522,410 | B2 | 12/2019 | Economikos et al. |
| 10,651,284 | B2 | 5/2020 | Xie et al. |
| 10,861,752 | B2 | 12/2020 | Perng et al. |
| 10,916,477 | B2 | 2/2021 | Hung et al. |
| 10,943,993 | B2 | 3/2021 | Lin et al. |
| 2018/0145072 | A1* | 5/2018 | Kim et al. ............ H01L 27/088 |
| 2020/0075331 | A1* | 3/2020 | Noh et al. ............... H01L 21/02 |

(Continued)

FOREIGN PATENT DOCUMENTS

KR  10-1994-0001419 A   1/1994
KR      10-0343211 B1    7/2002

*Primary Examiner* — Tan N Tran
(74) *Attorney, Agent, or Firm* — Muir Patent Law, PLLC

(57) ABSTRACT

A semiconductor device including a substrate; gate structures spaced apart from each other on the substrate, each gate structure including a gate electrode and a gate capping pattern; source/drain patterns on opposite sides of the gate structures; first isolation patterns that respectively penetrate adjacent gate structures; and a second isolation pattern that extends between adjacent source/drain patterns, and penetrates at least one gate structure, wherein each first isolation pattern separates the gate structures such that the gate structures are spaced apart from each other, the first isolation patterns are aligned with each other, and top surfaces of the first and second isolation patterns are each located at a level the same as or higher than a level of a top surface of the gate capping pattern.

20 Claims, 55 Drawing Sheets

(56) References Cited

U.S. PATENT DOCUMENTS

| | | |
|---|---|---|
| 2020/0251379 A1 | 8/2020 | Wang |
| 2020/0312718 A1 | 10/2020 | Zang et al. |
| 2021/0036121 A1* | 2/2021 | Lim et al. ............. H01L 29/423 |
| 2021/0050854 A1 | 2/2021 | Song et al. |
| 2022/0262790 A1 | 8/2022 | Kim et al. |

* cited by examiner

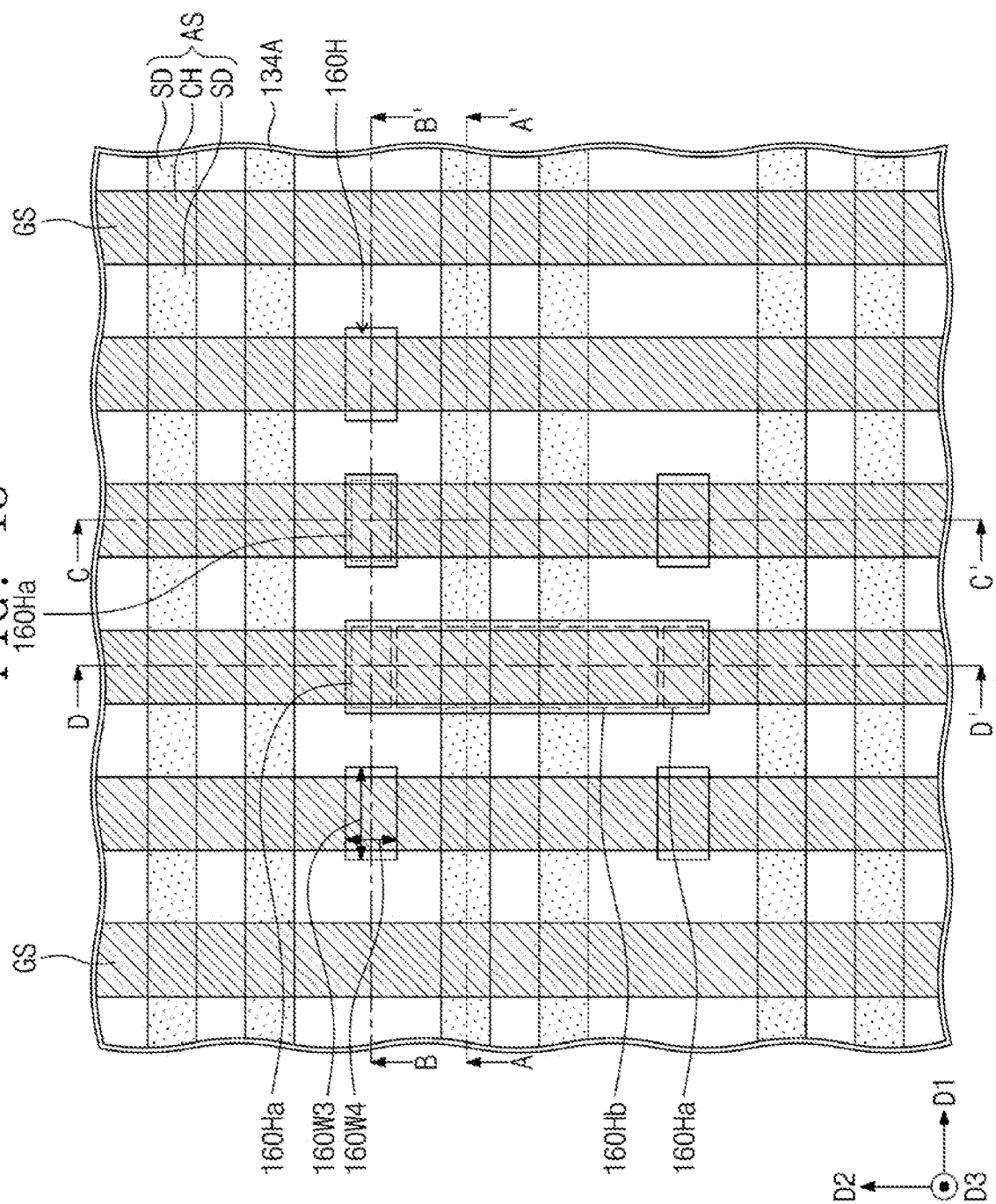

SEMICONDUCTOR DEVICE

CROSS-REFERENCE TO RELATED APPLICATION

This U.S. nonprovisional application claims priority under 35 U.S.C. § 119 to Korean Patent Application No. 10-2021-0085032 filed on Jun. 29, 2021, in the Korean Intellectual Property Office, the disclosure of which is hereby incorporated by reference in its entirety.

BACKGROUND

1. Field

Embodiments relate to a semiconductor device.

2. Description of the Related Art

A semiconductor device may include an integrated circuit including metal oxide semiconductor field effect transistors (MOSFETs). As size and design rule of the semiconductor device are gradually decreased, sizes of the MOSFETs are also increasingly scaled down.

SUMMARY

The embodiments may be realized by providing a semiconductor device including a substrate; a plurality of gate structures that are spaced apart from each other in a first direction on the substrate, the plurality of gate structures extending in a second direction intersecting the first direction, each gate structure of the plurality of gate structures including a gate electrode and a gate capping pattern on the gate electrode; a plurality of source/drain patterns on opposite sides of each gate structure of the plurality of gate structures; a plurality of first isolation patterns that respectively penetrate adjacent gate structures of the plurality of gate structures; and a second isolation pattern that extends in the second direction and between adjacent source/drain patterns of the plurality of source/drain patterns, and penetrates at least one gate structure of the plurality of gate structures, wherein each first isolation pattern of the plurality of first isolation patterns separates the plurality of gate structures such that the plurality of gate structures are spaced apart from each other in the second direction, the plurality of first isolation patterns are aligned with each other along the first direction, and top surfaces of the plurality of first isolation patterns and a top surface of the second isolation pattern are each located at a level the same as or higher than a level of a top surface of the gate capping pattern of each gate structure of the plurality of gate structures.

The embodiments may be realized by providing a semiconductor device including a substrate; a plurality of active patterns on the substrate, the plurality of active patterns extending in a first direction and being aligned with each other in a second direction that intersects the first direction; a device isolation layer between the plurality of active patterns; a plurality of gate structures spaced apart from each other in the first direction, the plurality of gate structures running across the plurality of active patterns and extending in the second direction; a plurality of source/drain patterns on opposite sides of each gate structure of the plurality of gate structures; a plurality of channel patterns between adjacent source/drain patterns of the plurality of source/drain patterns, the plurality of channel patterns protruding upwardly from the device isolation layer; a plurality of first isolation patterns that respectively penetrate the plurality of gate structures and are aligned with each other along the first direction, each first isolation pattern of the plurality of first isolation patterns separating the plurality of gate structures such that the plurality of gate structures are spaced apart from each other in the second direction; a second isolation pattern that extends between adjacent source/drain patterns of the plurality of source/drain patterns and in the second direction from one first isolation pattern of the plurality of first isolation patterns, the second isolation pattern penetrating at least one gate structure of the plurality of gate structures; a lower dielectric layer between the plurality of gate structures and extending between adjacent first isolation patterns of the plurality of first isolation patterns; an upper dielectric layer on the lower dielectric layer; and a plurality of first contacts that penetrate the upper dielectric layer and the lower dielectric layer and correspondingly connect with the plurality of source/drain patterns, wherein each gate structure of the plurality of gate structures includes a gate electrode; a gate capping pattern on the gate electrode; a gate dielectric pattern that extends along a bottom surface of the gate electrode; and a plurality of gate spacers on opposite sidewalls of the gate electrode, and wherein top surfaces of the plurality of first isolation patterns and a top surface of the second isolation pattern are each located at a level the same as or higher than a level of a top surface of the gate capping pattern of each gate structure of the plurality of gate structures.

The embodiments may be realized by providing a semiconductor device including a substrate; a plurality of active patterns on the substrate and extending in a first direction; a plurality of gate structures that are spaced apart from each other in the first direction on the substrate, the plurality of gate structures extending in a second direction intersecting the first direction, and crossing the plurality of active patterns; a plurality of source/drain patterns on the plurality of active patterns on opposite sides of each gate structure of the plurality of gate structures; a plurality of first isolation patterns that correspondingly penetrate adjacent gate structures of the plurality of gate structures, the plurality of first isolation patterns being aligned in the first direction; and a second isolation pattern that extends in the second direction between adjacent source/drain patterns of the plurality of source/drain patterns, and that penetrates at least one gate structure of the plurality of gate structures, wherein a bottom surface of the second isolation pattern is substantially coplanar with a bottom surface of one first isolation pattern of the plurality of first isolation patterns.

BRIEF DESCRIPTION OF THE DRAWINGS

Features will become apparent to those of skill in the art by describing in detail exemplary embodiments with reference to the attached drawings in which:

FIGS. 3, 5, 7, 9, 11, 13, 15, 17, and 19 illustrate plan views of stages in a method of fabricating a semiconductor device according to some embodiments.

DETAILED DESCRIPTION

Figure 1:
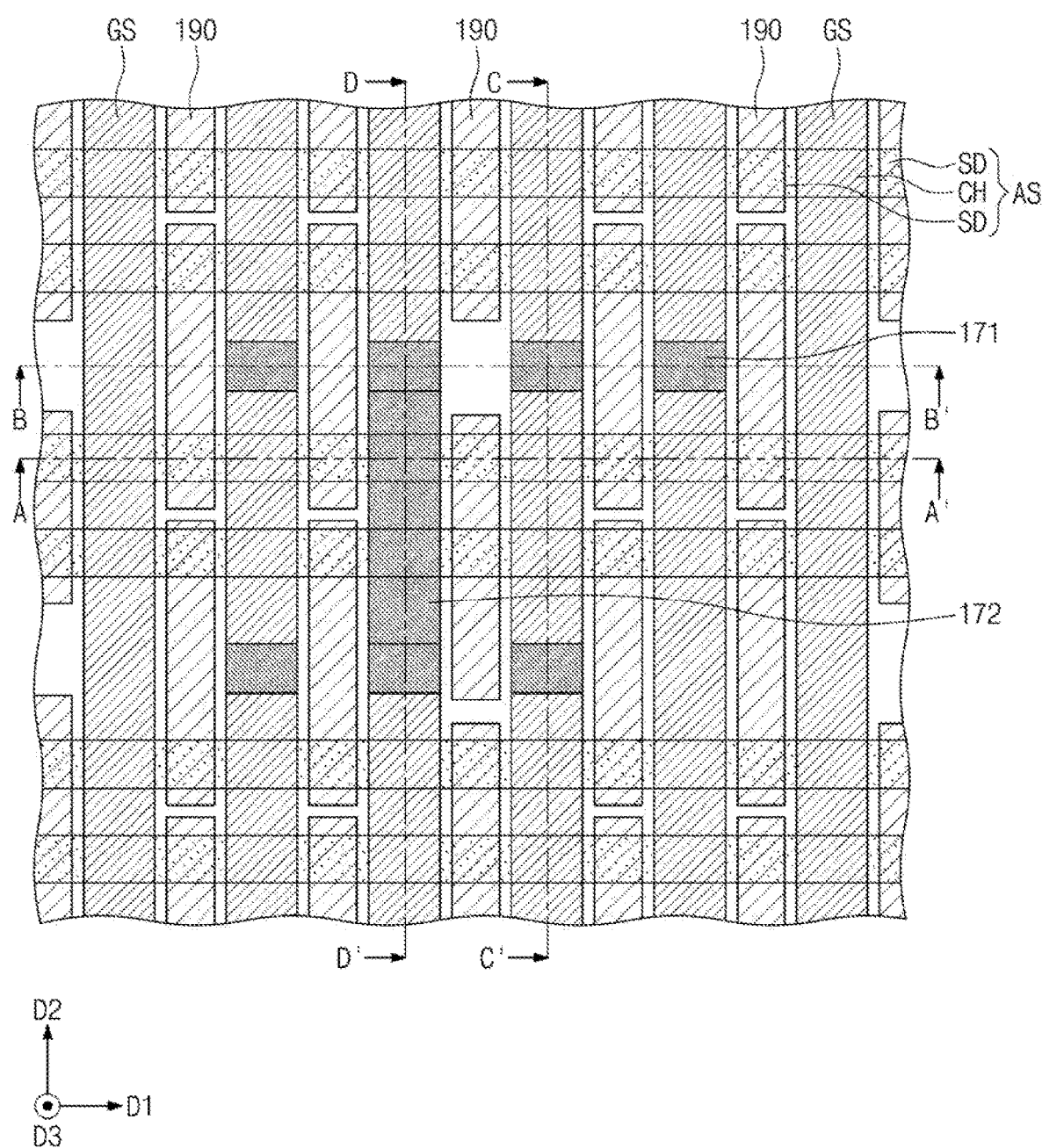
FIG. 1 illustrates a plan view of a semiconductor device according to some embodiments.
Figure 2A:
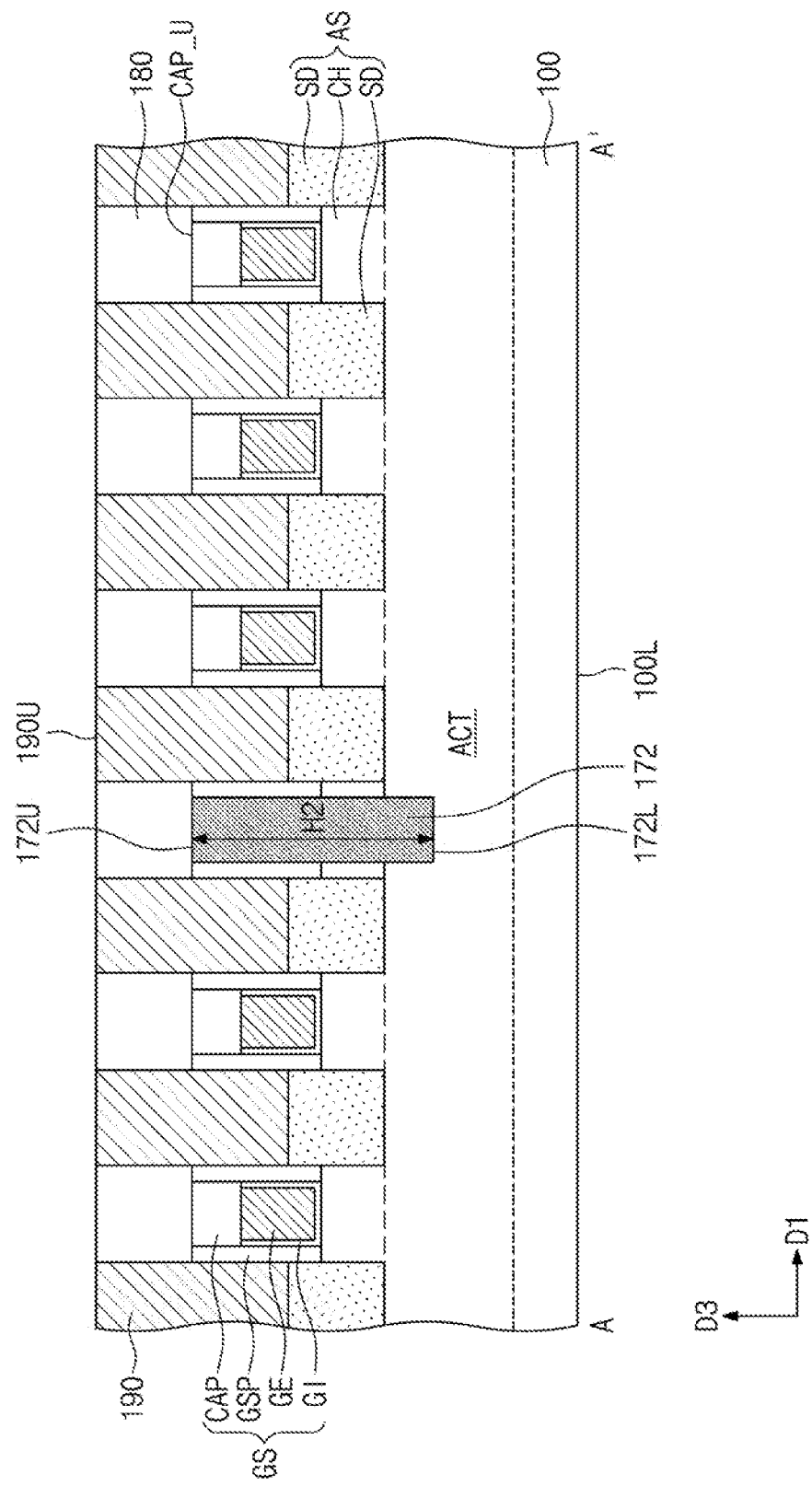
FIGS. 2A, 2B, 2C, and 2D illustrate cross-sectional views respectively taken along lines A-A', B-B', C-C', and D-D' of FIG. 1.
Figure 2B:
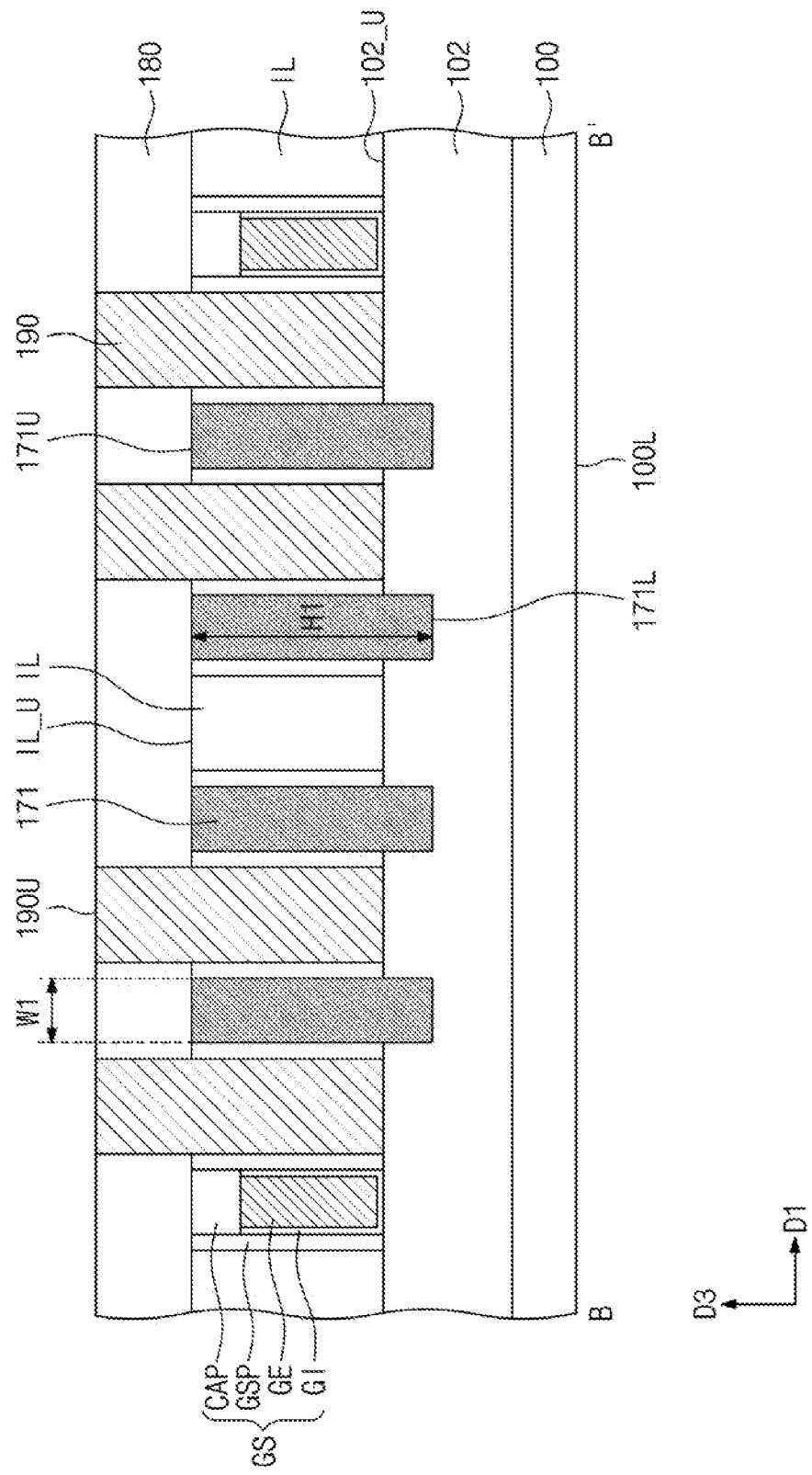
Figure 2C:
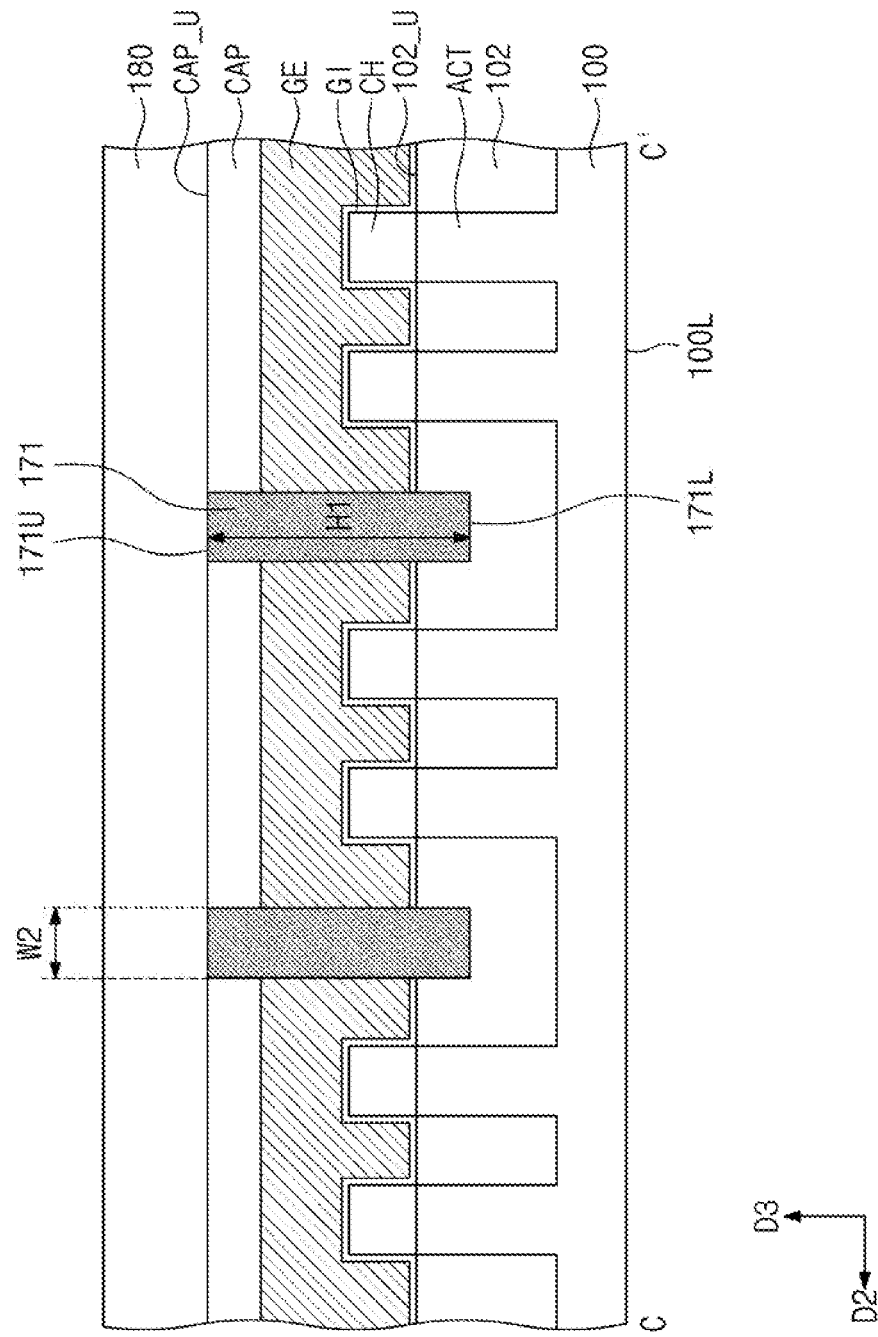
Figure 2D:
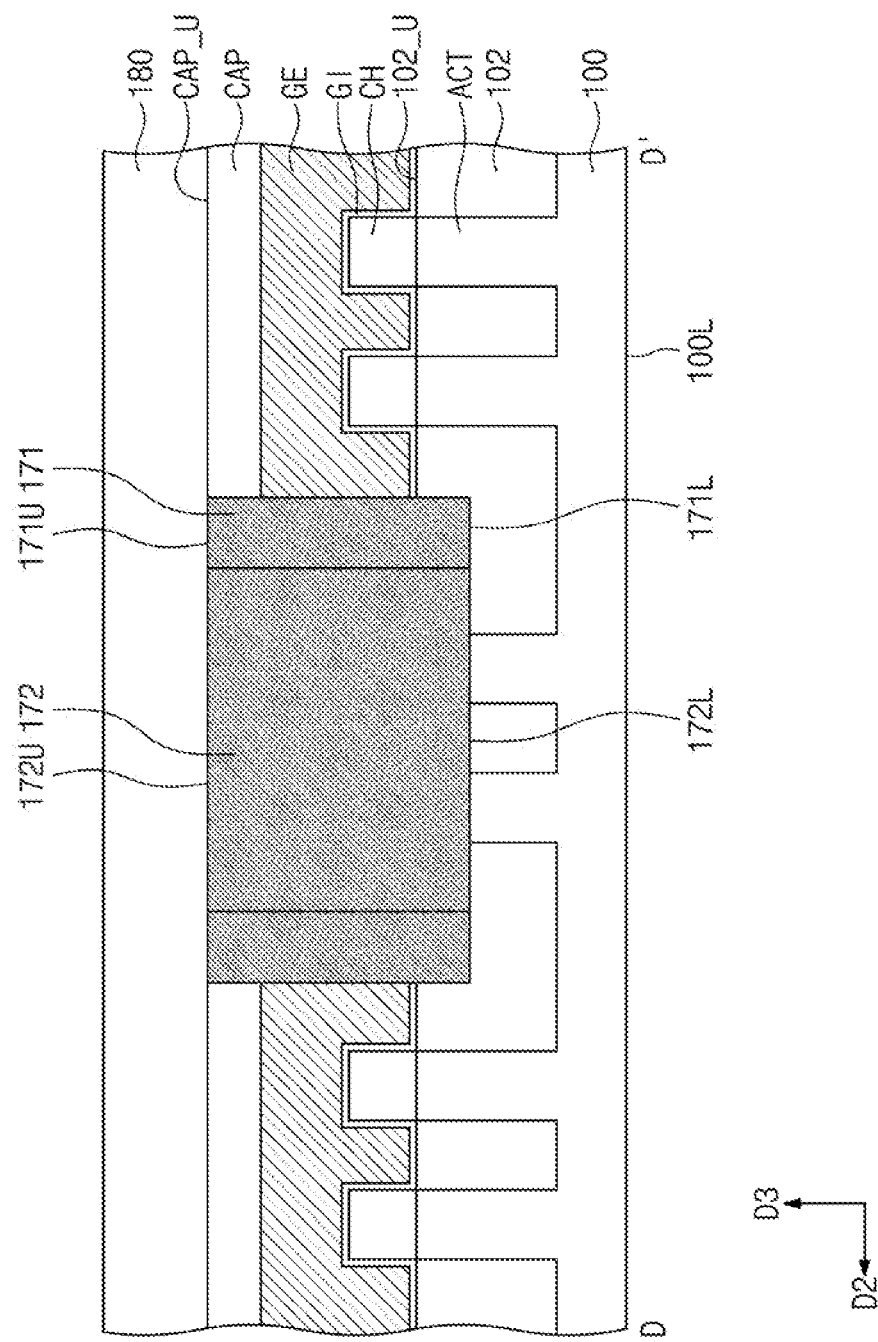
Figure 3:
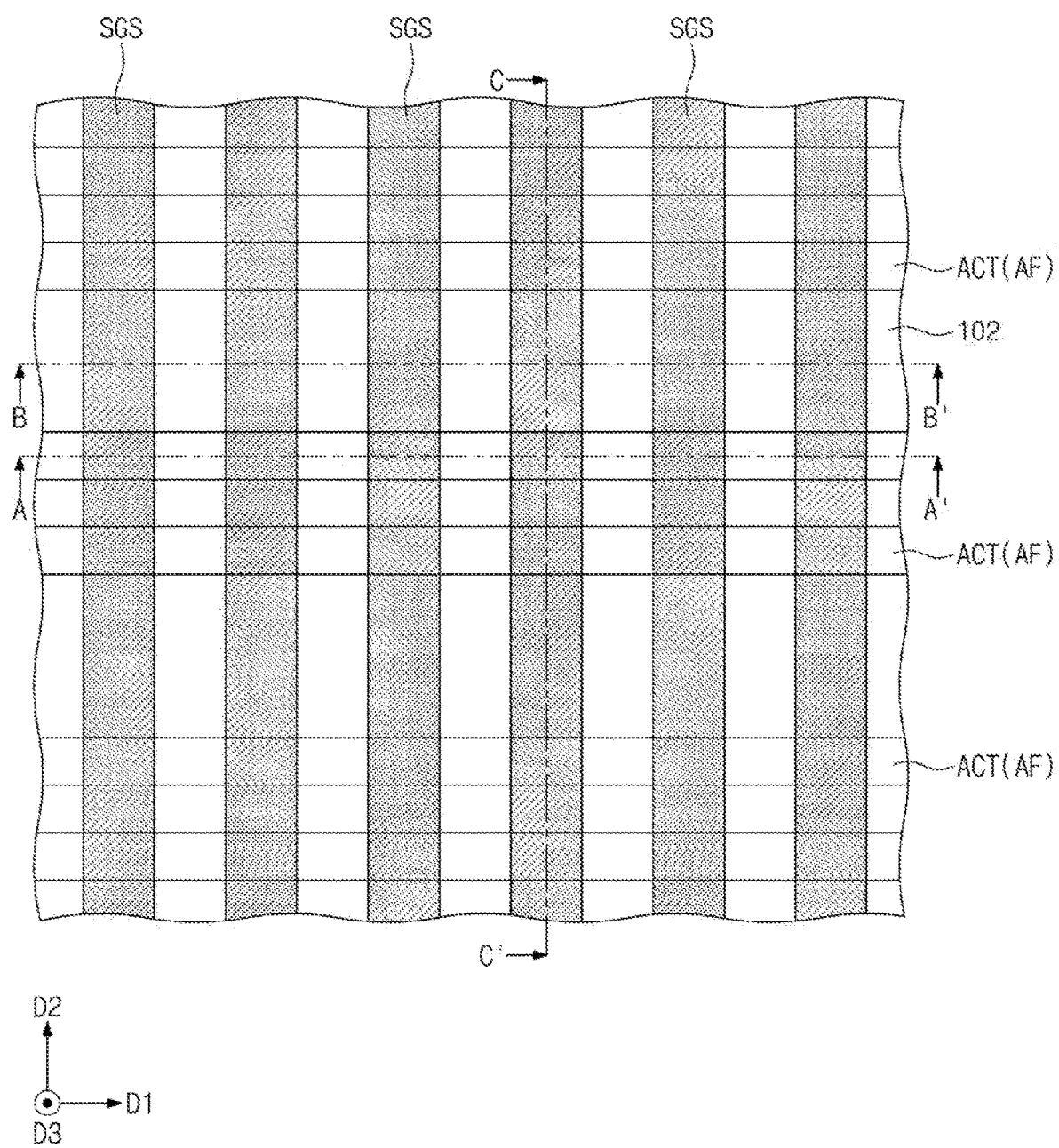
Figure 4A:
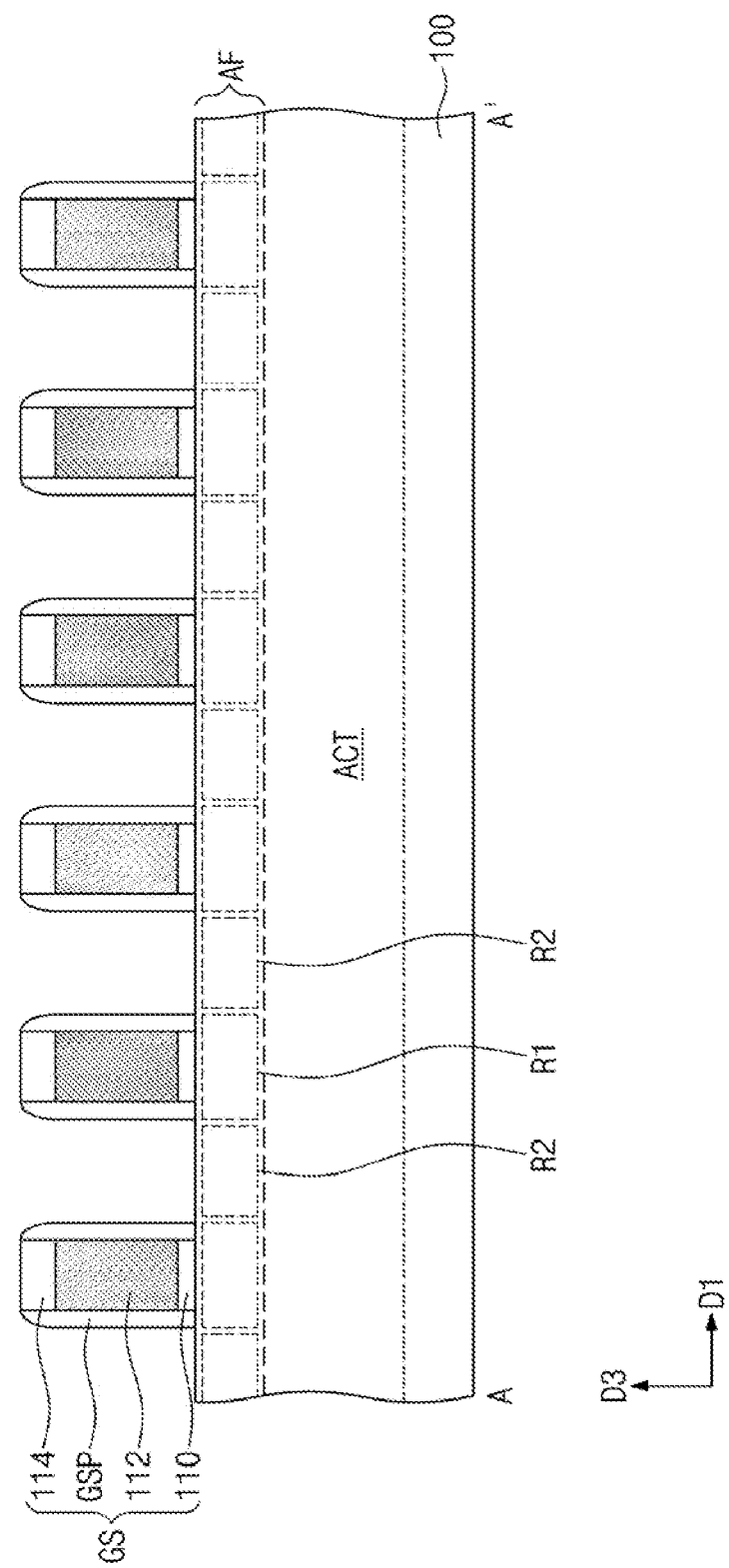
FIGS. 4A, 6A, 8A, 10A, 12A, 14A, 16A, 18A, and 20A illustrate cross-sectional views taken along line A-A' of FIGS. 3, 5, 7, 9, 11, 13, 15, 17, and 19, respectively.
Figure 4B:
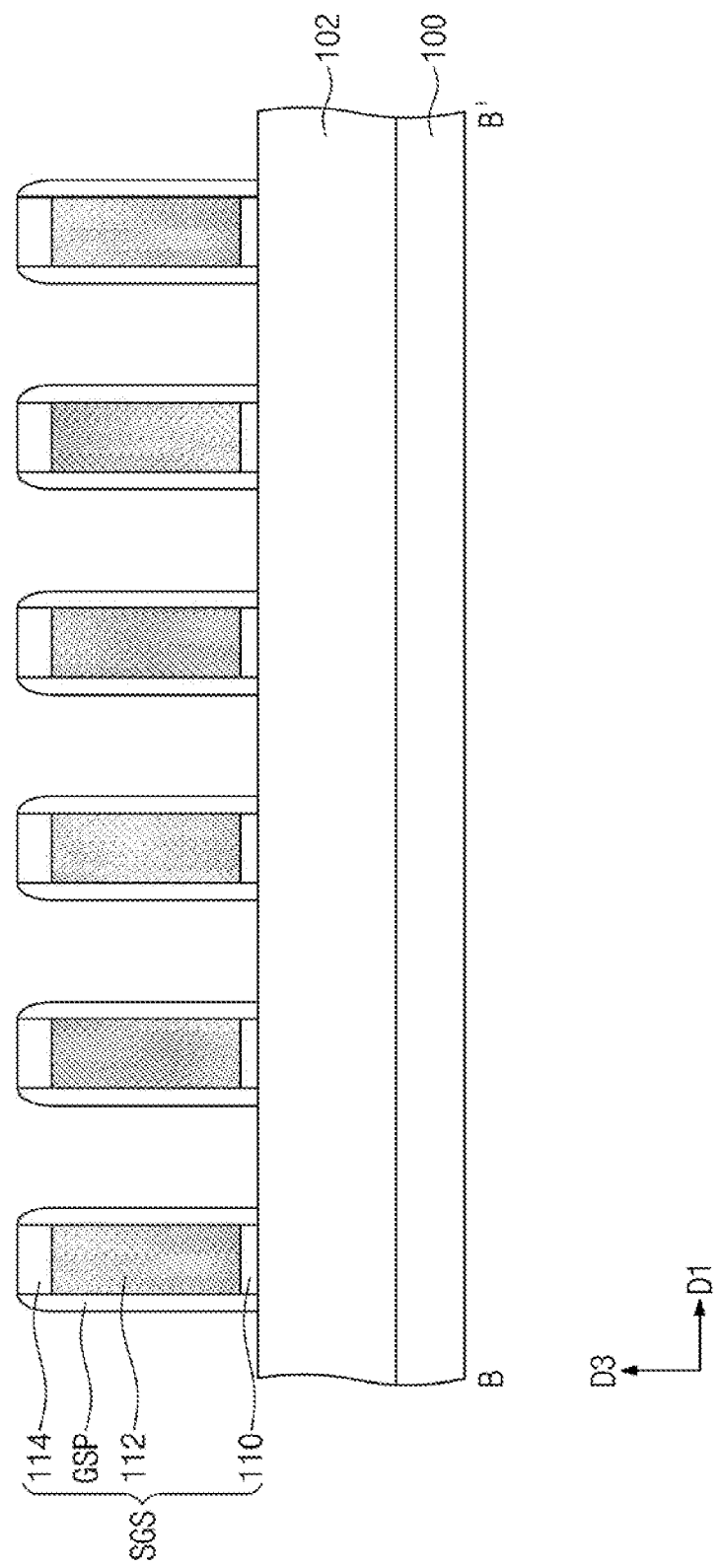
FIGS. 4B, 6B, 8B, 10B, 12B, 14B, 16B, 18B, and 20B illustrate cross-sectional views taken along line B-B' of FIGS. 3, 5, 7, 9, 11, 13, 15, 17, and 19, respectively.
Figure 4C:
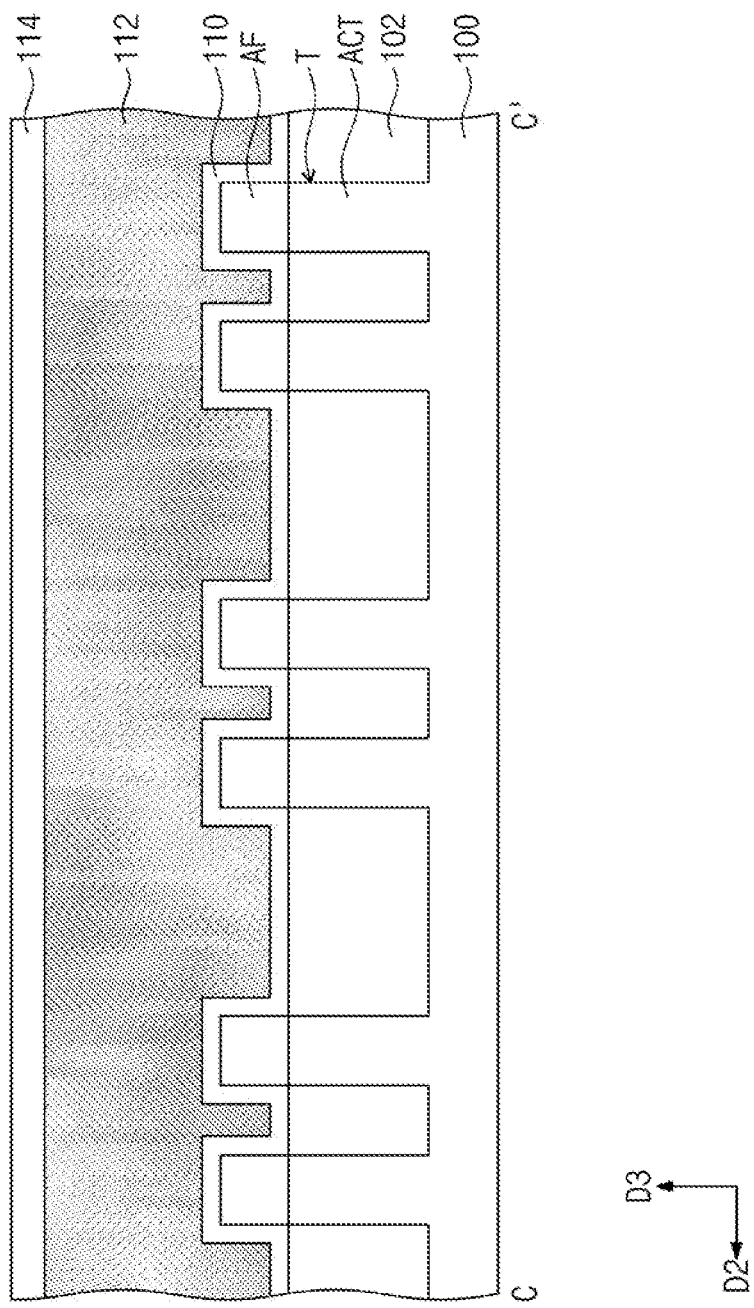
FIGS. 4C, 6C, 8C, 10C, 12C, 14C, 16C, 18C, and 20C illustrate cross-sectional views taken along line C-C' of FIGS. 3, 5, 7, 9, 11, 13, 15, 17, and 19, respectively.
Figure 5:
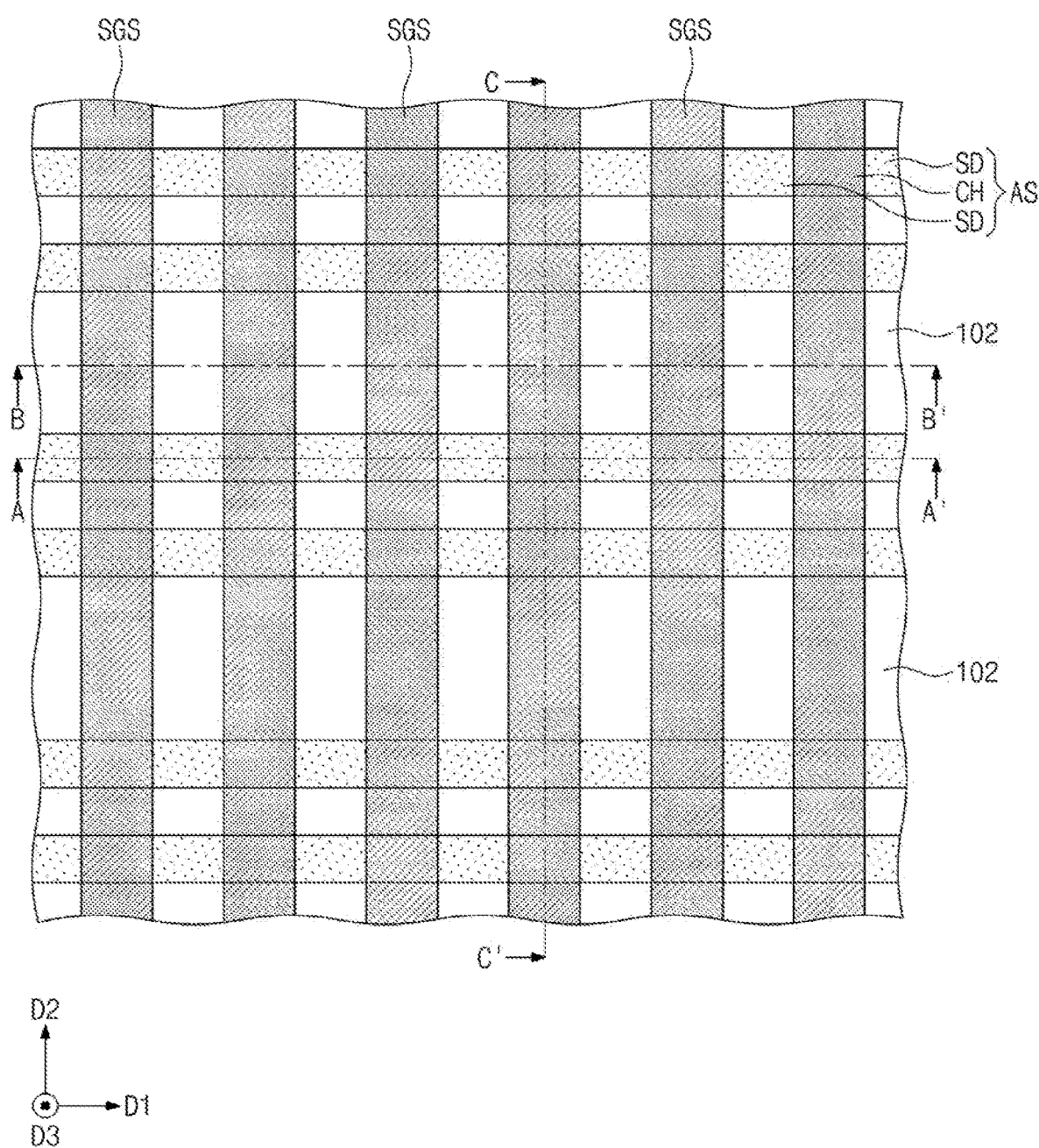
Figure 6A:
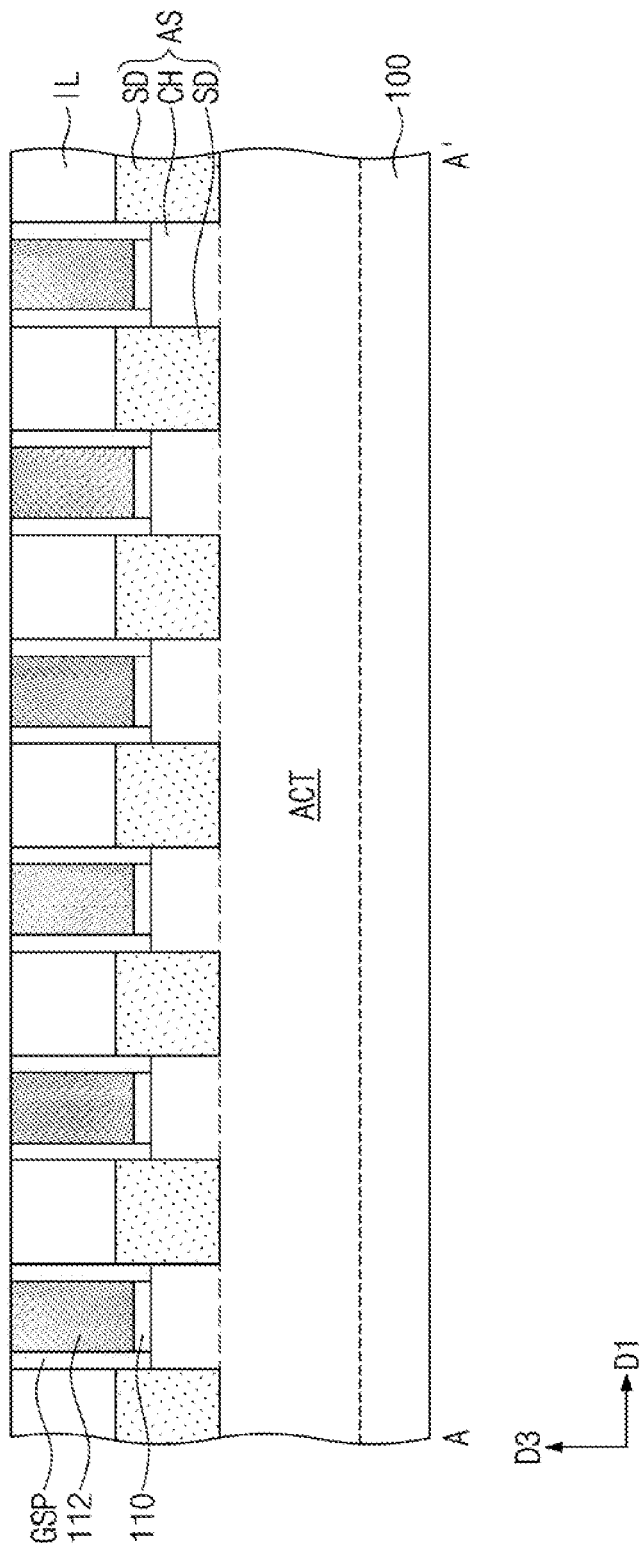
Figure 6B:
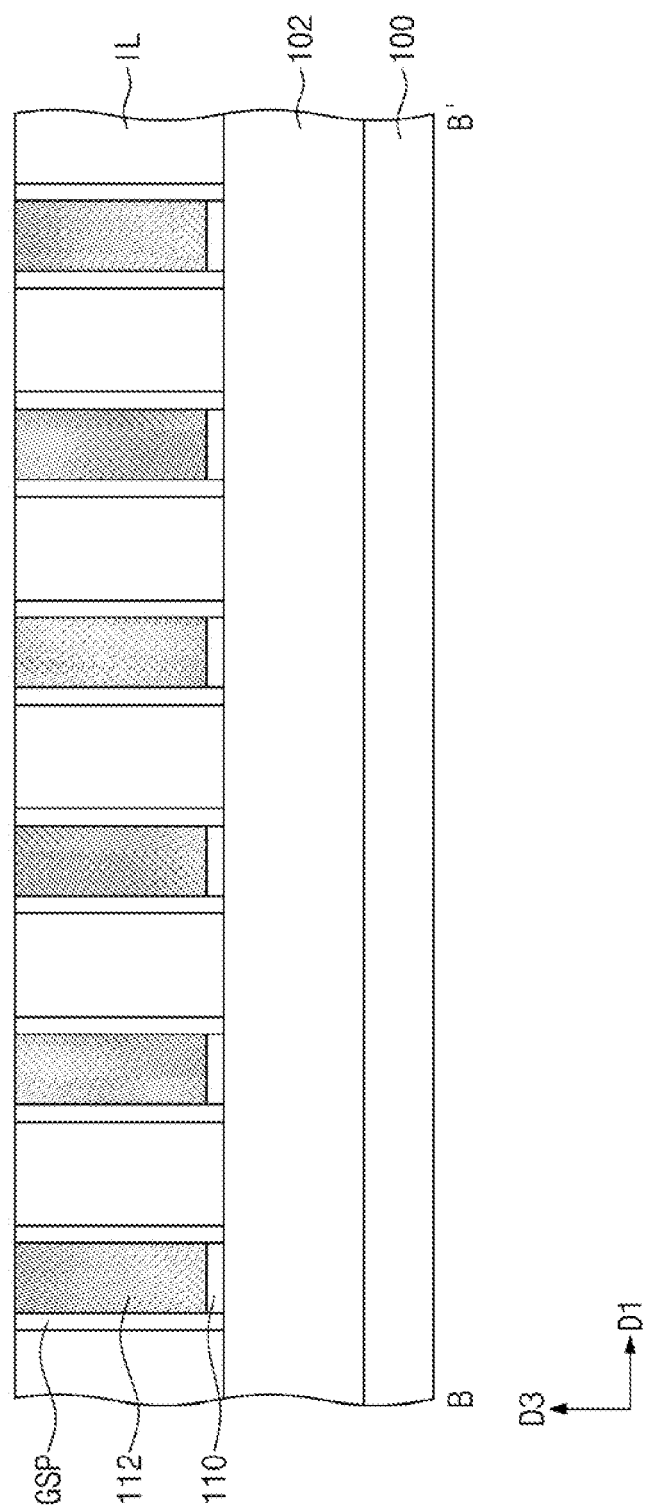
Figure 6C:
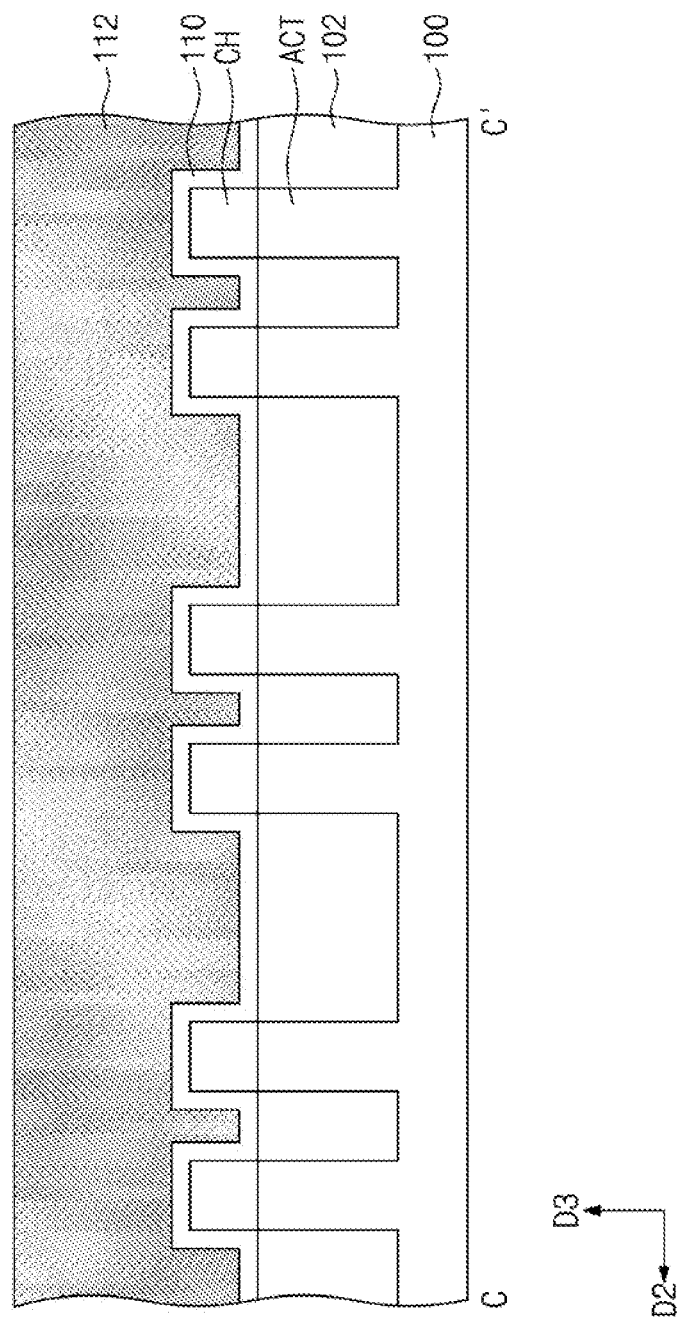
Figure 7:
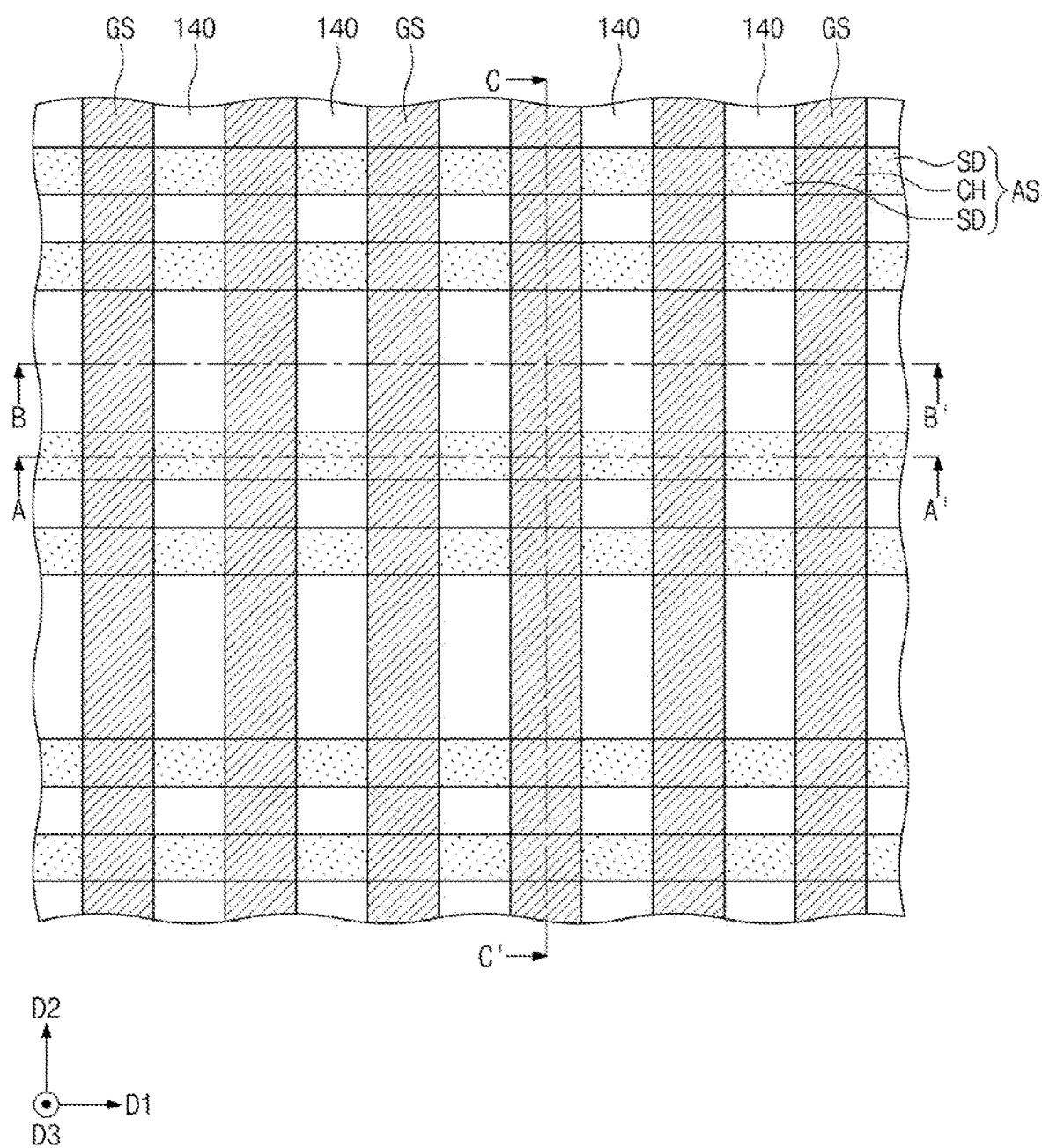
Figure 8A:
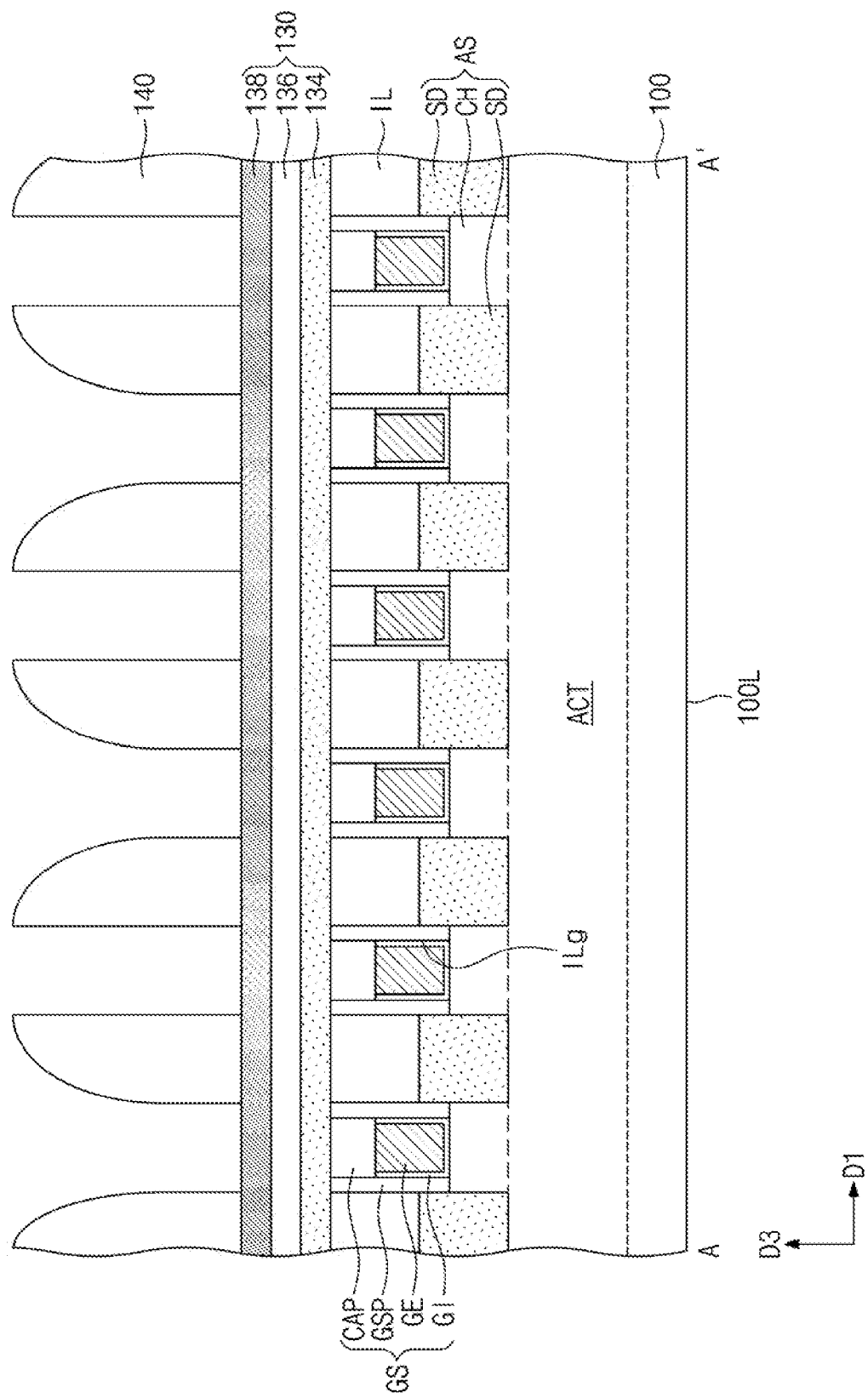
Figure 8B:
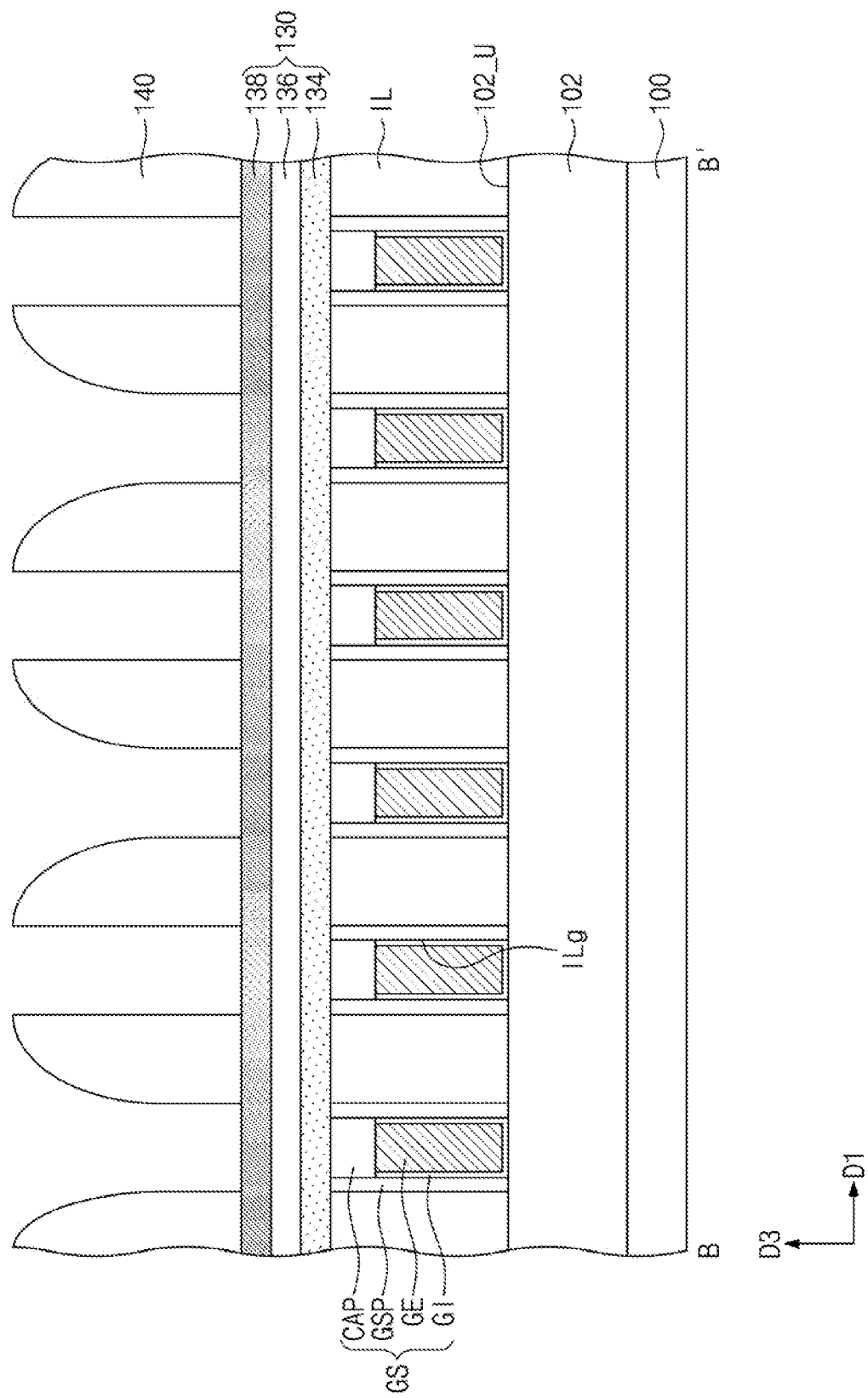
Figure 8C:
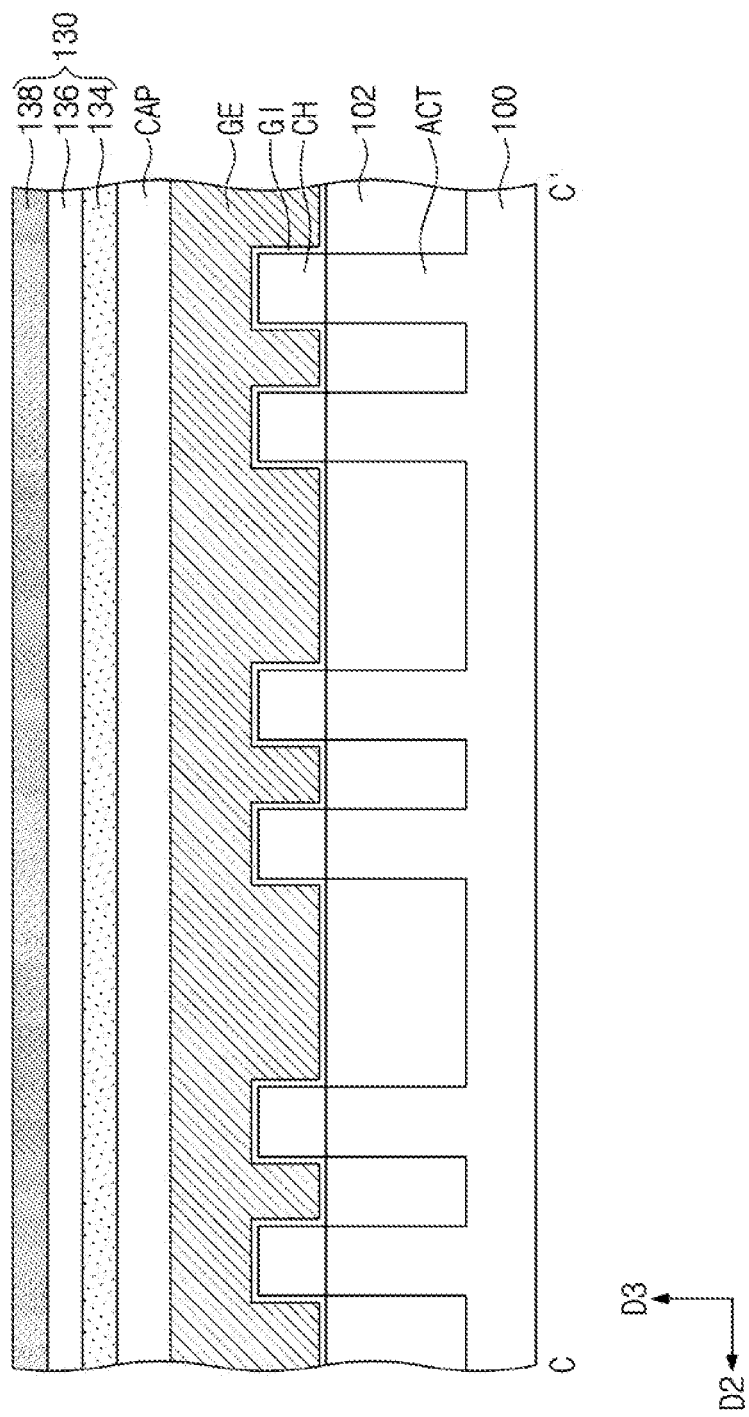
Figure 9:
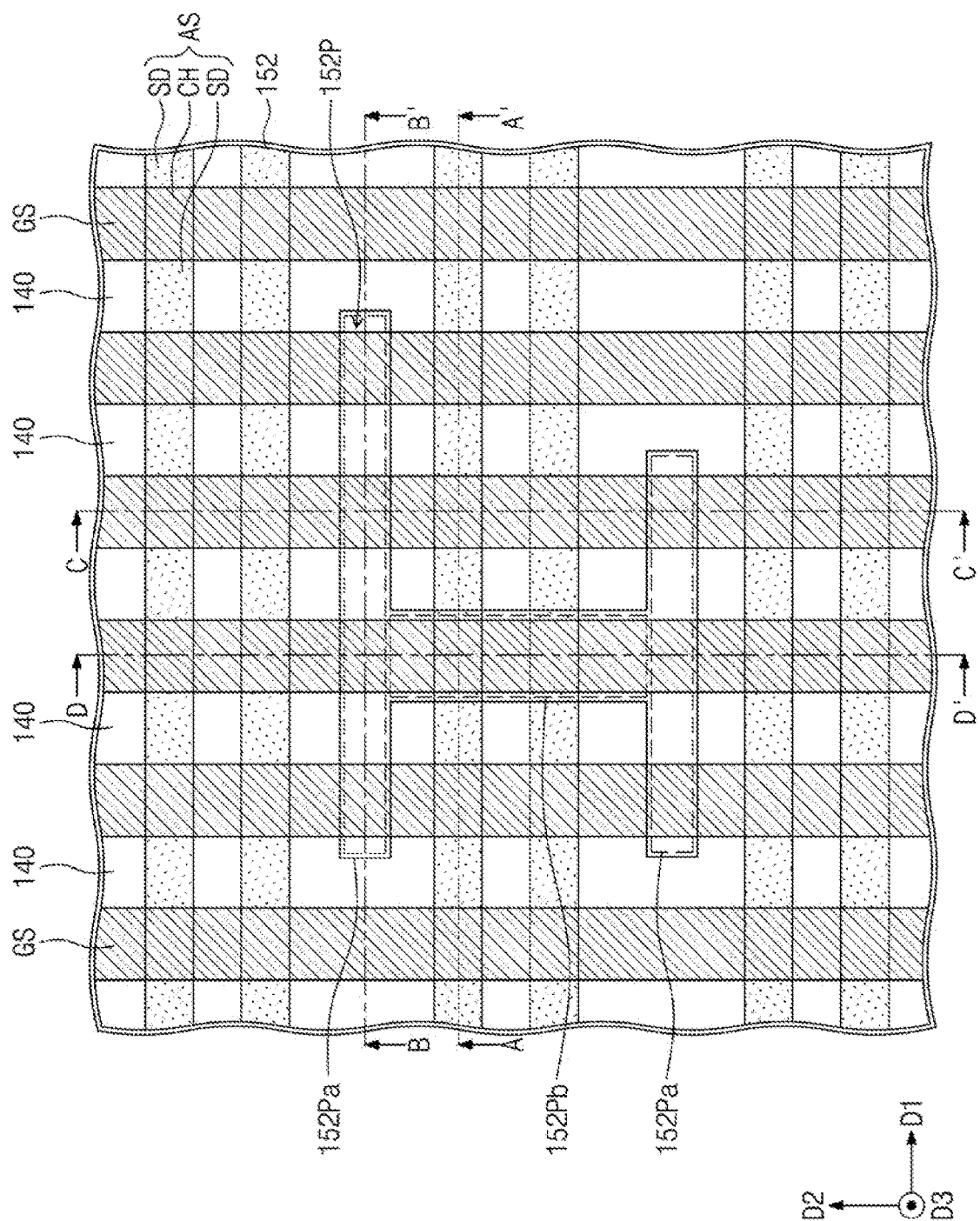
Figure 10A:
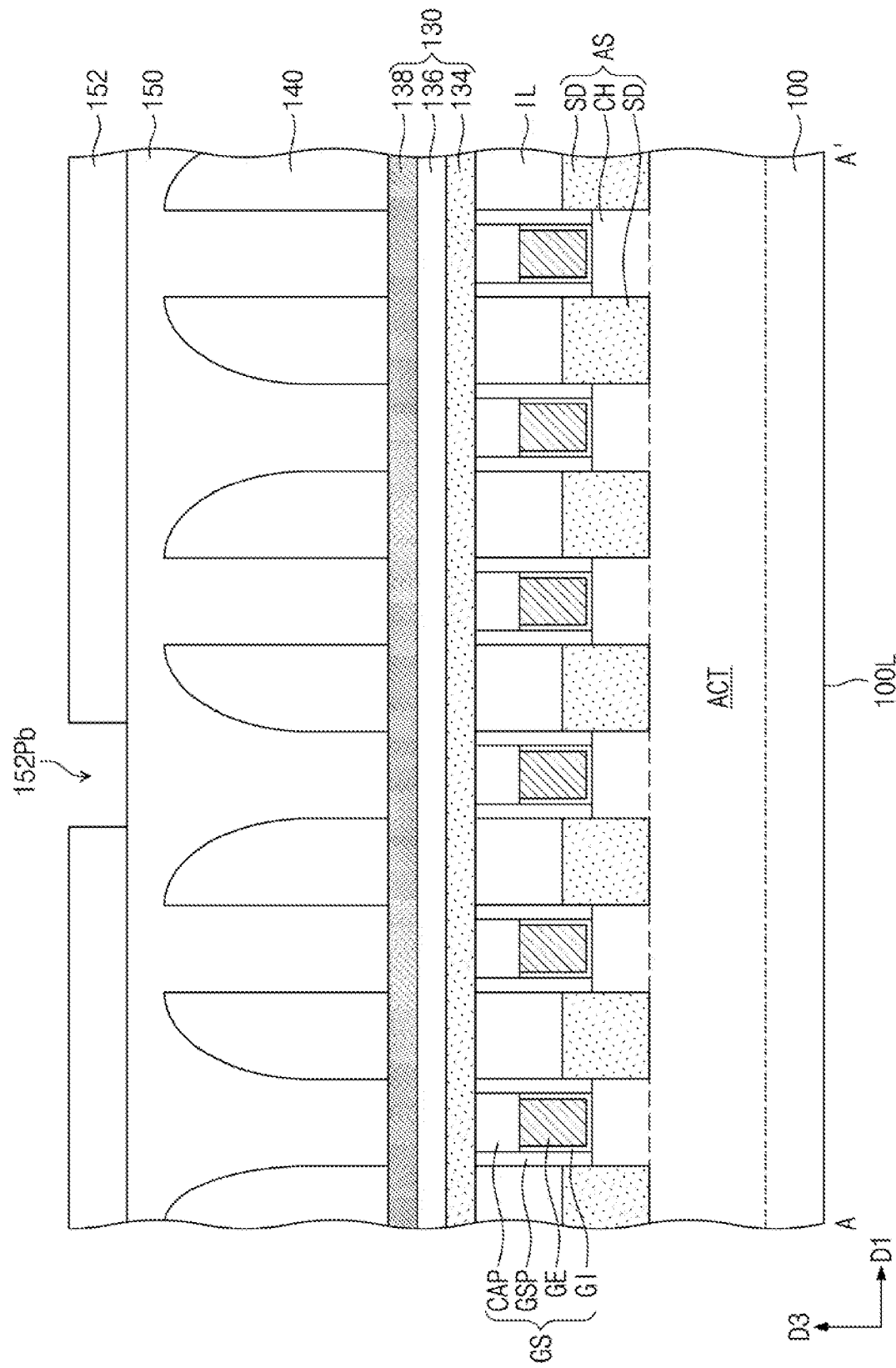
Figure 10B:
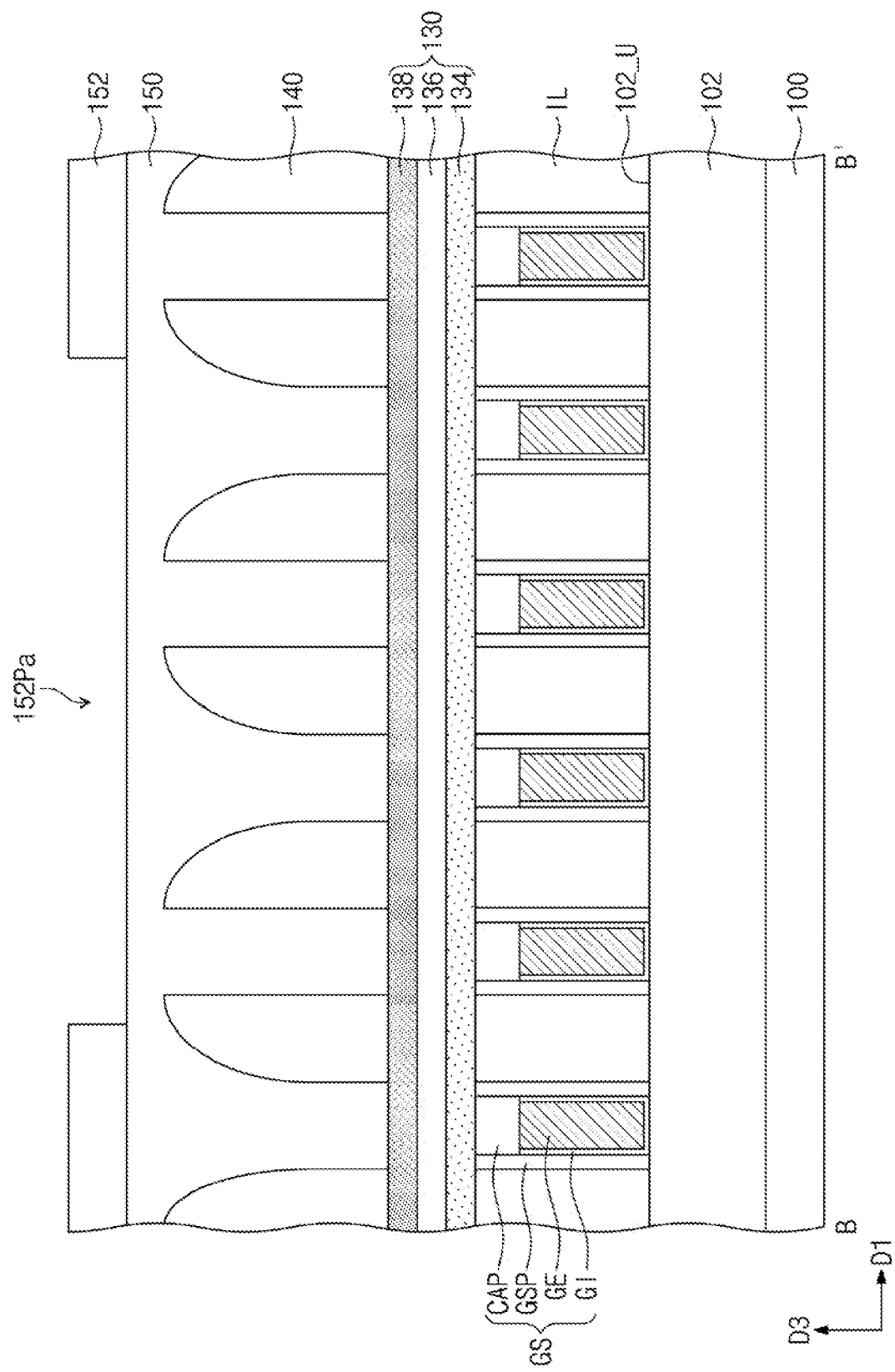
Figure 10C:
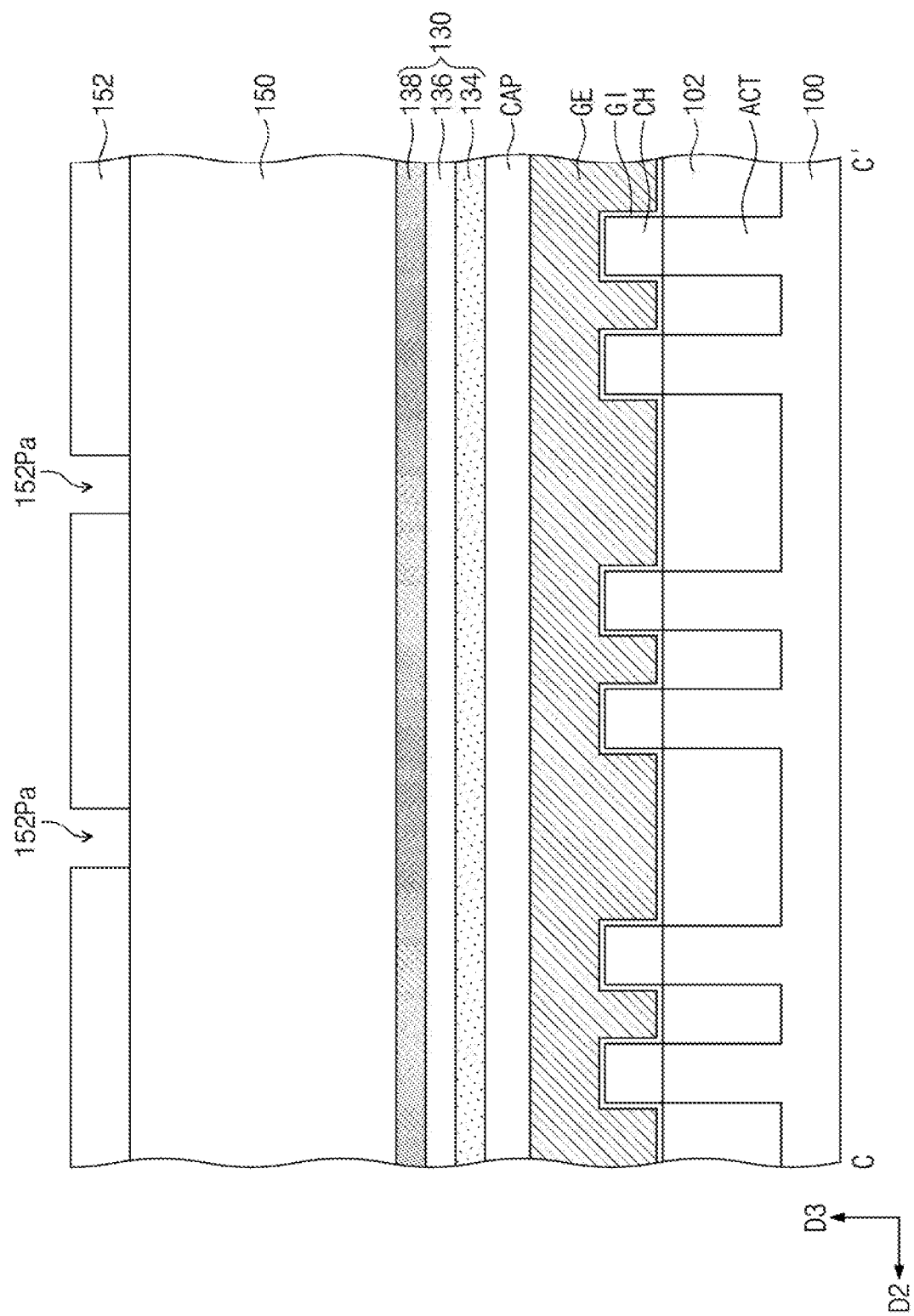
Figure 10D:
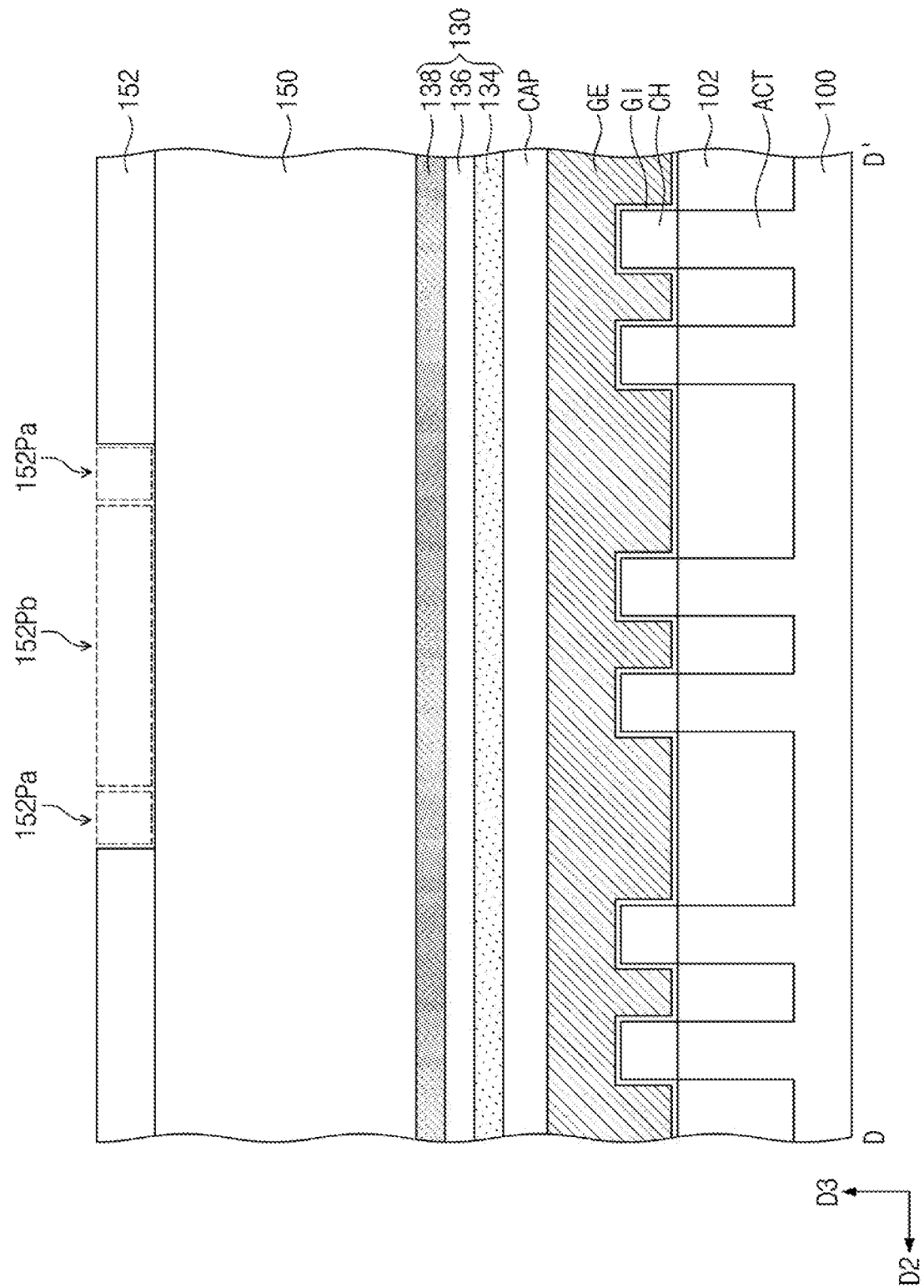
FIGS. 10D, 12D, 14D, 16D, 18D, and 20D illustrate cross-sectional views taken along line D-D' of FIGS. 9, 11, 13, 15, 17, and 19, respectively.
Figure 11:
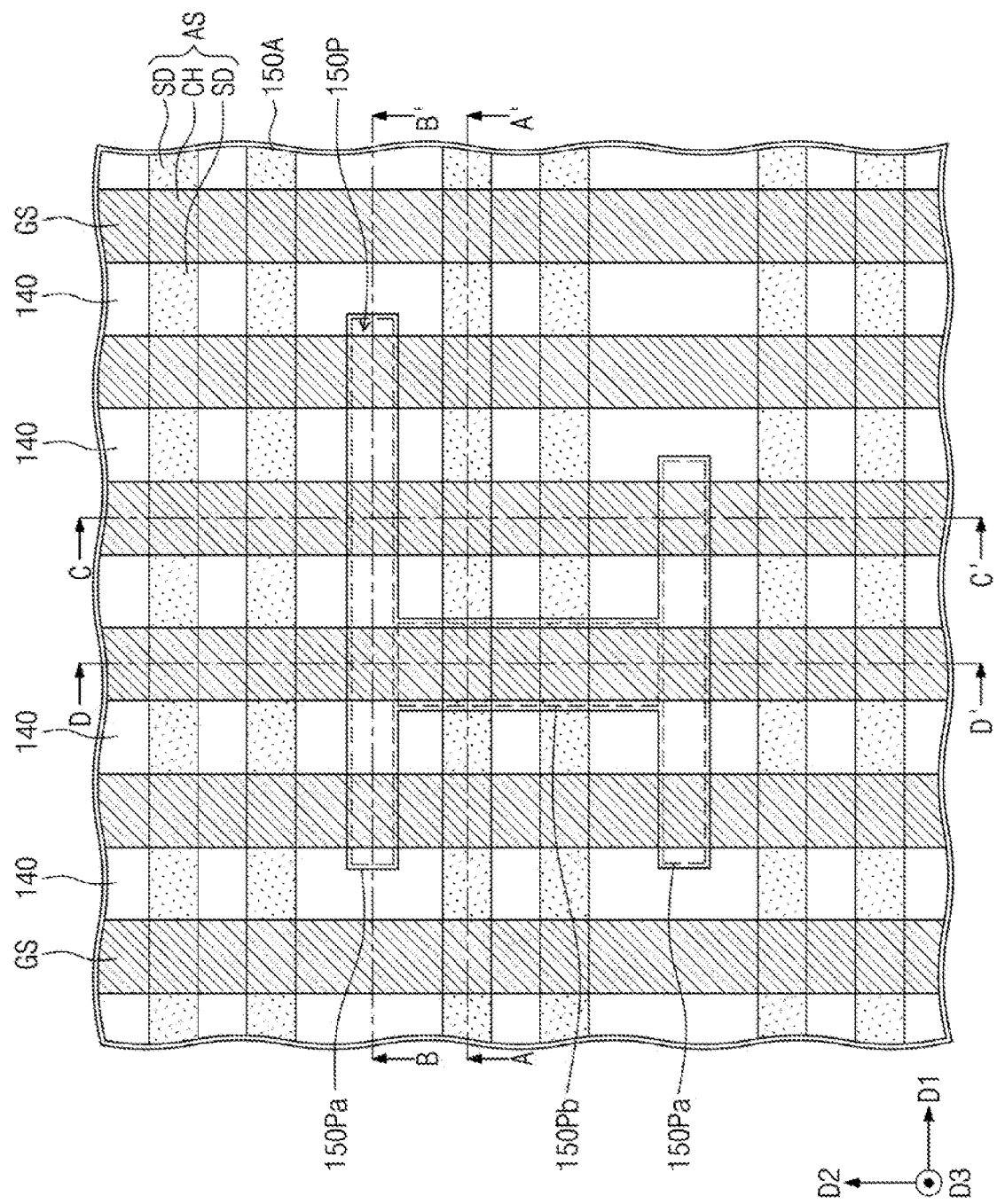
Figure 12A:
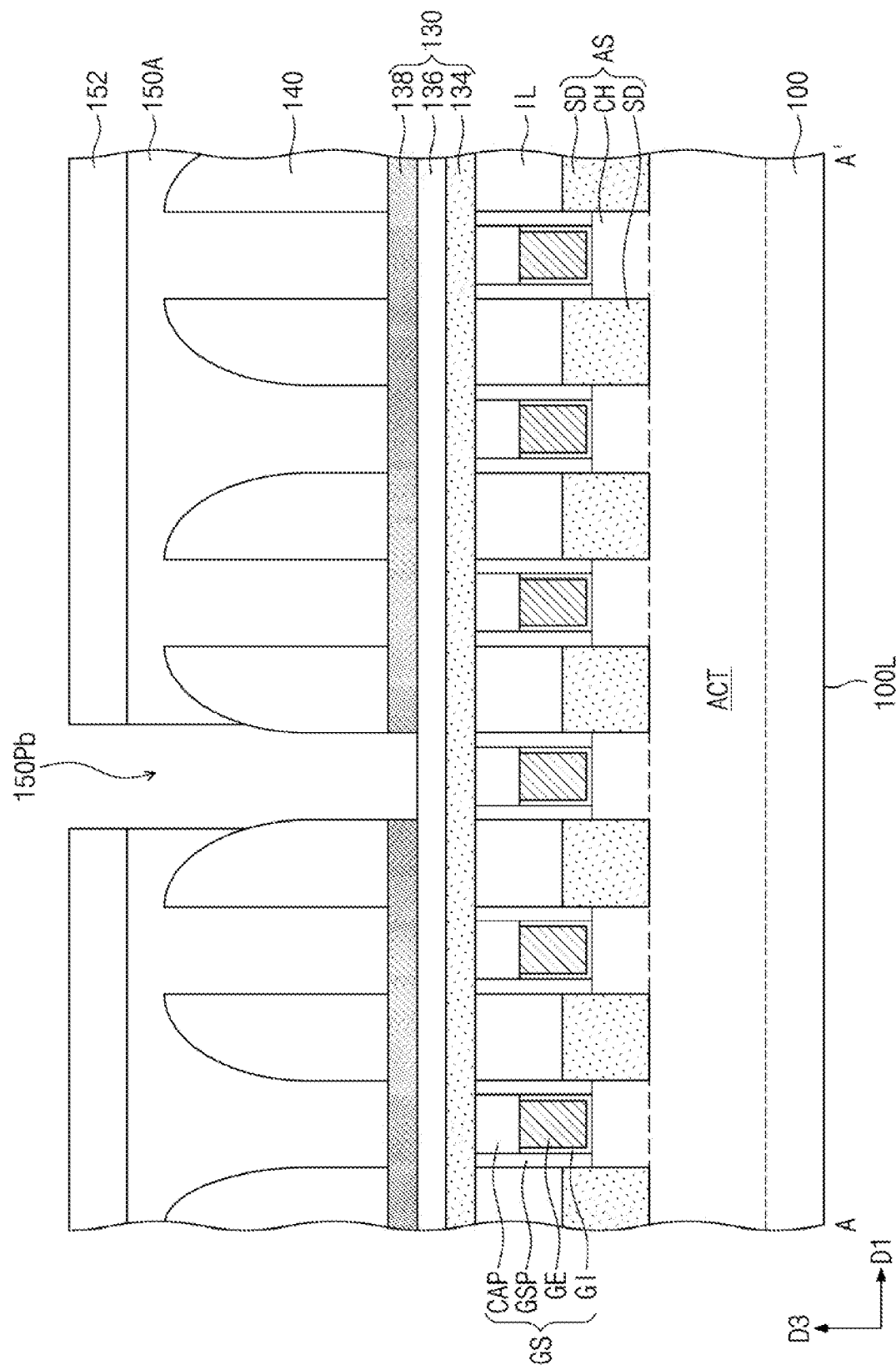
Figure 12B:
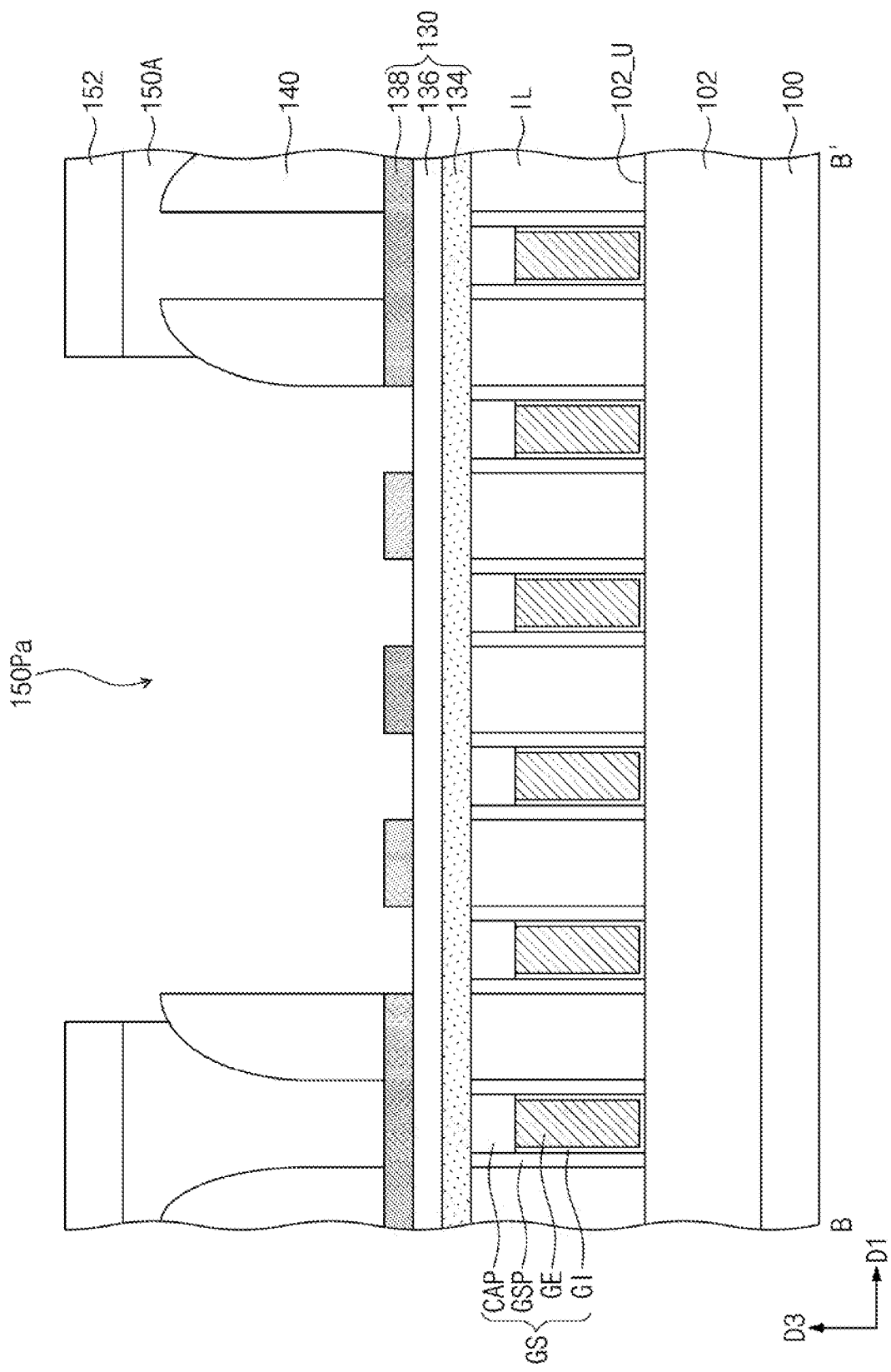
Figure 12C:
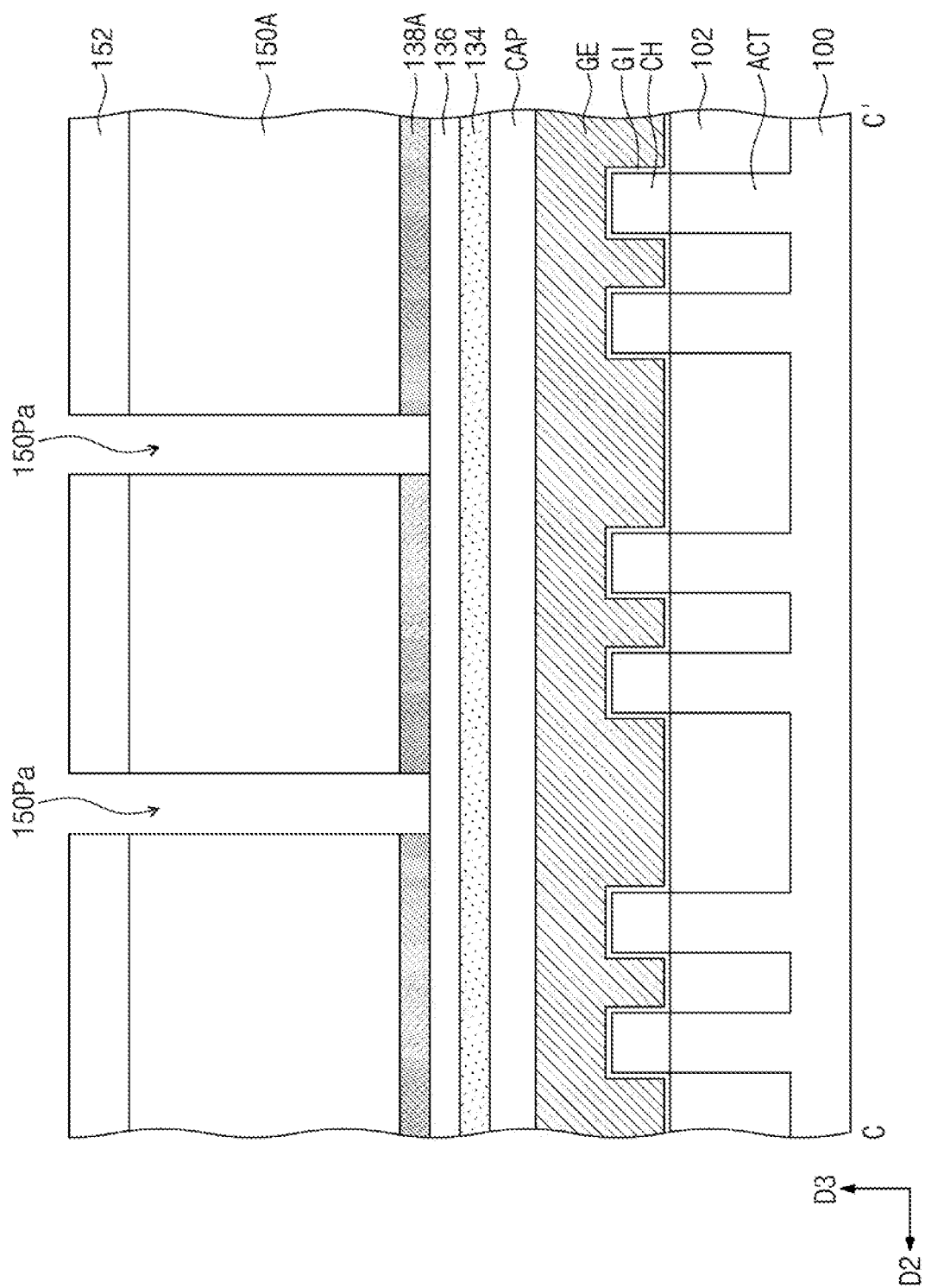
Figure 12D:
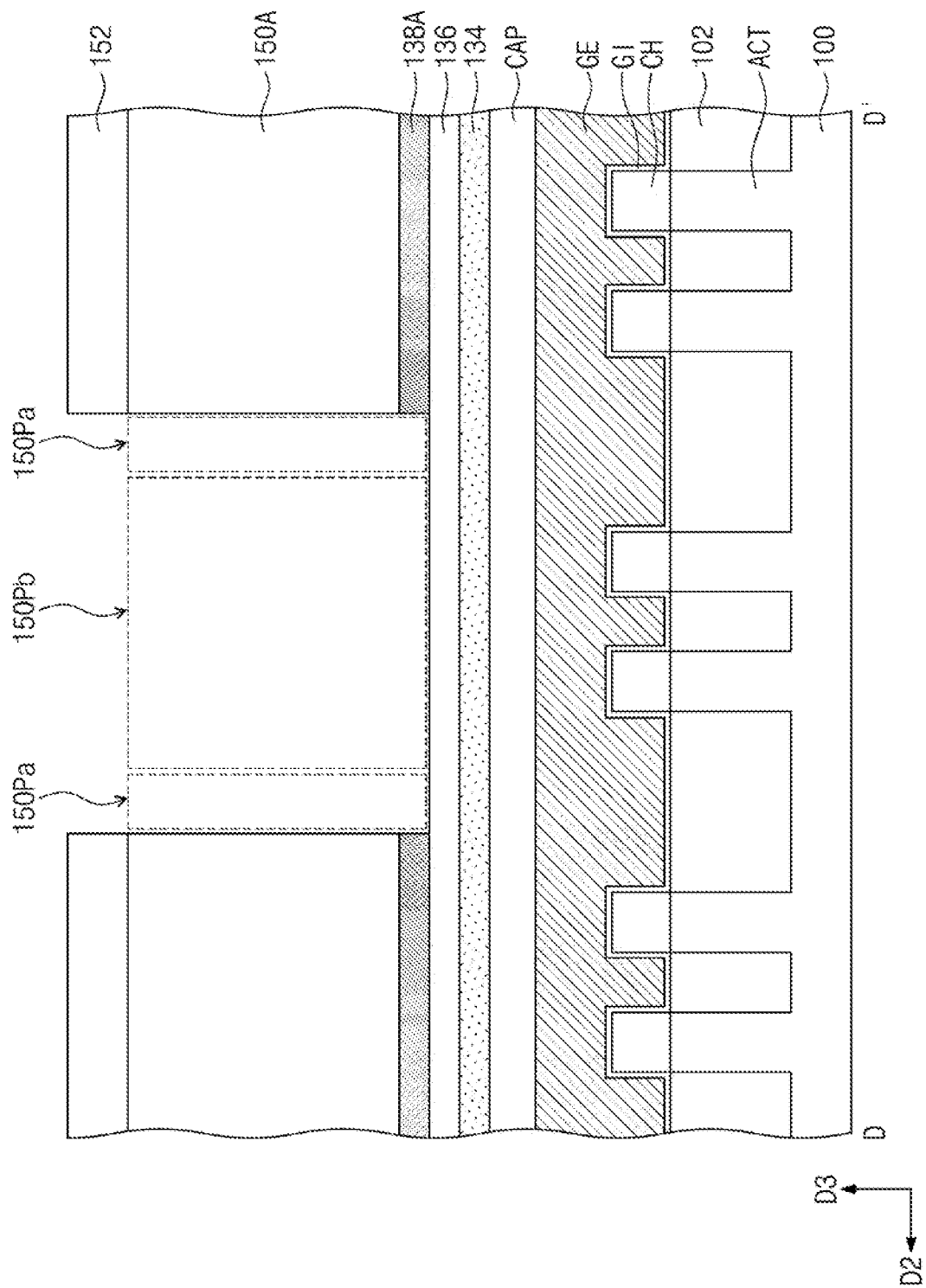
Figure 13:
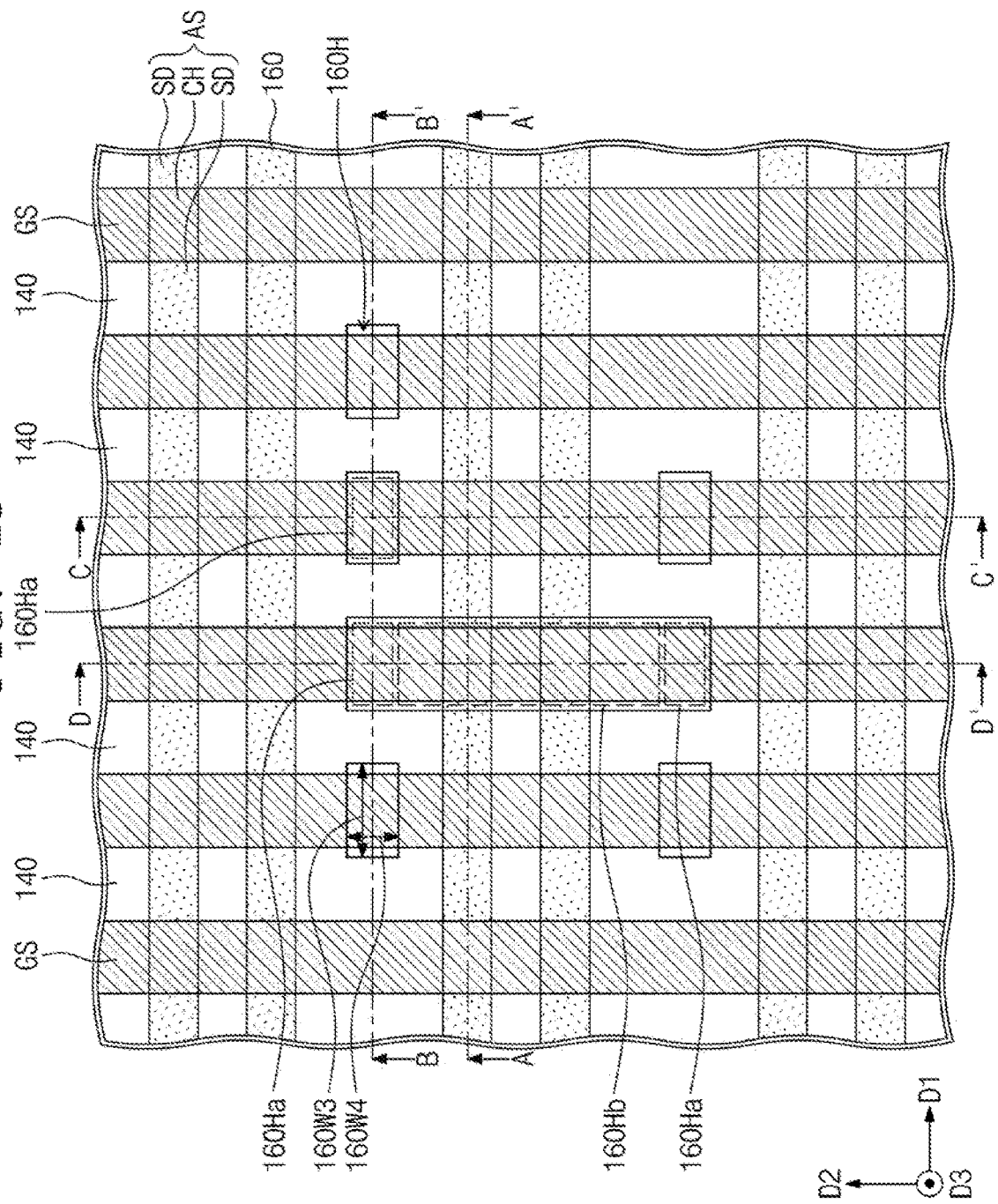
Figure 14A:
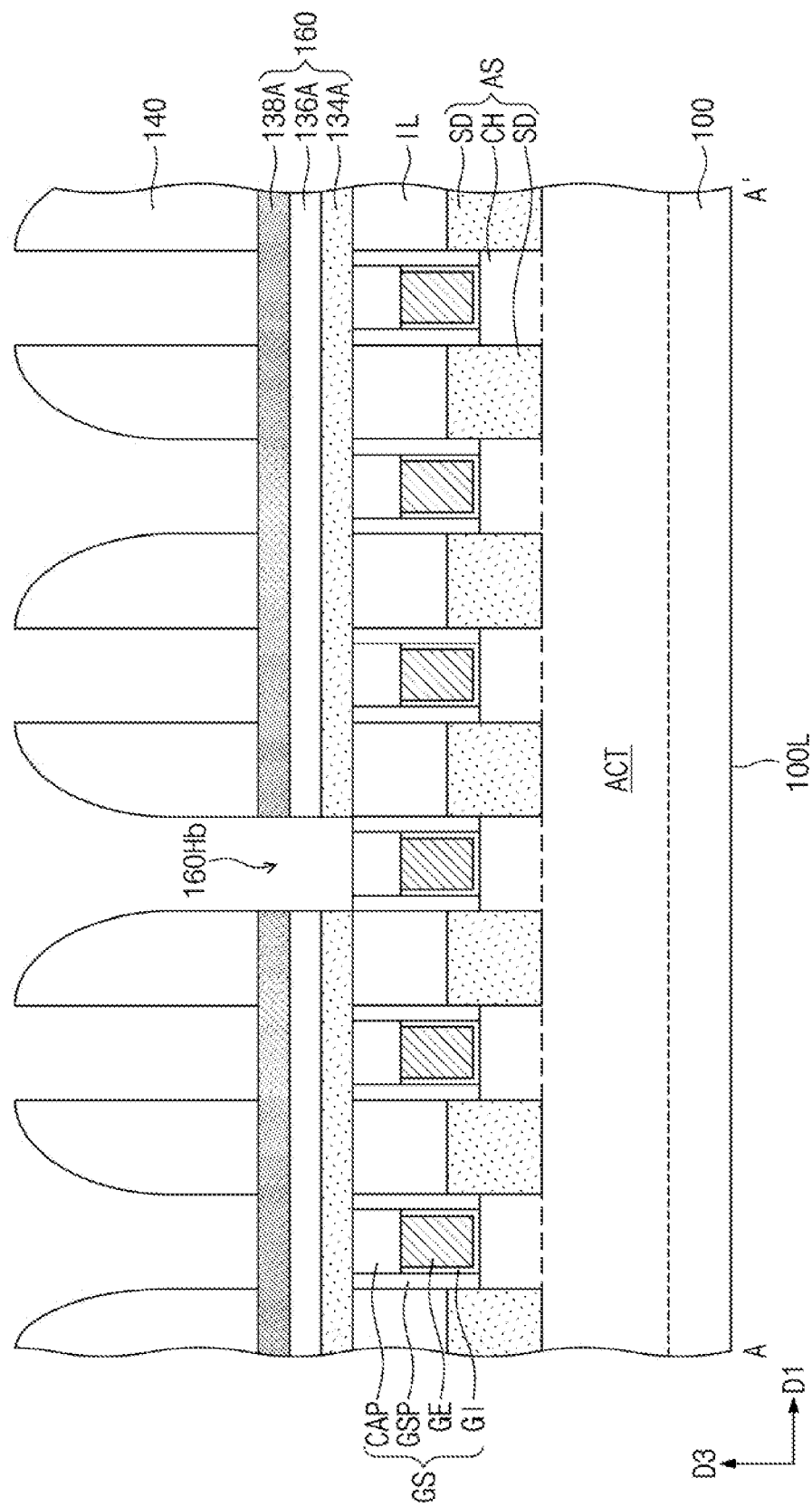
Figure 14B:
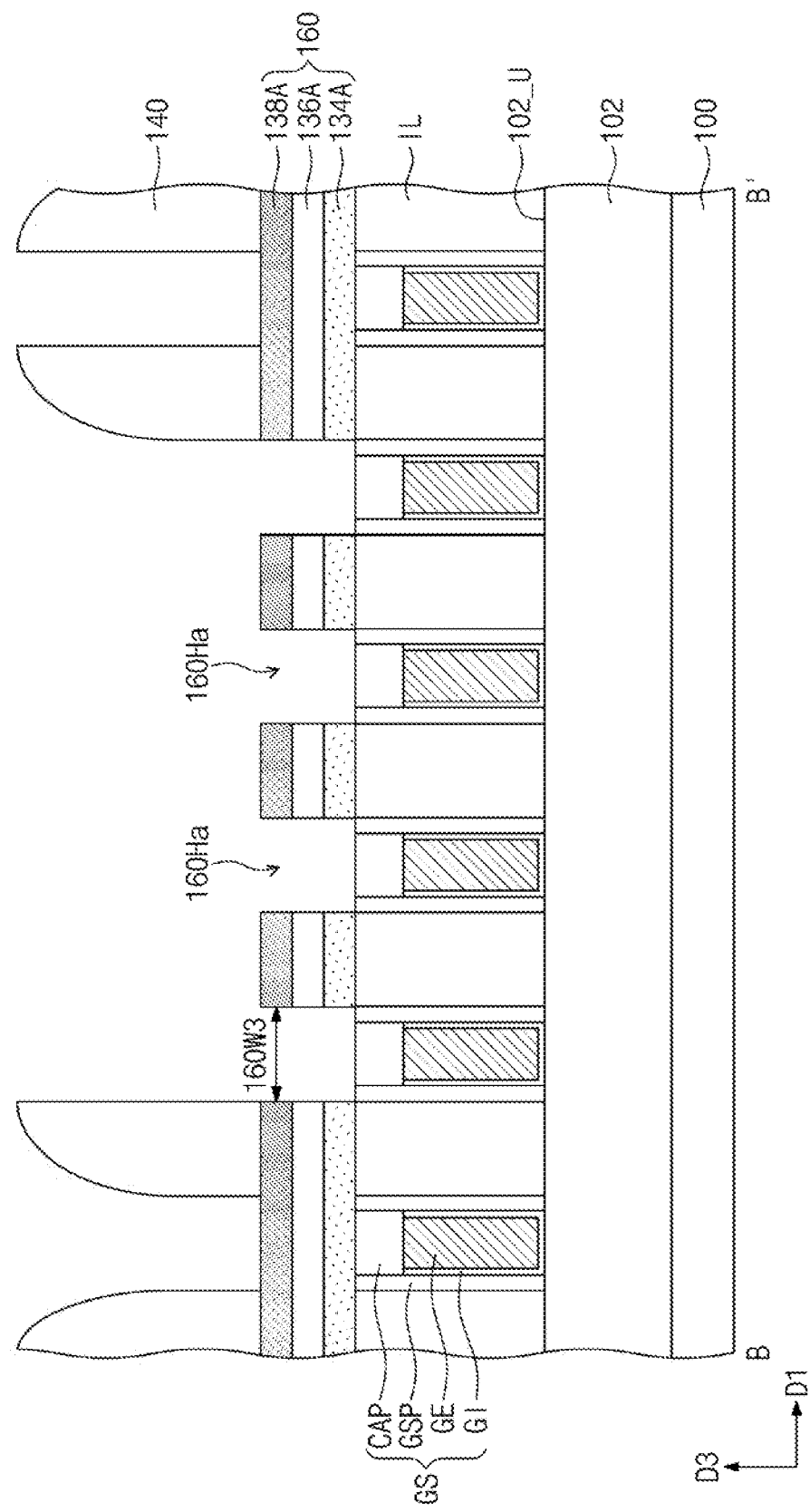
Figure 14C:
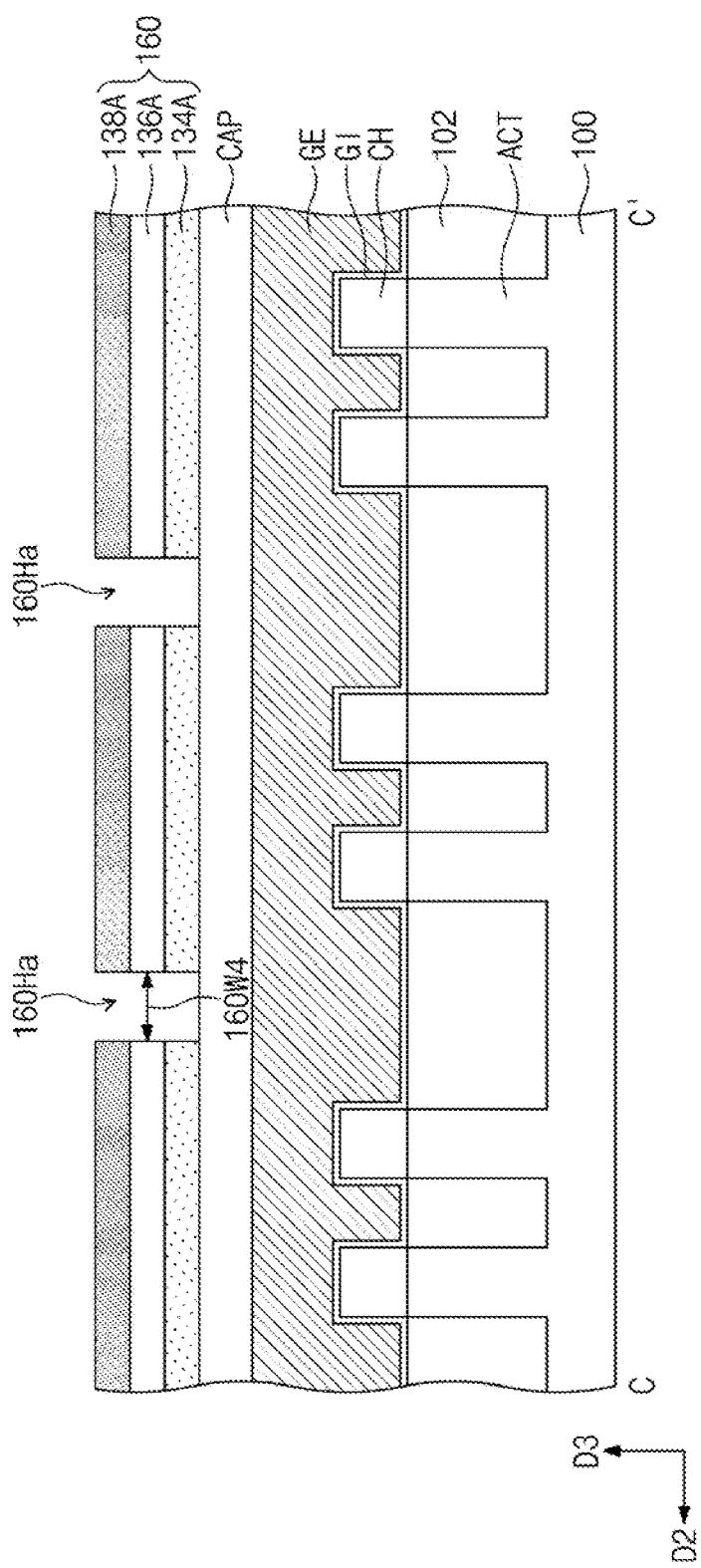
Figure 14D:
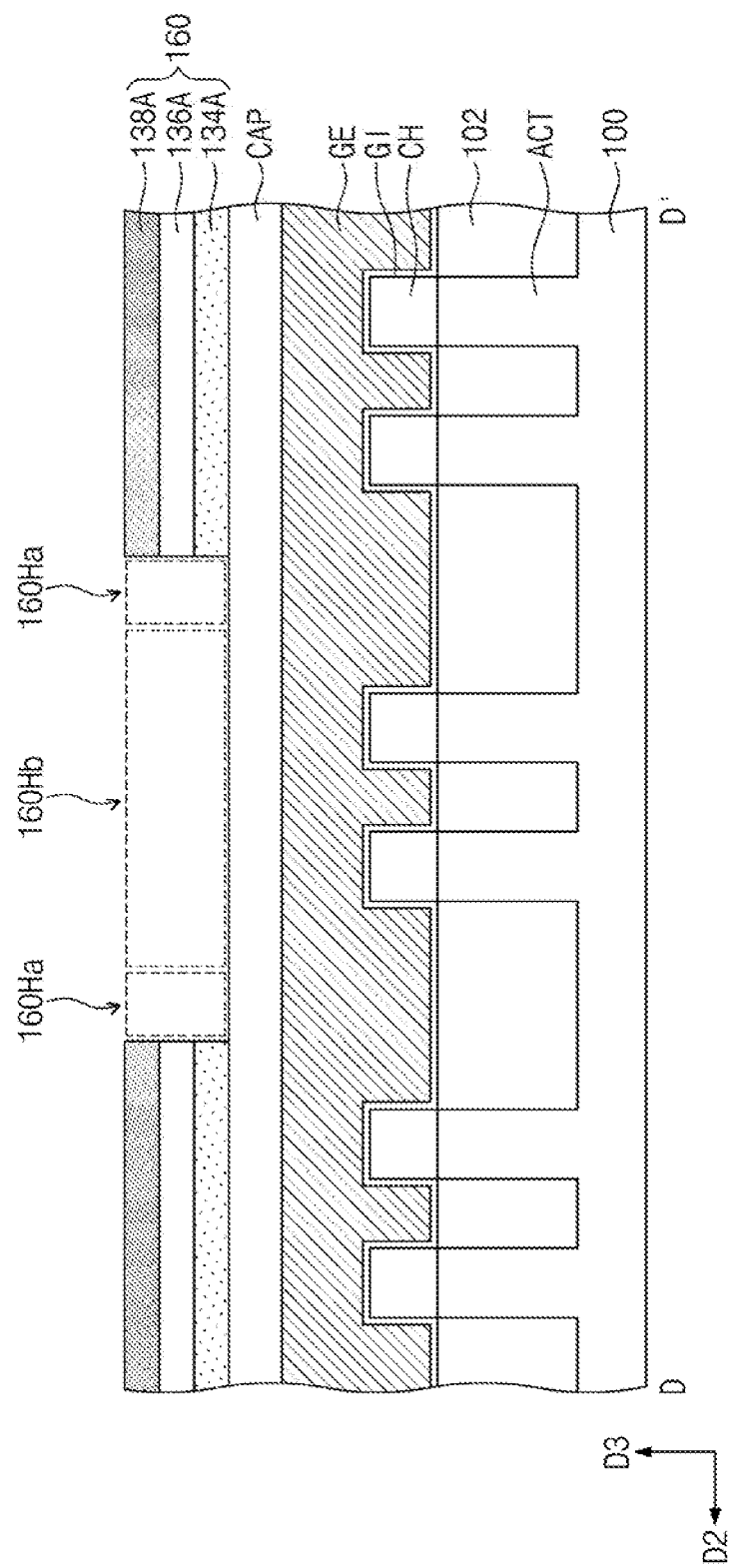
Figure 16A:
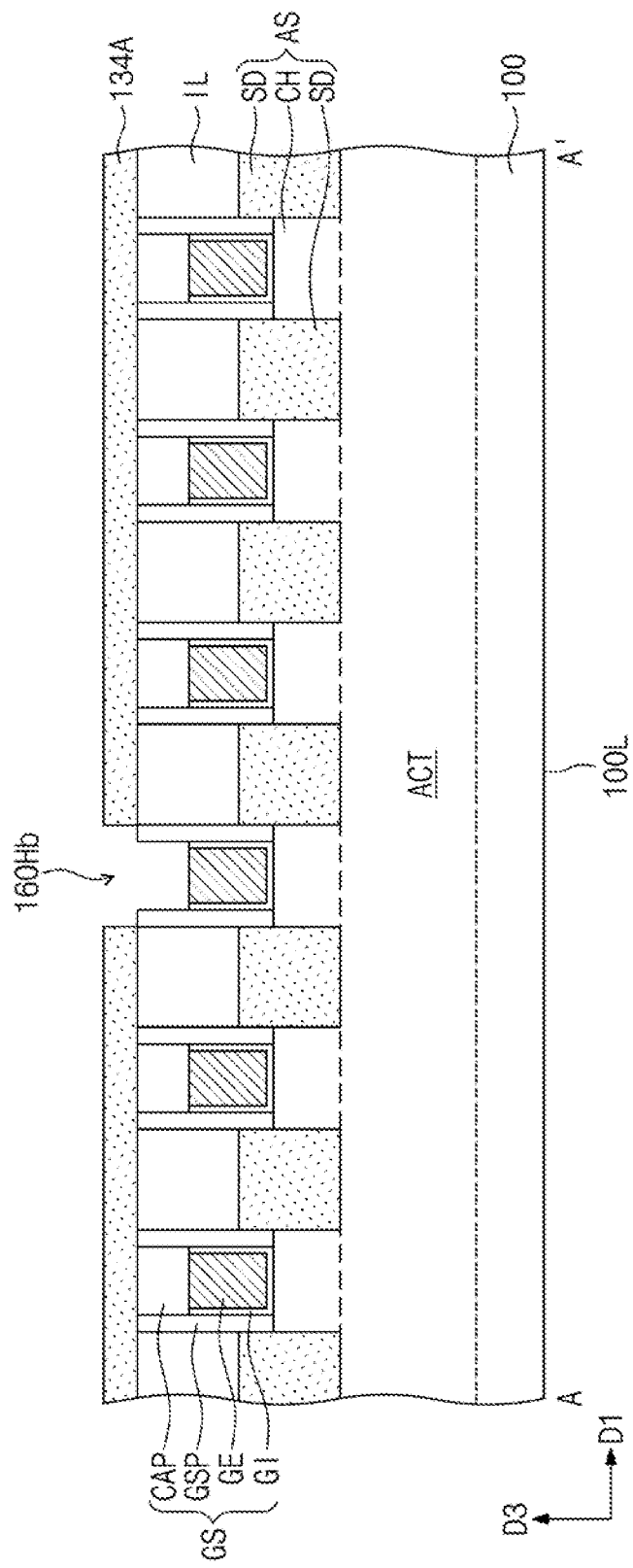
Figure 16B:
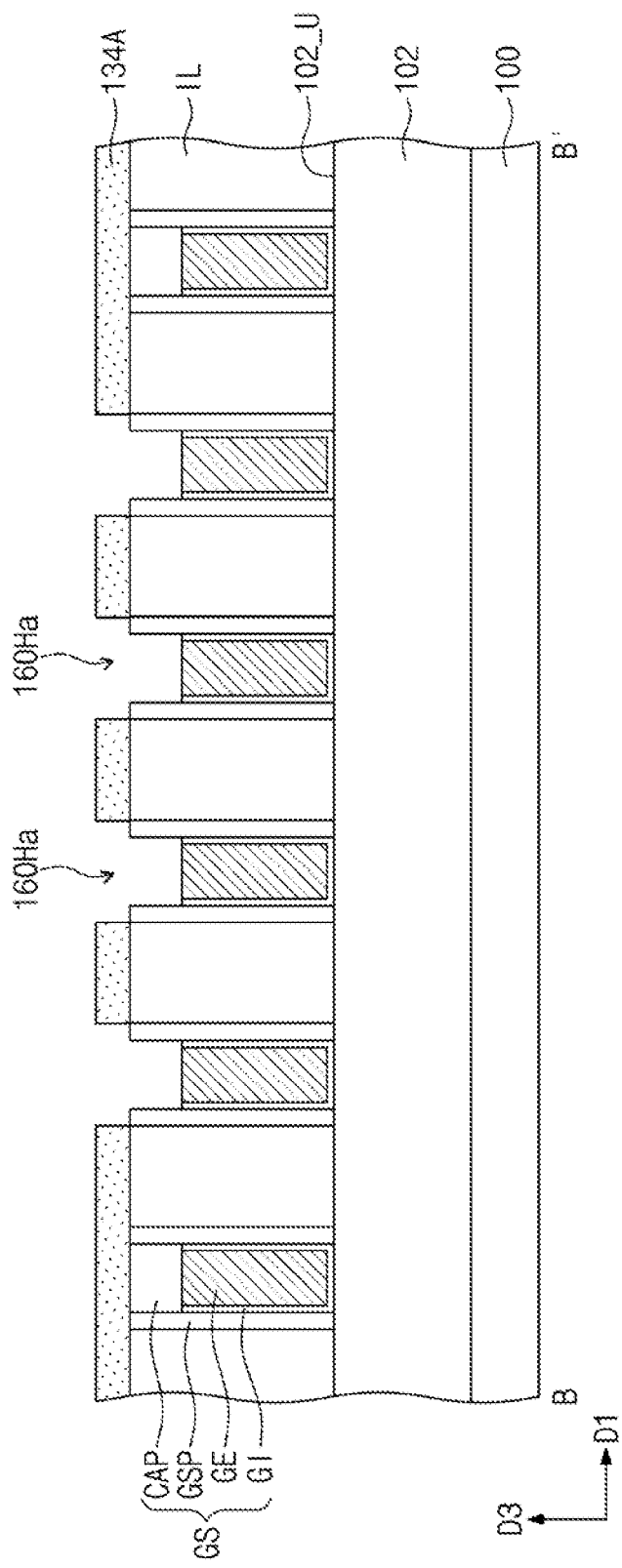
Figure 16C:
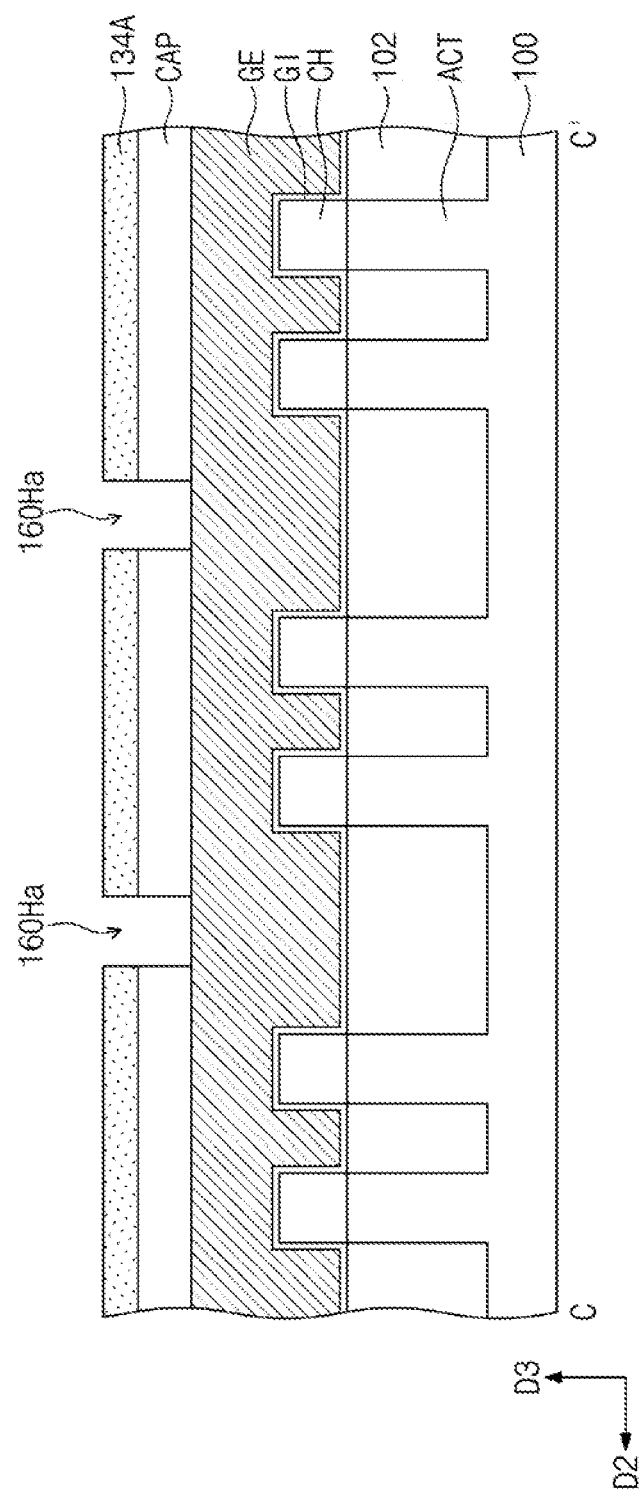
Figure 16D:
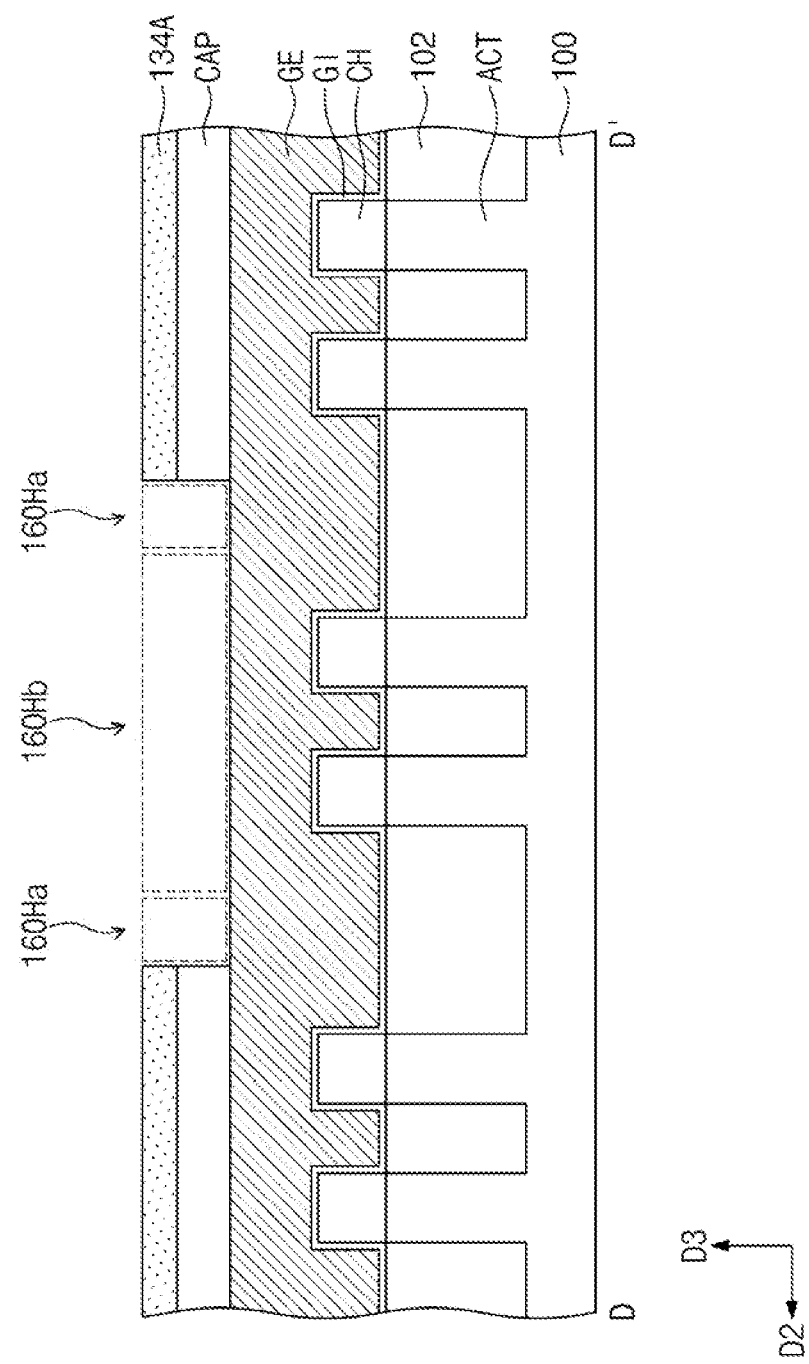
Figure 17:
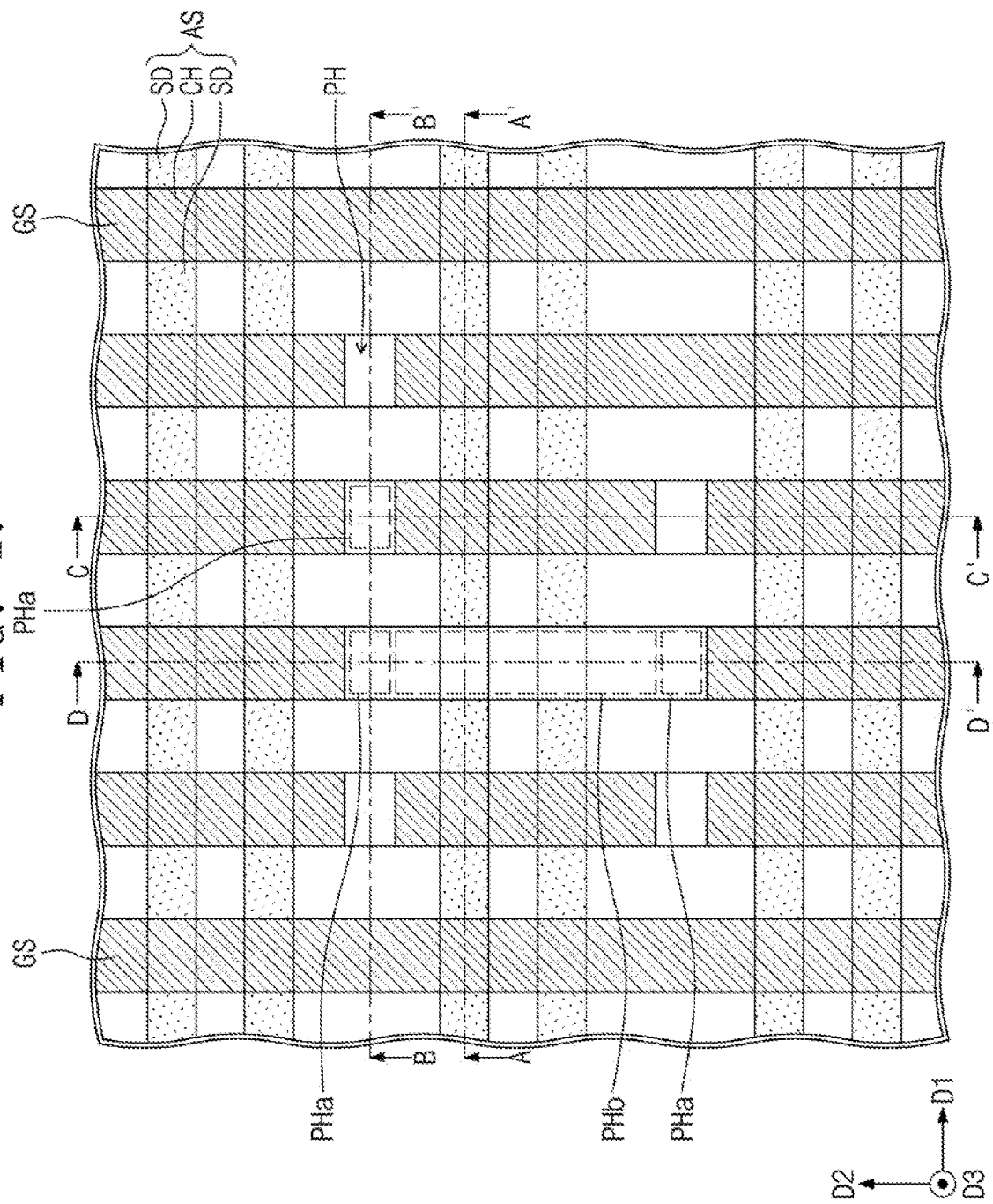
Figure 18A:
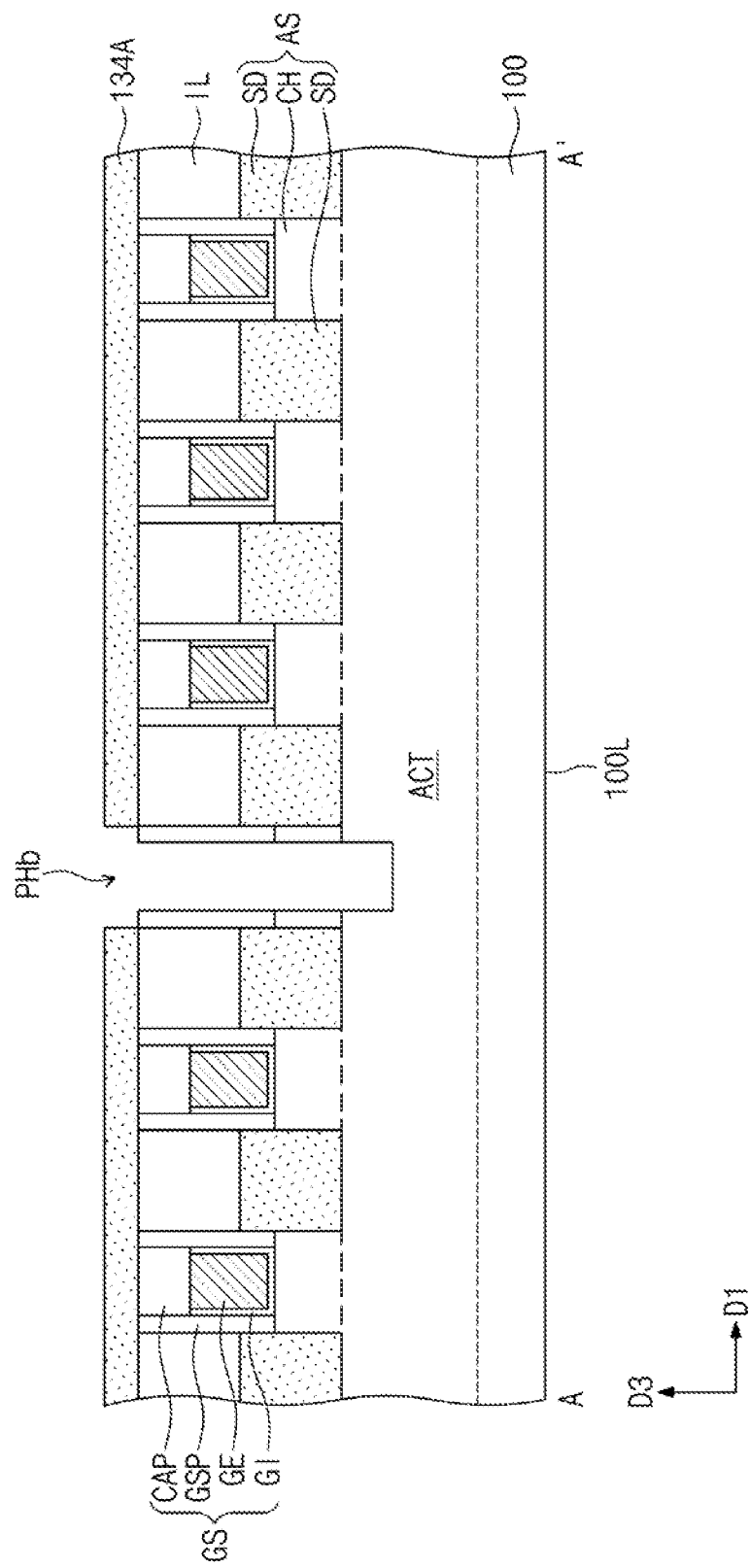
Figure 18B:
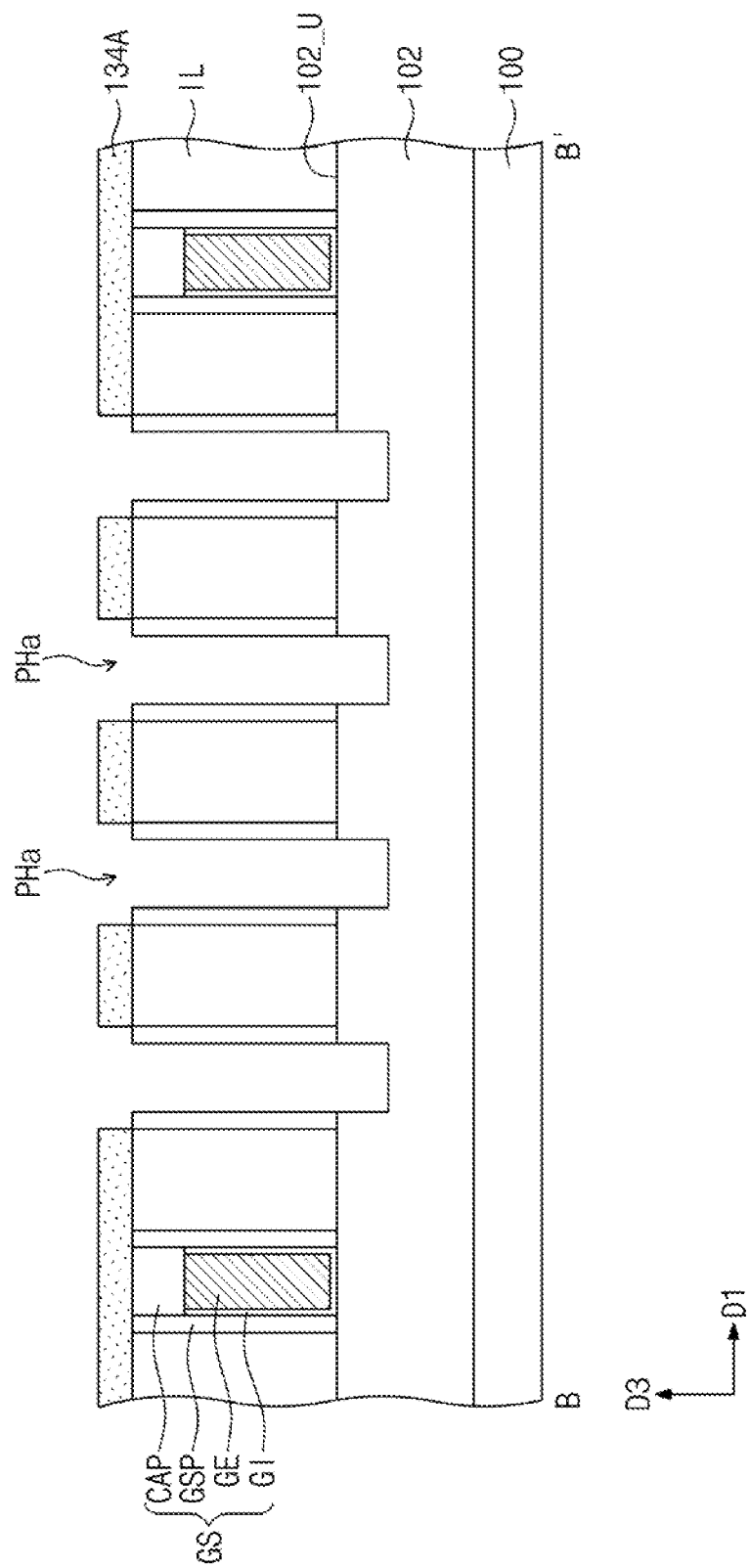
Figure 18C:
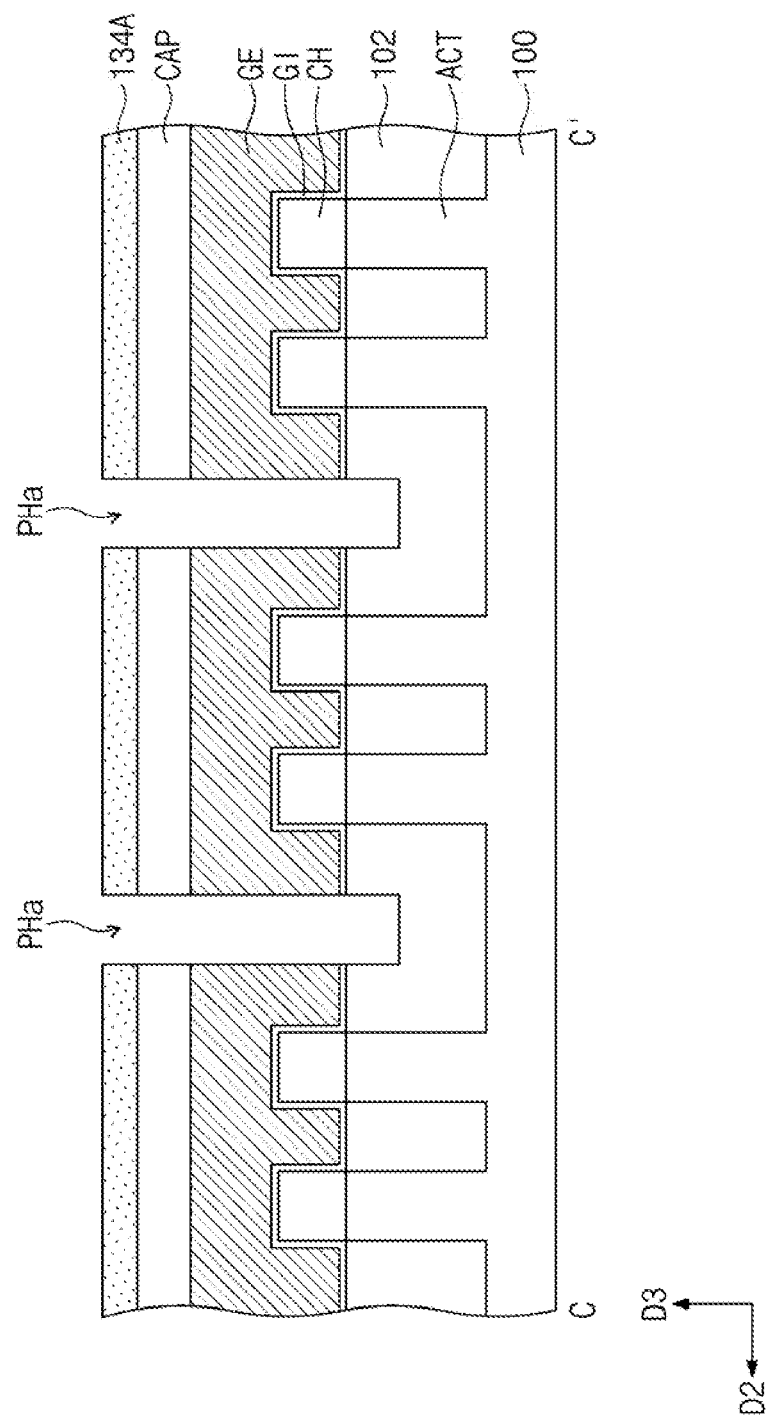
Figure 18D:
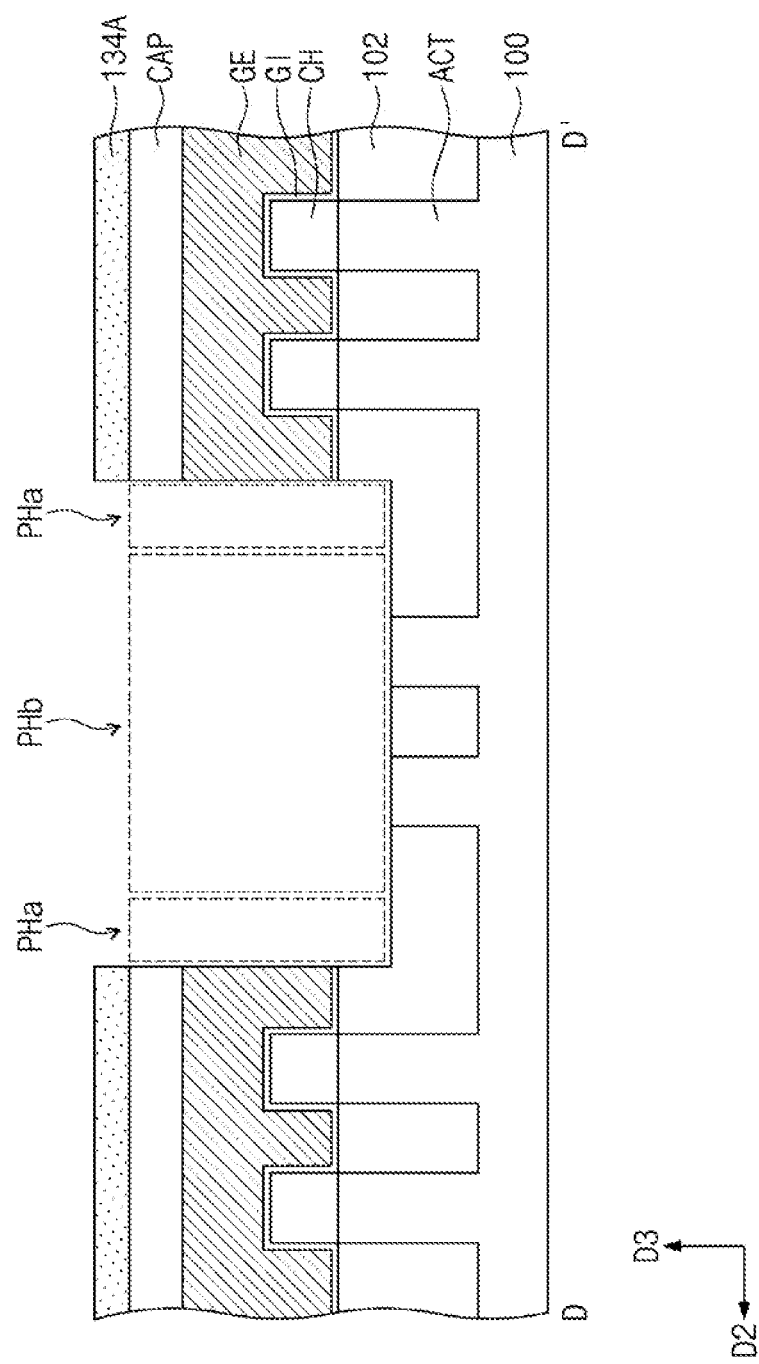
Figure 19:
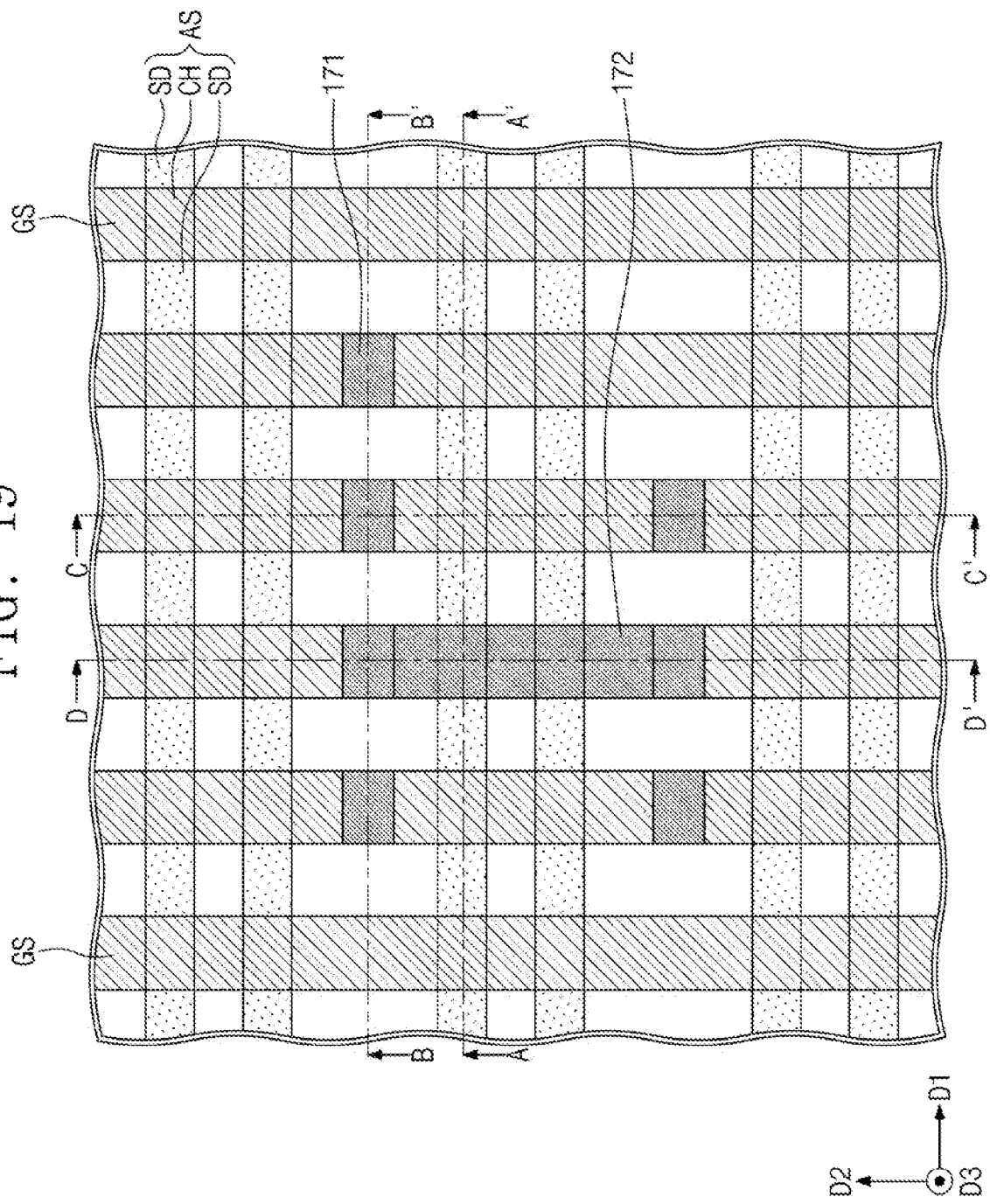
Figure 20A:
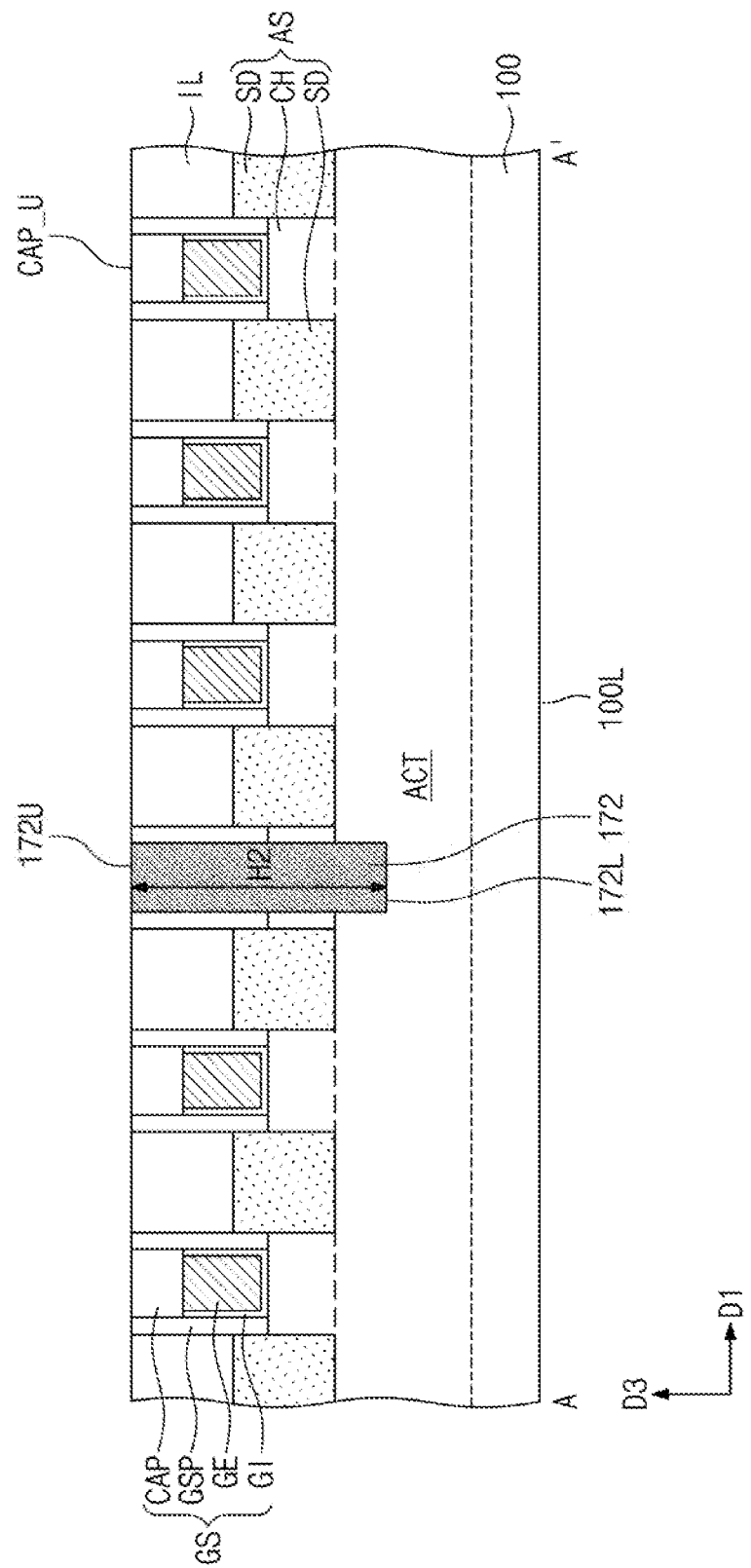
Figure 20B:
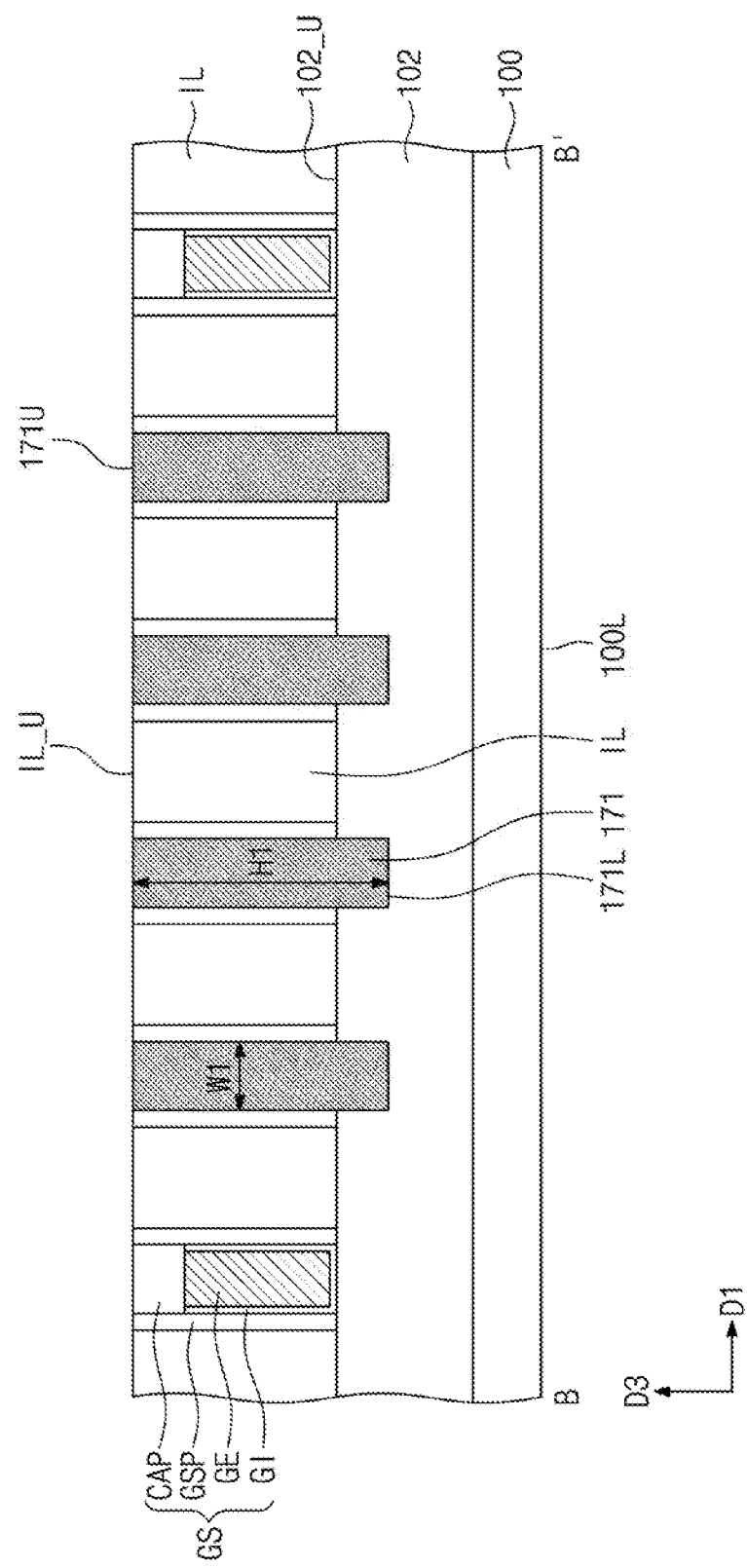
Figure 20C:
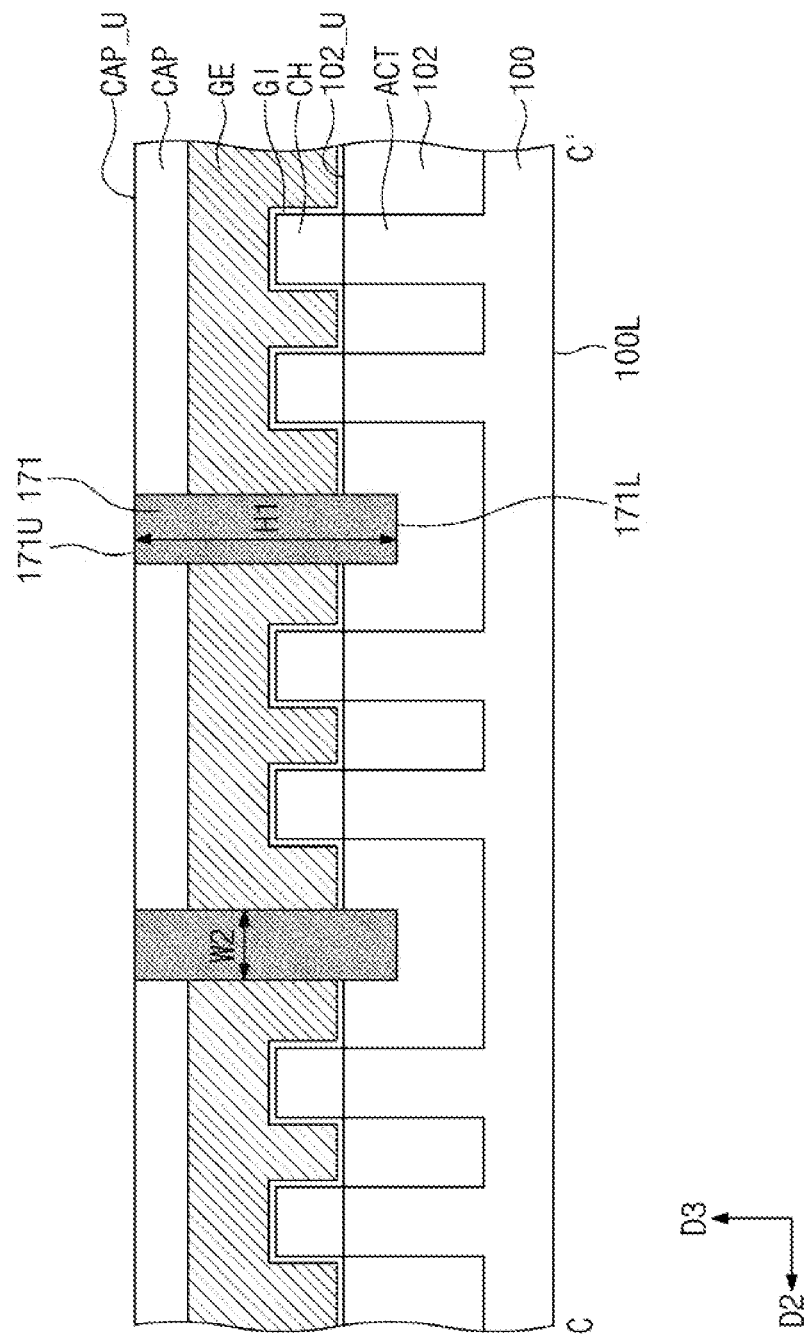
Figure 20D:
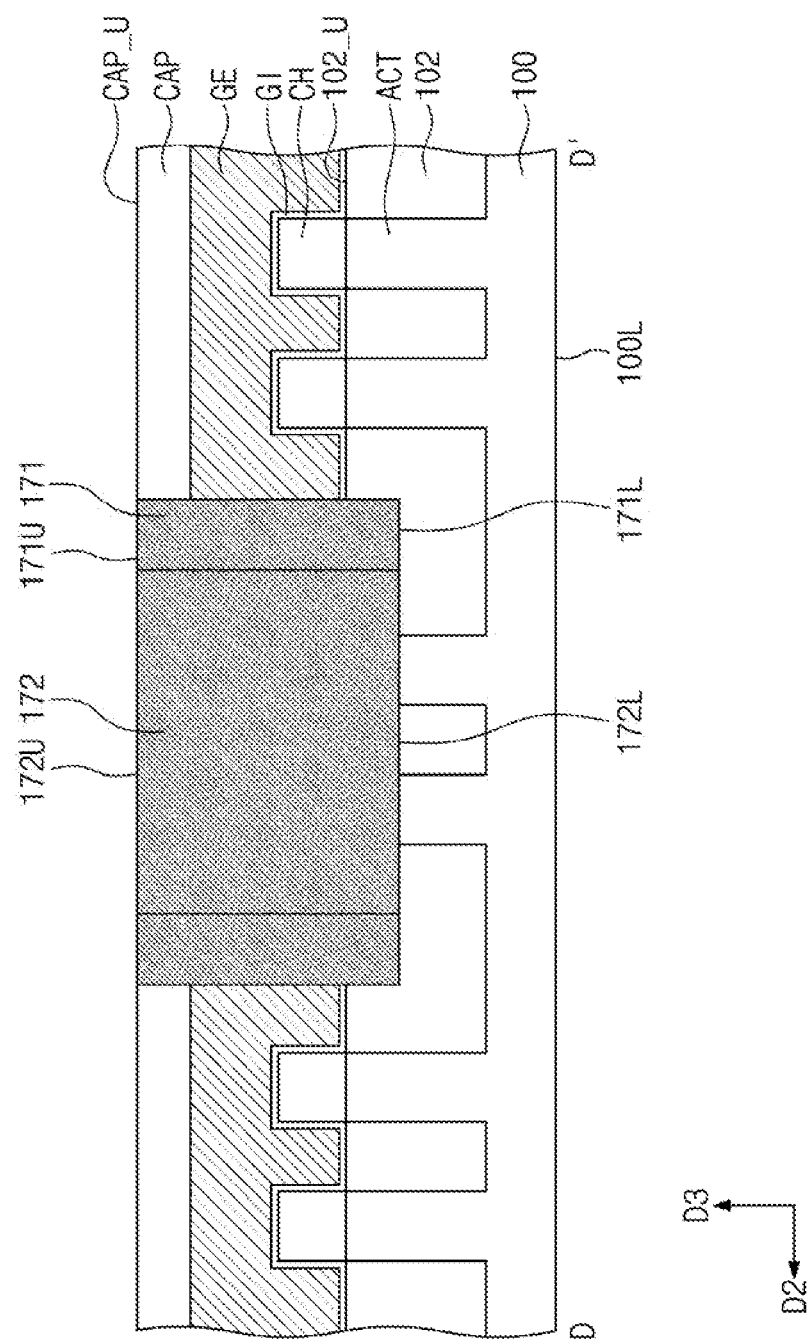
Figure 21A:
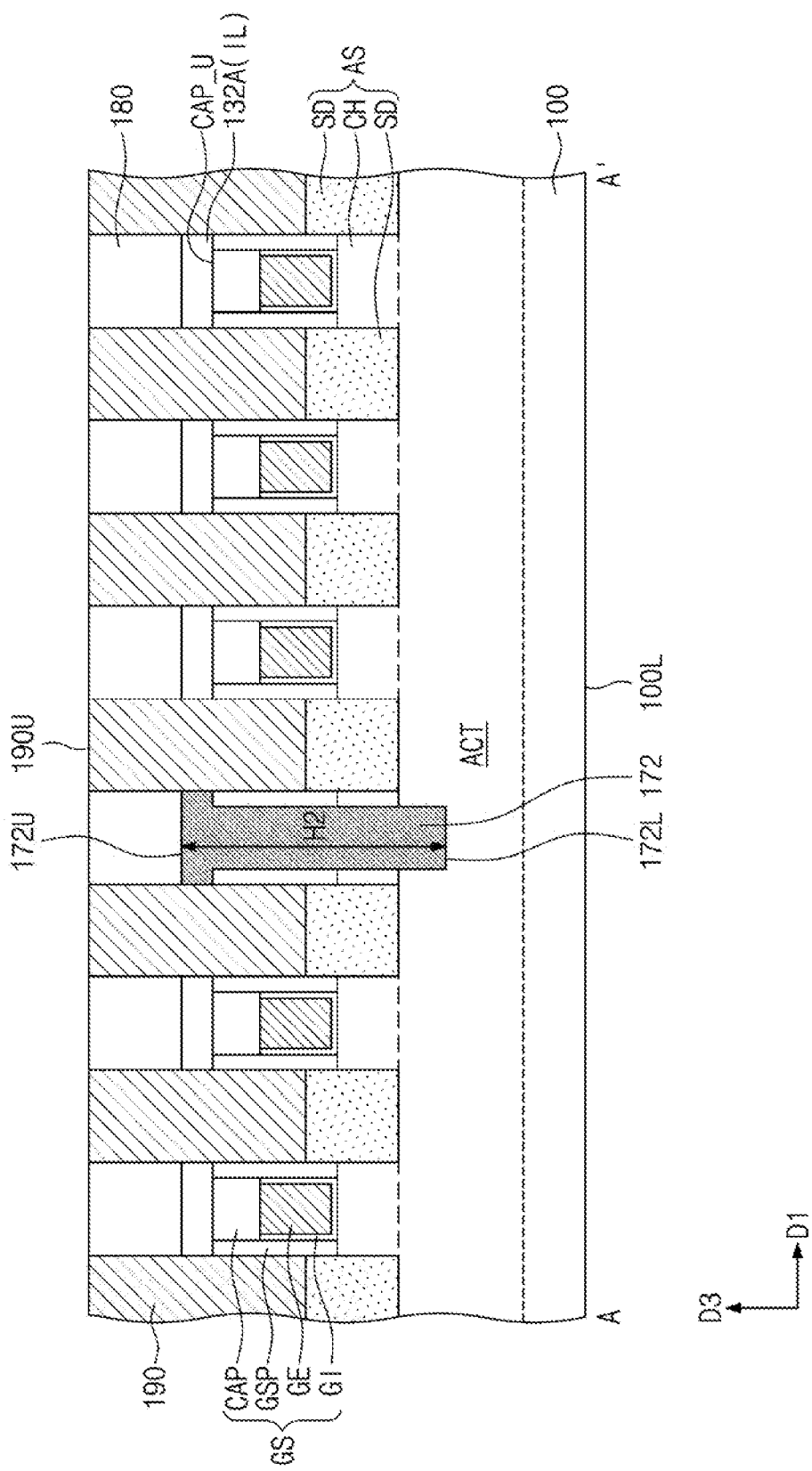
FIGS. 21A, 21B, 21C, and 21D illustrate cross-sectional views respectively taken along lines A-A', B-B', C-C', and D-D' of FIG. 1, of a semiconductor device according to some embodiments.
Figure 21B:
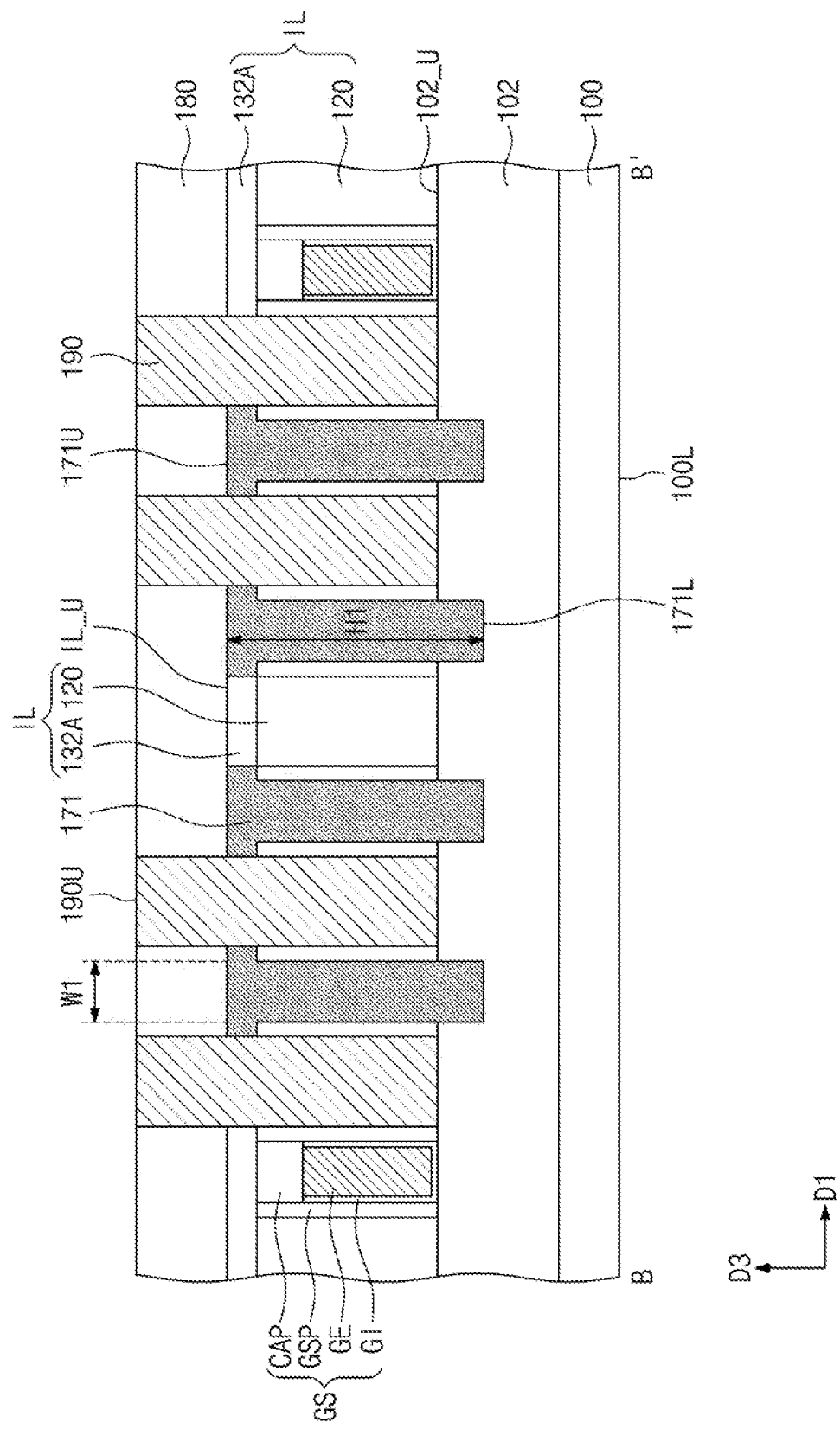
Figure 21C:
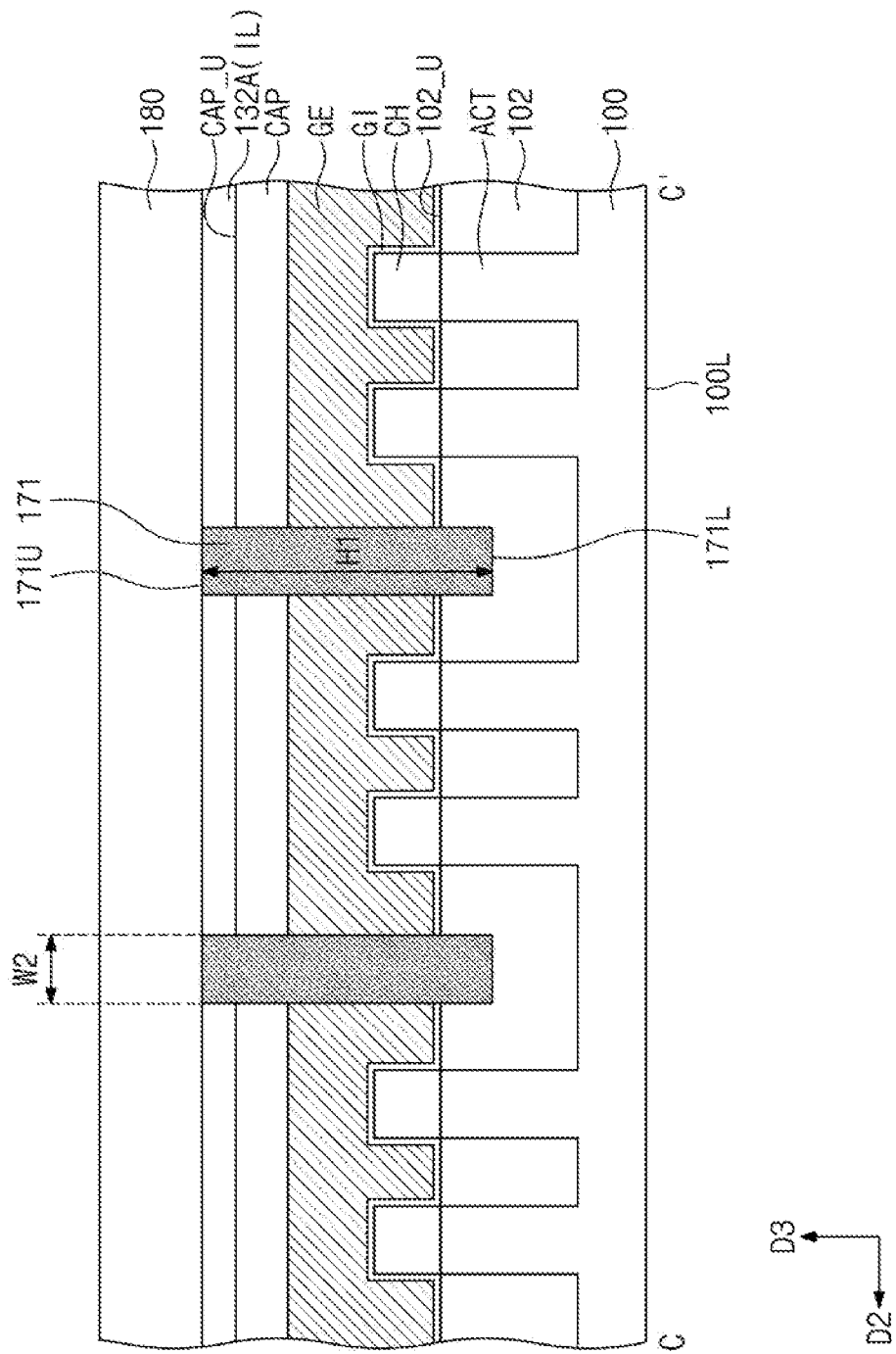
Figure 21D:
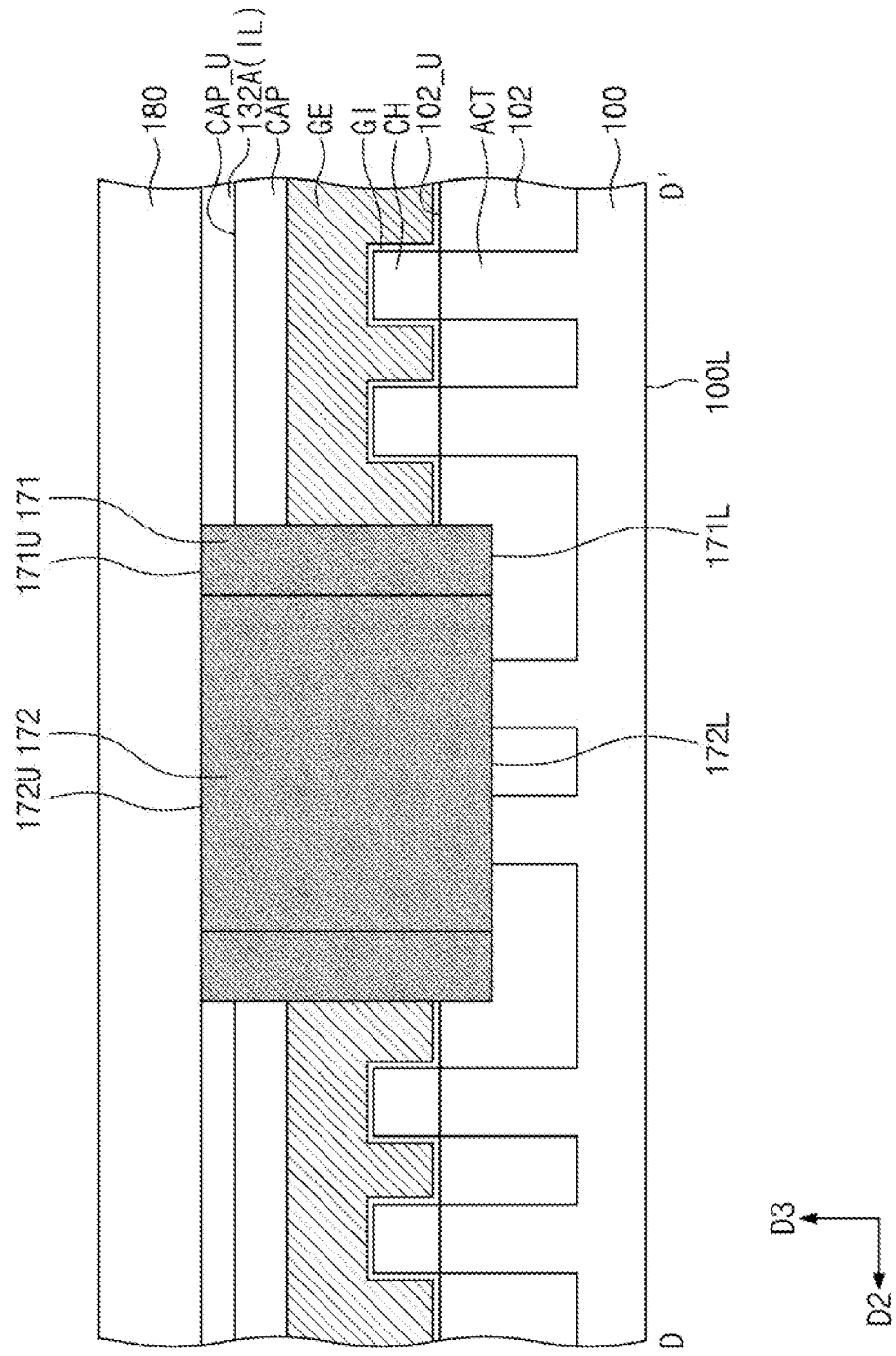
Figure 22A:
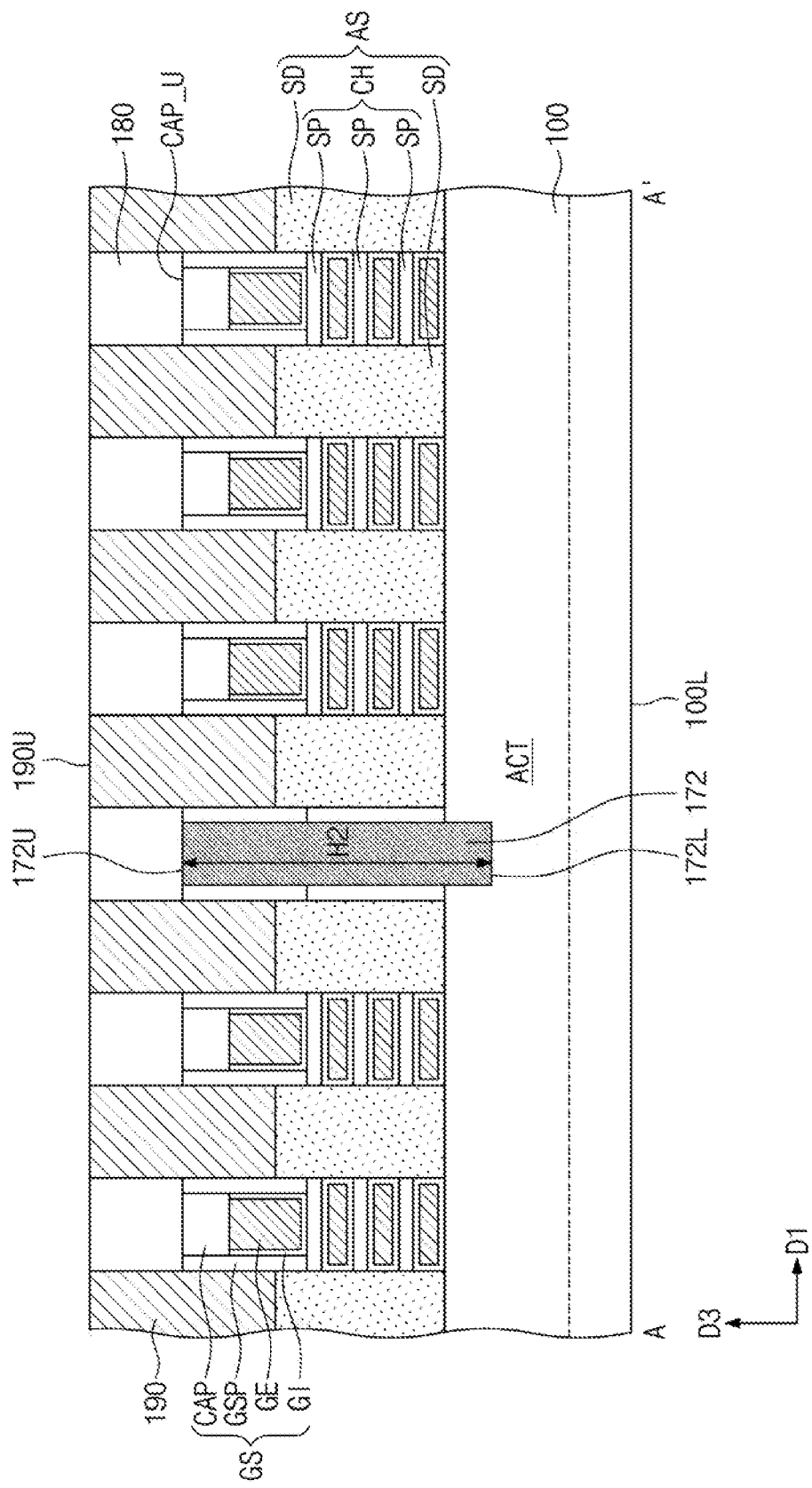
FIGS. 22A, 22B, 22C, and 22D illustrate cross-sectional views respectively taken along lines A-A', B-B', C-C', and D-D' of FIG. 1, of a semiconductor device according to some embodiments.
Figure 22B:
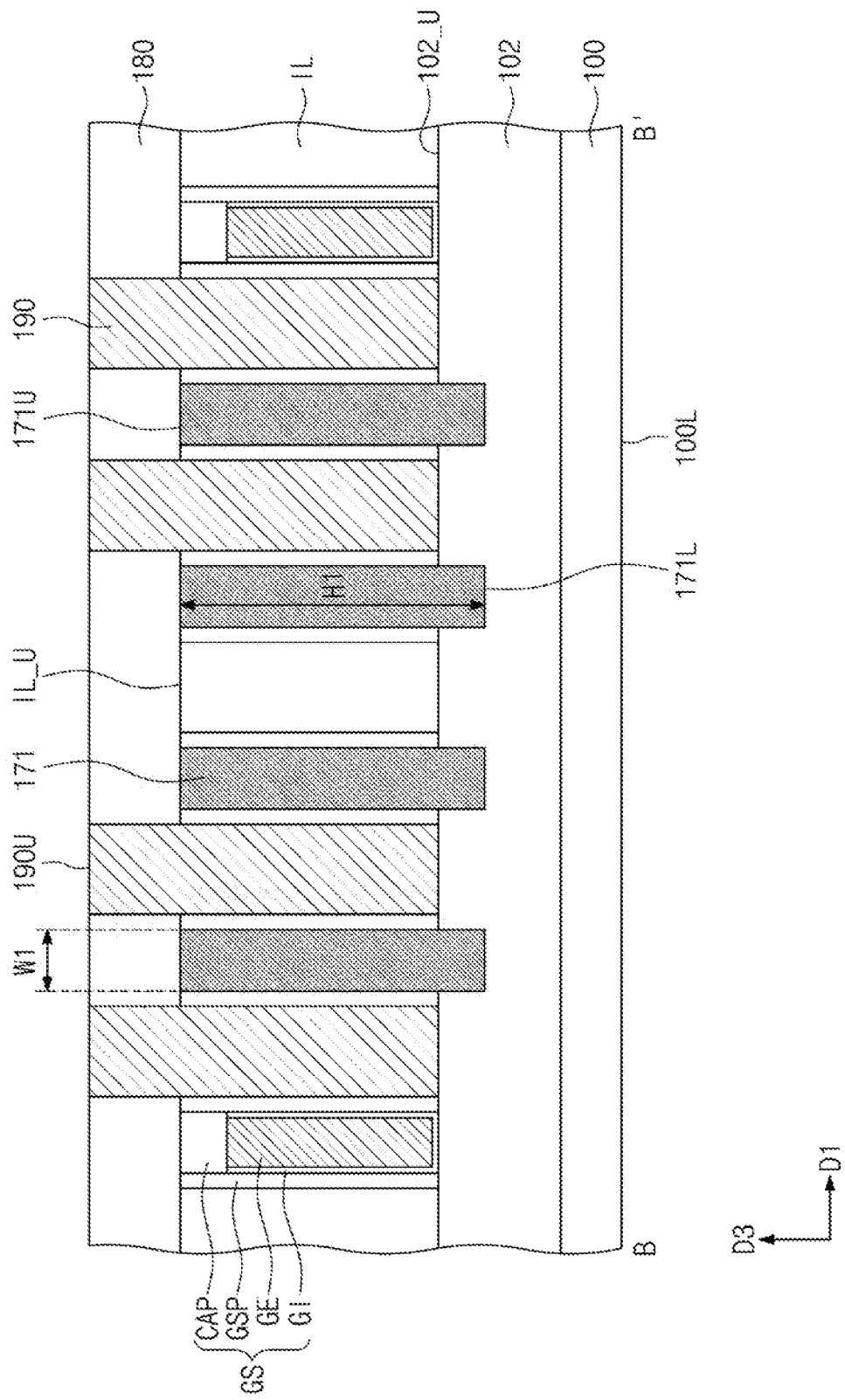
Figure 22C:
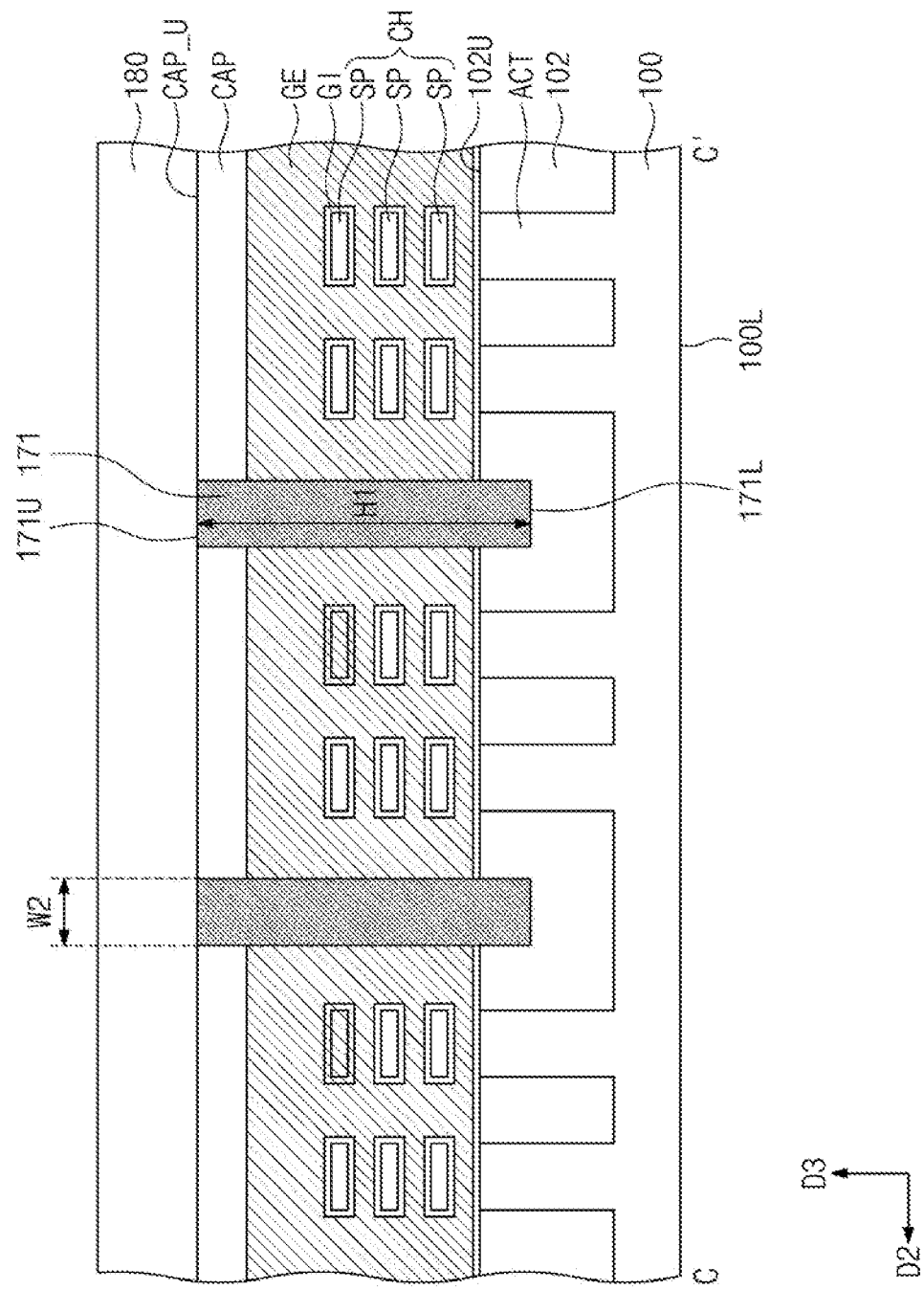
Figure 22D:
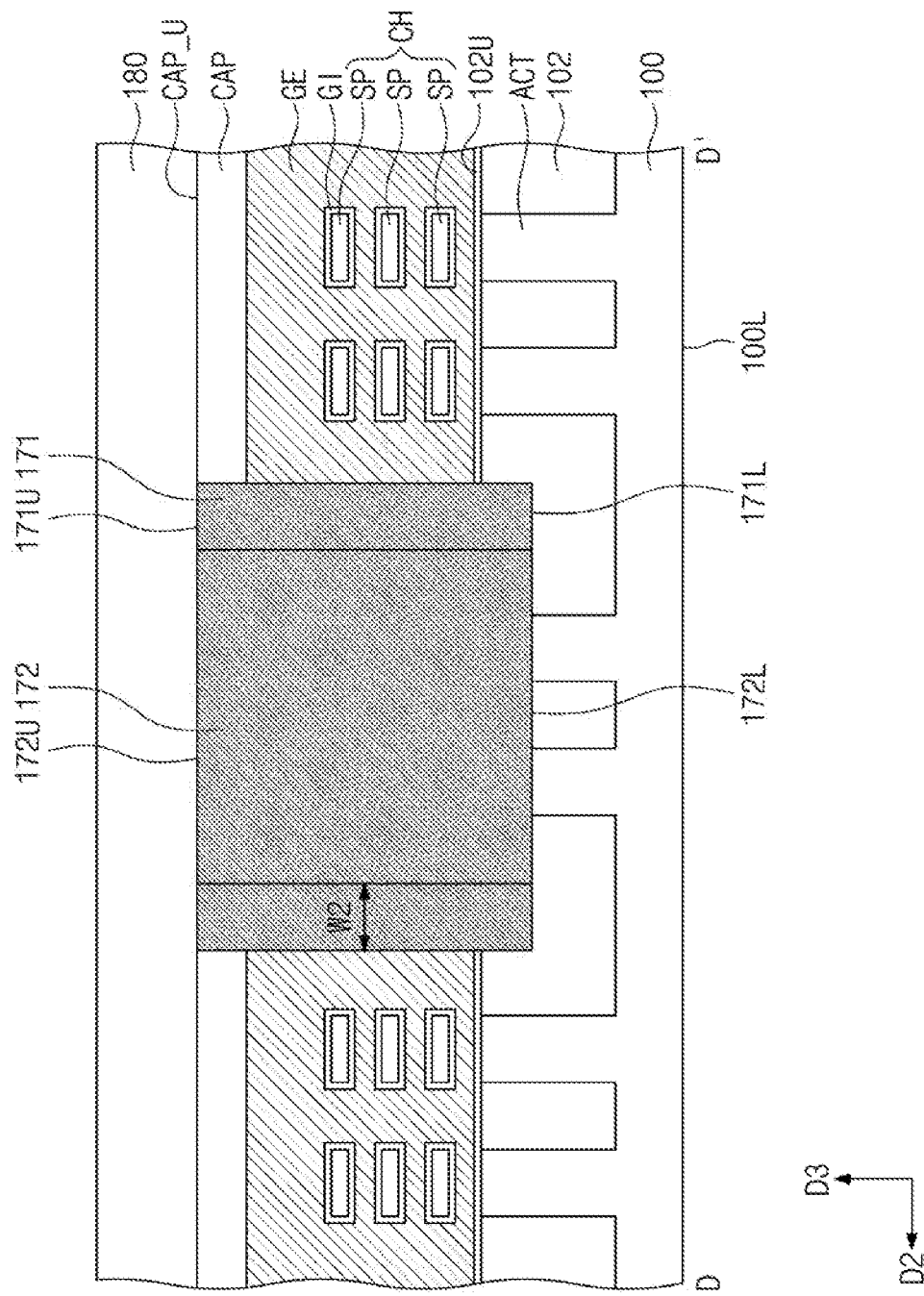

FIG. 1 illustrates a plan view of a semiconductor device according to some embodiments. FIGS. 2A, 2B, 2C, and 2D illustrate cross-sectional views respectively taken along lines A-A', B-B', C-C', and D-D' of FIG. 1.

Referring to FIGS. 1 and 2A to 2D, an active pattern ACT may be on a substrate 100. The substrate 100 may be a semiconductor substrate. In an implementation, the substrate 100 may be a silicon substrate or a silicon-on-insulator (SOI) substrate. The active pattern ACT may protrude from the substrate 100 in a direction (e.g., third direction D3) perpendicular to a bottom surface 100L of the substrate 100, and may extend in a first direction D1 parallel to the bottom surface 100L of the substrate 100. The active pattern ACT may be provided in plural. The plurality of active patterns ACT may be spaced apart from each other in a second direction D2 that is parallel to the bottom surface 100L of the substrate 100 and intersects the first direction D1. The active patterns ACT may be portions of the substrate 100 that protrude in the third direction D3 perpendicular to the bottom surface 100L of the substrate 100.

A device isolation layer 102 may be on the substrate 100. A plurality of device isolation layers 102 may be on opposite sides of the active pattern ACT. The device isolation layers 102 may extend in the first direction D1 and may be spaced apart in the second direction D2 from each other across the active pattern ACT. The device isolation layer 102 may include, e.g., a silicon nitride layer, a silicon oxide layer, or a silicon oxynitride layer. As used herein, the term "or" is not an exclusive term, e.g., "A or B" would include A, B, or A and B.

An active structure AS may be on the active pattern ACT. When viewed in plan, the active structure AS may overlap the active pattern ACT. The active structure AS may extend in the first direction D1 along a top surface of the active pattern ACT. The active structure AS may include channel patterns CH and source/drain patterns SD that are spaced apart in the first direction D1 from each other across each of the channel patterns CH. In an implementation, the channel pattern CH may be between a pair of the source/drain patterns SD that are adjacent to each other.

Each of the channel patterns CH may be an upper portion of the active pattern ACT, which upper portion protrudes in the third direction D3 from the active pattern ACT. The device isolation layer 102 may expose (e.g., may not cover) sidewalls of each of the channel patterns CH.

The source/drain patterns SD may be epitaxial patterns grown from the active pattern ACT that serves as a seed. The source/drain patterns SD may include, e.g., silicon-germanium (SiGe), silicon (Si), or silicon carbide (SiC). The source/drain patterns SD may provide each of the channel patterns CH with a tensile or compressive strain. The source/drain patterns SD may further include impurities. The impurities may help improve electrical properties of a transistor including the source/drain patterns SD. In an implementation, when the transistor is an NMOSFET, the impurities may include phosphorus (P), and when the transistor is a PMOSFET, the impurities may include boron (B).

A plurality of gate structures GS may run across the active structure AS. The gate structures GS may be spaced apart from each other in the first direction D1 and may extend (e.g., lengthwise) in the second direction D2. The gate structures GS may extend in the second direction D2 and may cross the active structure AS, the active pattern ACT, and the device isolation layer 102. The gate structures GS may vertically overlap corresponding channel patterns CH of the active structure AS, and the source/drain patterns SD may be on or at opposite sides of each of the gate structures GS.

Each of the gate structures GS may include a gate electrode GE on a corresponding channel pattern CH, a gate dielectric pattern GI between the gate electrode GE and the corresponding channel pattern CH, gate spacers GSP on sidewalls of the gate electrode GE, and a gate capping pattern CAP on a top surface of the gate electrode GE.

The gate electrode GE may cover a top surface and the sidewalls of the channel pattern CH, and may also cover a top surface 102_U of the device isolation layer 102 while extending in the second direction D2. The gate dielectric pattern GI may be between the gate electrode GE and a corresponding channel pattern CH, and may extend along the second direction D2 between the device isolation layer 102 and the gate electrode GE. The gate dielectric pattern GI may extend between the gate electrode GE and each of the gate spacers GSP. The gate dielectric pattern GI may have a top surface substantially coplanar with that of the gate electrode GE. The gate capping pattern CAP may cover the top surface of the gate electrode GE and the top surface of the gate dielectric pattern GI. The gate spacers GSP may extend onto sidewalls of the gate capping pattern CAP. The gate spacers GSP may have their top surfaces coplanar with a top surface CAP_U of the gate capping pattern CAP. The gate electrode GE, a corresponding channel pattern CH, corresponding source/drain patterns SD may constitute a fin field effect transistor (FinFET).

The gate electrode GE may include, e.g., a doped semiconductor, a conductive metal nitride, or a metal (e.g., non-compounded metal). The gate dielectric pattern GI may include, e.g., a silicon oxide layer, a silicon nitride layer, a silicon oxynitride layer, or a high-k dielectric layer. Each of the gate spacer GSP and the gate capping pattern CAP may include, e.g., a silicon oxide layer, a silicon nitride layer, or a silicon oxynitride layer.

A semiconductor device according to some embodiments may include a negative capacitance field effect transistor that uses a negative capacitor. In an implementation, the gate dielectric pattern GI may include a ferroelectric material layer having ferroelectric properties and a paraelectric material layer having paraelectric properties. The ferroelectric material layer may have a negative capacitance, and the paraelectric material layer may have a positive capacitance. In an implementation, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor. When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 mV/decade at room temperature.

The ferroelectric material layer may have ferroelectric properties. The ferroelectric material layer may include, e.g., hafnium oxide, hafnium zirconium oxide, barium strontium titanium oxide, or lead zirconium titanium oxide. In an implementation, the hafnium zirconium oxide may be a material in which hafnium oxide is doped with zirconium (Zr). In an implementation, the hafnium zirconium oxide may be a compound of hafnium (Hf), zirconium (Zr), and oxygen (O). The ferroelectric material layer may further include impurities doped therein. In an implementation, the impurities may include, e.g., aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of impurities included in the ferroelectric material layer may be changed depending on what ferroelectric material is included in the ferroelectric material layer. When the ferroelectric material layer includes hafnium oxide, the ferroelectric material layer may include impurities, e.g., gadolinium (Gd), silicon (Si), zirconium (Zr), aluminum (Al), or yttrium (Y). When the impurities are aluminum (Al), the ferroelectric material layer may include about 3 to about 8 atomic percent aluminum. In this description, the ratio of impurities may be a ratio of aluminum to the sum of hafnium and aluminum. When the impurities include silicon (Si), the ferroelectric material layer may include about 2 to about 10 atomic percent silicon. When the impurities include yttrium (Y), the ferroelectric material layer may include about 2 to about 10 atomic percent yttrium. When the impurities include gadolinium (Gd), the ferroelectric material layer may include about 1 to about 7 atomic percent gadolinium. When the impurities include zirconium (Zr), the ferroelectric material layer may include about 50 to about 80 atomic percent zirconium.

The paraelectric material layer may have paraelectric properties. The paraelectric material layer may include, e.g., silicon oxide or a high-k metal oxide. In an implementation, the metal oxide included in the paraelectric material layer may include, e.g., hafnium oxide, zirconium oxide, or aluminum oxide.

The ferroelectric and paraelectric material layers may include the same material. The ferroelectric material layer may have ferroelectric properties, but the paraelectric material layer may not have ferroelectric properties. In an implementation, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. In an implementation, the thickness of the ferroelectric material layer may range, e.g., from about 0.5 nm to about 10 nm. Ferroelectric materials may have their own critical thickness that exhibits ferroelectric properties, and the thickness of the ferroelectric material layer may depend on ferroelectric material. In an implementation, the gate dielectric pattern GI may include a single high-k dielectric material layer. In an implementation, the gate dielectric pattern GI may include a plurality of ferroelectric material layers that are spaced apart from each other. The gate dielectric pattern GI may have a stacked structure in which a plurality of ferroelectric material layers are stacked alternately with a plurality of paraelectric material layers.

A plurality of first isolation patterns 171 may correspondingly penetrate the gate structures GS that are adjacent to each other. Each of the first isolation patterns 171 may separate a corresponding gate structure GS into a plurality of gate structures GS that are spaced apart from each other in the second direction D2. In an implementation, the first isolation pattern 171 may be a gate cutting pattern. Each of the first isolation patterns 171 may penetrate the gate capping pattern CAP, the gate electrode GE, and the gate dielectric pattern GI that are included in a corresponding gate structure GS. The gate spacers GSP may extend onto or along sidewalls of each of the first isolation patterns 171. Each of the first isolation patterns 171 may be between the gate spacers GSP. The gate spacers GSP may be between one of the first isolation patterns 171 and a lower dielectric layer IL, which will be discussed below.

The first isolation patterns 171 may be spaced apart from each other in the first direction D1 and may be aligned with each other along the first direction D1. The first isolation patterns 171 may be on the device isolation layer 102 between the active patterns ACT that neighbor each other in the second direction D2. In an implementation, each of the first isolation patterns 171 may extend into the device isolation layer 102. In an implementation, each of the first isolation patterns 171 may have a bottom surface 171L located at a lower level (e.g., closer to the substrate 100 in the third direction D3) than that of the top surface 102_U of the device isolation layer 102. The top surface 171U of each of the first isolation patterns 171 may be located at substantially the same level as that of the top surface CAP_U of the gate capping pattern CAP.

Each of the first isolation patterns 171 may have a first width W1 in the first direction D1 and a second width W2 in the second direction D2. In an implementation, the first width W1 of an odd-numbered one of the first isolation patterns 171 may be different from the first width W1 of an even-numbered one of the first isolation patterns 171 (e.g., adjacent ones of the first isolation patterns 171 may have different first widths W1 in an alternating pattern). In an implementation, the first widths W1 of the first isolation patterns 171 may be the same as each other. The second widths W2 of the first isolation patterns 171 may be the same as each other. Each of the first isolation patterns 171 may include, e.g., silicon nitride (SiN).

A second isolation pattern 172 may penetrate at least one of the gate structures GS. The second isolation pattern 172 may penetrate the gate capping pattern CAP, the gate electrode GE, and the gate dielectric pattern GI that are included in a corresponding gate structure GS. The gate spacers GSP may extend onto or along sidewalls of the second isolation pattern 172. The second isolation pattern 172 may be between the gate spacers GSP. As used herein, the terms "first," "second," and the like are merely for identification and differentiation, and are not intended to imply or require sequential inclusion (e.g., a third element and a fourth element may be described without implying or requiring the presence of a first element or second element).

The second isolation pattern 172 may extend in the second direction D2 between the source/drain patterns SD that are adjacent to each other. In an implementation, the second isolation pattern 172 may be a separation structure that separates neighboring source/drain patterns SD from each other. In an implementation, at least one of the first isolation patterns 171 and the second isolation pattern 172 may be formed into or as a single unitary body (e.g., may together form a one-piece or monolithic structure). In an implementation, the second isolation pattern 172 may extend in the second direction D2 from at least one of the first isolation patterns 171. The second isolation pattern 172 may be between a pair of the first isolation patterns 171 that are adjacent to each other in the second direction D2, thereby being connected to each other. The second isolation pattern 172 may include silicon nitride (SiN). In an implementation, there may be an invisible interface between the first isolation pattern 171 and the second isolation pattern 172.

In an implementation, the second isolation pattern 172 may extend into the device isolation layer 102. In an implementation, the second isolation patterns 172 may have bottom surfaces 172L located at a lower level than that of the top surface 102_U of the device isolation layer 102.

A first height H1 may be a height of the first isolation pattern 171 (in the third direction D3). The height of the first isolation pattern 171 may indicate a distance between bottom and top surfaces 171L and 171U of the first isolation pattern 171 (in the third direction D3). A second height H2 may be a height of the second isolation pattern 172 (in the third direction D3). The height of the second isolation pattern 172 may indicate a distance between bottom and top surfaces 172L and 172U of the second isolation pattern 172. In an implementation, the first height H1 may be substantially the same as the second height H2.

The bottom surface 171L of the first isolation pattern 171 may be located at substantially the same level as that of the bottom surface 172L of the second isolation pattern 172. In an implementation, the bottom surface 171L of at least one of the first isolation patterns 171 may be substantially coplanar with the bottom surface 172L of the second isolation pattern 172 (e.g., substantially the same distance from the substrate 100 in the third direction D3).

In an implementation, a width in the first direction D1 of the second isolation pattern 172 may be substantially the same as the first width W1 of an even-numbered first isolation pattern 171. In an implementation, a width in the second direction D2 of the second isolation pattern 172 may be different from the second width W2 of the first isolation pattern 171. In an implementation, the width in the second direction D2 of the second isolation pattern 172 may be greater than the second width W2.

The substrate 100 may include a lower dielectric layer IL thereon that covers the first isolation patterns 171, the second isolation pattern 172, the gate structures GS, and the source/drain patterns SD. The lower dielectric layer IL may expose the top surface 171U of each of the first isolation patterns 171 and the top surface 172U of the second isolation pattern 172. The lower dielectric layer IL may have a top surface IL_U substantially coplanar with the top surface 171U of each of the first isolation patterns 171, the top surface 172U of the second isolation pattern 172, and the top surface CAP_U of the gate capping pattern CAP. The lower dielectric layer IL may be between the gate structures GS and may extend between the first isolation patterns 171 that are adjacent to each other.

An upper dielectric layer 180 may be on the lower dielectric layer IL. The upper dielectric layer 180 may cover the top surface 171U of each of the first isolation patterns 171 and the top surface 172U of the second isolation pattern 172. The upper dielectric layer 180 may include, e.g., a silicon oxide layer, a silicon nitride layer, a silicon oxynitride layer, or a low-k dielectric layer.

A plurality of first contacts 190 may be on opposite sides of each of the gate structures GS. Each of the first contacts 190 may penetrate the upper dielectric layer 180 and the lower dielectric layer IL and may be coupled to a corresponding source/drain pattern SD. At least one of the first contacts 190 may extend in the second direction D2 between the first isolation patterns 171 that are adjacent to each other in the first direction D1. At least one of the first contacts 190 may penetrate the lower dielectric layer IL between the first isolation patterns 171. Each of the first contacts 190 may have a top surface 190U located at a higher level than that of the top surface 171U of each of the first isolation patterns 171, the top surface 172U of the second isolation pattern 172, the top surface IL_U of the lower dielectric layer IL, and the top surface CAP_U of the gate capping pattern CAP.

In some cases, a gate cutting pattern and a separation structure may not be formed at the same time, but may be formed in different processes. Therefore, there may be a difference in width and top surface level between the gate cutting pattern and the separation structure, and thus it may not be easy to etch the lower dielectric layer, with the result that pattern defects could occur when first contacts are formed. As a result, the first contacts could problematically decrease in electrical properties.

As discussed below, according to some embodiments, the first isolation pattern 171 as the gate cutting pattern may be formed simultaneously with the second isolation pattern 172 as the separation structure. In an implementation, the first isolation pattern 171 and the second isolation pattern 172 may be simultaneously formed into a single unitary body. In an implementation, the first isolation pattern 171 and the second isolation pattern 172 may be substantially the same in terms of width, top surface level, and height, and the lower dielectric layer IL may be easily etched to form the first contacts 190. In an implementation, it is possible to minimize the occurrence of pattern defects in the first contacts 190. As a result, a semiconductor device may increase or improve in electrical properties.

In an implementation, the first isolation pattern 171 and the second isolation pattern 172 may not be in different processes, but may be formed at the same time, and it may be possible to simplify fabricating processes and to reduce manufacturing costs.

A plurality of second contacts may penetrate the upper dielectric layer 180 and may be coupled to the gate electrodes GE of the gate structures GS. A plurality of wiring lines may be on the upper dielectric layer 180 and may be electrically connected to the first contacts 190 and the second contacts. The wiring lines may apply voltages through the first contacts 190 and the second contacts to the source/drain patterns SD and the gate electrodes GE. The first contacts 190, the second contacts, and the wiring lines may include a conductive material.

FIGS. 3, 5, 7, 9, 11, 13, 15, 17, and 19 illustrate plan views of stages in a method of fabricating a semiconductor device according to some embodiments. FIGS. 4A, 6A, 8A, 10A, 12A, 14A, 16A, 18A, and 20A illustrate cross-sectional views taken along line A-A' of FIGS. 3, 5, 7, 9, 11, 13, 15, 17, and 19, respectively. FIGS. 4B, 6B, 8B, 10B, 12B, 14B, 16B, 18B, and 20B illustrate cross-sectional views taken along line B-B' of FIGS. 3, 5, 7, 9, 11, 13, 15, 17, and 19, respectively. FIGS. 4C, 6C, 8C, 10C, 12C, 14C, 16C, 18C, and 20C illustrate cross-sectional views taken along line C-C' of FIGS. 3, 5, 7, 9, 11, 13, 15, 17, and 19, respectively. FIGS. 10D, 12D, 14D, 16D, 18D, and 20D illustrate cross-sectional views taken along line D-D' of FIGS. 9, 11, 13, 15, 17, and 19, respectively.

Referring to FIGS. 3 and 4A to 4C, an active pattern ACT may be formed on a substrate 100. The formation of the active pattern ACT may include patterning the substrate 100 to form trenches T that define the active pattern ACT. The trenches T may have their linear shapes each of which extends in a first direction D1 and may be spaced apart from each other in a second direction D2. The formation of the trenches T may include forming on the substrate 100 a mask pattern that defines an area where the active pattern ACT is formed, and using the mask pattern as an etching mask to anisotropically etch the substrate 100.

A device isolation layer 102 may be formed on opposite sides of the active pattern ACT. The device isolation layer 102 may fill the trenches T. The formation of the device isolation layer 102 may include forming on the substrate 100 a dielectric layer that fills the trenches T and planarizing the dielectric layer until the mask pattern is exposed. An upper portion of the device isolation layer 102 may be recessed to expose an upper portion of the active pattern ACT. An active fin AF may be defined to indicate the upper portion of the active pattern ACT, which upper portion is exposed by the device isolation layer 102. The mask patterns may be removed while the upper portion of the device isolation layer 102 is recessed.

A sacrificial gate pattern 112 may be formed on the substrate 100 to run across the active pattern ACT and the device isolation layer 102. The sacrificial gate pattern 112 may extend in the second direction D2. The sacrificial gate pattern 112 may cover a top surface and sidewalls (e.g., or the active fin AF) of the active pattern ACT and may extend onto a top surface of the device isolation layer 102. The active pattern ACT may be formed in plural. The plurality of active patterns ACT may extend in the first direction D1 and may be spaced apart from each other in the second direction D2. The sacrificial gate pattern 112 may extend in the second direction D2 to run across the plurality of active patterns ACT.

An etch stop pattern 110 may be between the sacrificial gate pattern 112 and the active pattern ACT, and may extend between the sacrificial gate pattern 112 and the device isolation layer 102. The formation of the sacrificial gate pattern 112 and the etch stop pattern 110 may include sequentially forming on the substrate 100 an etch stop layer and a sacrificial gate layer that cover the active pattern ACT and the device isolation layer 102, forming a sacrificial mask pattern 114 on the sacrificial gate layer that defines an area where the sacrificial gate pattern 112 is formed, and using the sacrificial mask pattern 114 as an etching mask to sequentially pattern the sacrificial gate layer and the etch stop layer. The etch stop layer may include, e.g., a silicon oxide layer. The sacrificial gate layer may include a material having an etch selectivity with respect to the etch stop layer. The sacrificial gate layer may include, e.g., polysilicon. The sacrificial mask pattern 114 may be used as an etching mask to pattern the sacrificial gate layer to form the sacrificial gate pattern 112. The patterning of the sacrificial gate layer may include performing an etch process having an etch selectivity with respect to the etch stop layer. After the sacrificial gate pattern 112 is formed, the etch stop layer on opposite sides of the sacrificial gate pattern 112 may be removed to form the etch stop pattern 110 below the sacrificial gate pattern 112.

A plurality of gate spacers GSP may be formed on sidewalls of the sacrificial gate pattern 112. The gate spacers GSP may include, e.g., silicon nitride. The formation of the gate spacers GSP may include forming a gate spacer layer on the substrate 100 that covers the sacrificial gate pattern 112, and anisotropically etching the gate spacer layer.

A sacrificial gate structure SGS may be constituted by the sacrificial mask pattern 114, the sacrificial gate pattern 112, the etch stop pattern 110, and the gate spacers GSP. The sacrificial gate structures SGS may run across the active pattern ACT and the device isolation layer 102. The sacrificial gate structures SGS may be spaced apart from each other in the first direction D1 and may extend in the second direction D2.

The sacrificial gate structure SGS may run across the active pattern ACT, and a first region R1 and second regions R2 may be defined in the active fin AF. The first region R1 may be a partial region of the active fin AF, which partial region is positioned below and vertically overlaps the sacrificial gate structure SGS. The second regions R2 may be other regions of the active fin AF, which other regions are positioned on opposite sides of the sacrificial gate structure SGS and are horizontally separated from each other by the first region R1.

Referring to FIGS. 5 and 6A to 6C, source/drain patterns SD may be formed on opposite sides of the sacrificial gate structure SGS. The formation of the source/drain patterns SD may include removing the second regions R2 of the active fin AF and performing a selective epitaxial growth process in which the active pattern ACT is used as a seed. The source/drain patterns SD may be epitaxial patterns that include, e.g., silicon-germanium (SiGe), silicon (Si), or silicon carbide (SiC). Simultaneously with or after the selective epitaxial growth process, the formation of the source/drain patterns SD may further include doping the source/drain patterns SD with impurities. The impurities may help improve electrical properties of a transistor including the source/drain patterns SD. When the transistor is an NMOSFET, the impurities may include phosphorus (P). When the transistor is a PMOSFET, the impurities may include boron (B).

The first region R1 of the active fin AF may be between the source/drain patterns SD and may constitute a channel pattern CH. The channel pattern CH and the source/drain patterns SD may constitute an active structure AS.

A lower dielectric layer IL may be formed on the substrate 100, and may cover the sacrificial gate structure SGS and the source/drain patterns SD. The lower dielectric layer IL may include, e.g., a silicon oxide layer, a silicon nitride layer, a silicon oxynitride layer, or a low-k dielectric layer. A planarization process may be performed to planarize the lower dielectric layer IL until the sacrificial gate pattern 112 is exposed. The planarization process may remove the sacrificial mask pattern 114.

Referring to FIGS. 7 and 8A to 8C, the sacrificial gate pattern 112 and the etch stop pattern 110 may be removed to form a gap region ILg in the lower dielectric layer IL. The gap region ILg may be an empty space between the gate spacers GSP. The gap region ILg may expose the channel pattern CH.

The gate dielectric pattern GI and the gate electrode GE may be formed to fill the gap region ILg. The formation of the gate dielectric pattern GI and the gate electrode GE may include forming a gate dielectric layer that conformally covers inner sidewalls of the gap region ILg, forming a gate electrode layer that fills a remaining portion of the gap region ILg, and locally forming the gate dielectric pattern GI and the gate electrode GE in the gap region ILg by performing a planarization process until the lower dielectric layer IL is exposed. An upper portion of the gate dielectric pattern GI and an upper portion of the gate electrode GE may be recessed to form an empty space between the gate spacers GSP. A gate capping pattern CAP may be formed in the empty space. The formation of the gate capping pattern CAP may include forming on the lower dielectric layer IL a gate capping layer that fills the empty space and performing a planarization process until the lower dielectric layer IL is exposed. The planarization process may be executed to allow the lower dielectric layer IL to expose a top surface of the gate capping pattern CAP.

A gate structure GS may be constituted by the gate dielectric pattern GI, the gate electrode GE, the gate capping pattern CAP, and the gate spacers GSP. The gate structures GS may run across the active pattern ACT and the device isolation layer 102. The gate structures GS may be spaced apart from each other in the first direction D1 and may extend in the second direction D2. Each of the gate structures GS may run across the active structure AS.

A mask layer 130 may be formed on the lower dielectric layer IL. The mask layer 130 may include a first mask layer 132, a second mask layer 136, and a third mask layer 138 that are stacked on the lower dielectric layer IL. In an implementation, the first mask layer 132 may include a nitride (e.g., silicon nitride), the second mask layer 136 may include an oxide (e.g., silicon oxide), and the third mask layer 138 may include polysilicon.

A plurality of blocking mask patterns 140 may be formed on the mask layer 130. The blocking mask patterns 140 may be spaced apart from each other in the first direction D1 and may extend in the second direction D2. The blocking mask patterns 140 may vertically overlap the lower dielectric layer IL between the gate structures GS. In an implementation, each of the blocking mask patterns 140 may vertically overlap the lower dielectric layer IL between the gate structures GS that are adjacent to each other. The blocking mask patterns 140 may include an oxide (e.g., silicon oxide).

In an implementation, the formation of the blocking mask patterns 140 may include forming sacrificial patterns on the mask layer 130, forming a spacer layer that conformally covers top surfaces and sidewalls of the sacrificial patterns, and anisotropically etching the spacer layer. Each of the sacrificial patterns may vertically overlap a corresponding one of the gate structures GS. The blocking mask patterns 140 may be formed by anisotropically etching the spacer layer. After the blocking mask patterns 140 are formed, the sacrificial patterns may be removed.

In an implementation, the formation of the blocking mask patterns 140 may include forming a blocking mask layer on the mask layer 130, forming photoresist patterns on the blocking mask layer, and using the photoresist patterns as an etching mask to etch the blocking mask layer. The photoresist patterns may be formed by, e.g., an extreme ultraviolet lithography process. The blocking mask patterns 140 may be formed by using the photoresist patterns as an etching mask to etch the blocking mask layer.

Referring to FIGS. 9 and 10A to 10D, a preliminary cutting mask layer 150 may be formed on the mask layer 130 and may cover the blocking mask patterns 140. The preliminary cutting mask layer 150 may include, e.g., a spin on hardmask (SOH) material.

A photoresist layer 152 may be formed on the preliminary cutting mask layer 150. The photoresist layer 152 may have a first opening 152P. The first opening 152P may include first regions 152Pa elongated in the first direction D1 and a second region 152Pb elongated in the second direction D2. The first regions 152Pa of the first opening 152P may run across and vertically overlap the gate structures GS and the blocking mask patterns 140. The second region 152Pb of the first opening 152P may vertically overlap a corresponding one of the gate structures GS. The second region 152Pb of the first opening 152P may connect to each other the first regions 152Pa of the first opening 152P.

Referring to FIGS. 11 and 12A to 12D, the photoresist layer 152 may be used as an etching mask to etch the preliminary cutting mask layer 150, and thus a preliminary cutting mask pattern 150A may be formed.

The preliminary cutting mask pattern 150A may have a second opening 150P that vertically overlaps the first opening 152P of the photoresist layer 152. The second opening 150P may include first regions 150Pa elongated in the first direction D1 and a second region 150Pb elongated in the second direction D2. The second opening 150P may expose the third mask layer 138. The second region 150Pb of the second opening 150P may connect to each other the first regions 150Pa of the second opening 150P.

The preliminary cutting mask pattern 150A may be used as an etching mask to etch the third mask layer 138 to thereby form a third mask pattern 138A. While the third mask layer 138 is etched, the blocking mask patterns 140 exposed by the first regions 150Pa of the second opening 150P may serve as an etching mask to form a portion of the third mask pattern 138A below the blocking mask patterns 140. The blocking mask patterns 140 exposed by the first regions 150Pa of the second opening 150P may be removed while the third mask layer 138 is etched or after the third mask pattern 138A is formed. The second opening 150P of the preliminary cutting mask pattern 150A may expose a portion of the third mask pattern 138A and the second mask layer 136 between portions of the third mask pattern 138A.

Referring to FIGS. 13 and 14A to 14D, the photoresist layer 152 and the preliminary cutting mask pattern 150A may be removed. Remaining portions of the blocking mask patterns 140 and the third mask pattern 138A may be used as an etching mask to sequentially etch the second mask layer 136 and the first mask layer 134. Therefore, a second mask pattern 136A and a first mask pattern 134A may be formed. The first, second, and third mask patterns 134A, 136A, and 138A may constitute a cutting mask pattern 160. The cutting mask pattern 160 may have holes 160H. The holes 160H may include first regions 160Ha that are spaced apart from and aligned with each other along the first direction D1 and a second region 160Hb that are elongated along the second direction D2. The holes 160H may vertically overlap the gate structure GS.

Each of the first regions 160Ha of the holes 160H may have a third width 160W3 in the first direction D1 and a fourth width 160W4 in the second direction D2. The blocking mask patterns 140 may be formed by anisotropically etching the spacer layer deposited on sidewalls of the sacrificial patterns, and the third width 160W3 may be changed depending on a deposition thickness of the spacer layer. In an implementation, the third width 160W3 of an odd-numbered one of the first regions 160Ha included in the holes 160H may be different from the third width 160W3 of an even-numbered one of the first regions 160Ha included in the holes 160H. In an implementation, the photoresist patterns formed by an extreme ultraviolet photolithography process may be used to pattern the blocking mask layer to form the blocking mask patterns 140, and the third widths 160W3 of the first regions 160Ha included in the holes 160H may be the same as each other. The fourth widths 160W4 of the first regions 160Ha included in the holes 160H may be the same as each other. The holes 160H may expose portions of the gate capping pattern CAP.

Referring to FIGS. 15 and 16A to 16D, the portions of the gate capping pattern CAP that are exposed by the holes 160H may be removed to allow each of the holes 160H to expose a portion of the gate electrode GE of a corresponding gate structure GS. The blocking mask patterns 140, the third mask pattern 138A, and the second mask pattern 136A may be removed while the gate capping pattern CAP is removed.

Referring to FIGS. 17 and 18A to 18D, the first mask pattern 134A may be used as an etching mask to partially remove the gate electrode GE exposed by each of the holes 160H, and thus through holes PH may be formed to penetrate the gate electrode GE. The through holes PH may include first regions PHa that are spaced apart from and aligned with each other along the first direction D1 while penetrating the gate structures GS that are adjacent to each other, and may also include a second region PHb elongated along the second direction D2 while penetrating one of the gate structures GS.

Each of the through holes PH may penetrate the gate dielectric pattern GI of a corresponding gate structure GS and may extend into the device isolation layer 102. The through hole PH may separate the corresponding gate structure GS into a plurality of gate structures GS that are spaced apart from each other in the second direction D2. The through holes PH may correspond to the holes 160H. The through holes PH may expose the device isolation layer 102.

Referring to FIGS. 19 and 20A to 20D, first isolation patterns 171 and a second isolation pattern 172 may be formed in the through holes PH. The formation of the first isolation patterns 171 and the second isolation pattern 172 may include forming an isolation layer that fills the through holes PH and performing a planarization process on the isolation layer. The planarization process on the isolation layer may locally form the first isolation patterns 171 and the second isolation pattern 172 in the through holes PH. The first isolation patterns 171 may be formed in the first regions PHa of the through holes PH, and the second isolation pattern 172 may be formed in the second region PHb of the through holes PH. The planarization process may remove the first mask pattern 134A.

The planarization process may cause a top surface 171U of each of the first isolation patterns 171, a top surface 172U of the second isolation pattern 172, a top surface CAP_U of the gate capping pattern CAP, and a top surface IL_U of the lower dielectric layer IL to be substantially coplanar with each other. Each of the first isolation patterns 171 may have a bottom surface 171L located at a lower level than that of a top surface 102_U of the device isolation layer 102.

In an implementation, each of the first isolation patterns 171 may extend into the device isolation layer 102. In this case, the bottom surface 171L of each of the first isolation patterns 171 may be located at a lower level than that of the top surface 102_U of the device isolation layer 102. The top surface 171U of each of the first isolation patterns 171 may be located at substantially the same level as that of the top surface CAP_U of the gate capping pattern CAP.

Each of the first isolation patterns 171 may have a first width W1 in the first direction D1 and a second width W2 in the second direction D2. In an implementation, the first width W1 of an odd-numbered one of the first isolation patterns 171 may be different from the first width W1 of an even-numbered one of the first isolation patterns 171. In an implementation, the first widths W1 of the first isolation patterns 171 may be the same as each other. The second widths W2 of the first isolation patterns 171 may be the same as each other. Each of the first isolation patterns 171 may include, e.g., silicon nitride (SiN).

The second isolation pattern 172 may extend in the second direction D2 between the source/drain patterns SD that are adjacent to each other. In an implementation, the second isolation pattern 172 may be a separation structure that separates neighboring source/drain patterns SD from each other. At least one of the first isolation patterns 171 and the second isolation pattern 172 may together be formed into a single unitary body. In an implementation, the second isolation pattern 172 may extend in the second direction D2 from at least one of the first isolation patterns 171. The second isolation pattern 172 may be between a pair of the first isolation patterns 171 that are adjacent to each other in the second direction D2, thereby being connected to each other. The second isolation pattern 172 may include silicon nitride (SiN).

In an implementation, the second isolation pattern 172 may extend into the device isolation layer 102. In this case, the second isolation patterns 172 may have bottom surfaces 172L located at a lower level than that of the top surface 102_U of the device isolation layer 102.

A first height H1 may be a height of the first isolation pattern 171. The height of the first isolation pattern 171 may indicate a distance between the bottom and top surfaces 171L and 171U of the first isolation pattern 171. A second height H2 may be a height of the second isolation pattern 172. The height of the second isolation pattern 172 may indicate a distance between the bottom and top surfaces 172L and 172U of the second isolation pattern 172. In an implementation, the first height H1 may be substantially the same as the second height H2.

The bottom surface 171L of the first isolation pattern 171 may be located at substantially the same level as that of the bottom surface 172L of the second isolation pattern 172. In an implementation, the bottom surface 171L of at least one of the first isolation patterns 171 may be substantially coplanar with the bottom surface 172L of the second isolation pattern 172.

A width in the first direction D1 of the second isolation pattern 172 may be substantially the same as the first width W1 of an even-numbered first isolation pattern 171. A width in the second direction D2 of the second isolation pattern 172 may be different from the second width W2 of the first isolation pattern 171. In an implementation, the width in the second direction D2 of the second isolation pattern 172 may be greater than the second width W2.

A lower dielectric layer IL may be formed on the substrate 100, covering the first isolation patterns 171, the second isolation pattern 172, the gate structures GS, and the source/drain patterns SD. The lower dielectric layer IL may expose the top surface 171U of each of the first isolation patterns 171 and the top surface 172U of the second isolation pattern 172. The lower dielectric layer IL may have a top surface IL_U substantially coplanar with the top surface 171U of each of the first isolation patterns 171, the top surface 172U of the second isolation pattern 172, and the top surface CAP_U of the gate capping pattern CAP.

According to some embodiments, the first isolation pattern 171 (as a gate cutting pattern) may be formed simultaneously with the second isolation pattern 172 (as a separation structure). In an implementation, the first isolation pattern 171 and the second isolation pattern 172 may be simultaneously formed into or as a single unitary body. In an implementation, the first isolation pattern 171 and the second isolation pattern 172 may be substantially the same in terms of width, top surface level, and height, and the lower dielectric layer IL may be easily etched to form first contacts 190 which will be discussed below. In an implementation, it is possible to minimize the occurrence of pattern defects in the first contacts 190. As a result, a semiconductor device may exhibit improved electrical characteristics. In an implementation, the first isolation pattern 171 and the second isolation pattern 172 may not be formed in different processes, but rather may be formed at the same time, and it is possible to simplify fabricating processes and to reduce manufacturing costs.

Referring back to FIGS. 1 and 2A to 2D, an upper dielectric layer 180 may be formed on the lower dielectric layer IL. The upper dielectric layer 180 may cover the top surface 171U of each of the first isolation patterns 171 and the top surface 172U of the second isolation pattern 172. A plurality of first contacts 190 may be formed on opposite sides of each of the gate structures GS. Each of the first contacts 190 may penetrate the upper dielectric layer 180 and the lower dielectric layer IL, and may be coupled to the source/drain pattern SD. At least one of the first contacts 190 may extend in the second direction D2 between the first isolation patterns 171 that are adjacent to each other. At least one of the first contacts 190 may penetrate the lower dielectric layer IL between the first isolation patterns 170 that are adjacent to each other.

In an implementation, second contacts may be formed in the upper dielectric layer 180. Each of the second contacts may penetrate the upper dielectric layer 180 and may be connected to the gate electrode GE of each of the gate structures GS. A plurality of wiring lines may be formed on the upper dielectric layer 180, and may be electrically connected to the first contacts 190 and the second contacts.

FIGS. 21A, 21B, 21C, and 21D illustrate cross-sectional views respectively taken along lines A-A', B-B', C-C', and D-D' of FIG. 1, of a semiconductor device according to some embodiments. In the embodiment that follows, a detailed description of features repetitive to those discussed above with reference to FIGS. 1 and 2A to 2D may be omitted, and a difference thereof will be discussed in detail.

Referring to FIGS. 1 and 21A to 21D, the lower dielectric layer IL may include a lower interlayer dielectric layer 120 and a dielectric pattern 132A that are sequentially stacked on the substrate 100. The lower interlayer dielectric layer 120 may cover the source/drain patterns SD and sidewalls of the gate structures GS. The lower interlayer dielectric layer 120 may expose the top surface CAP_U of the gate capping pattern CAP, and may have a top surface coplanar with the top surface CAP_U of the gate capping pattern CAP. The dielectric pattern 132A may be on the lower interlayer dielectric layer 120 and may cover the top surface CAP_U of the gate capping pattern CAP. The dielectric pattern 132A may cover sidewalls of the first isolation patterns 171 and may expose the top surface 171U of each of the first isolation patterns 171. The lower interlayer dielectric layer 120 may include, e.g., a silicon oxide layer, a silicon nitride layer, a silicon oxynitride layer, or a low-k dielectric layer. The dielectric pattern 132A may include an oxide (e.g., silicon oxide).

The first isolation patterns 171 and the second isolation pattern 172 may penetrate the dielectric pattern 132A and the gate structure GS. The top surface 171U of each of the first isolation patterns 171, the top surface 172U of the second isolation pattern 172, and the top surface IL_U of the lower dielectric layer IL may be located at substantially the same level. The top surface 171U of each of the first isolation patterns 171, the top surface 172U of the second isolation pattern 172, and the top surface IL_U of the lower dielectric layer IL may be located at a higher level than that of the top surface CAP_U of the gate capping pattern CAP.

FIGS. 22A, 22B, 22C, and 22D illustrate cross-sectional views respectively taken along lines A-A', B-B', C-C', and D-D' of FIG. 1, of a semiconductor device according to some embodiments. In the embodiment that follows, a detailed description of features repetitive to those discussed above with reference to FIGS. 1 and 2A to 2D may be omitted, and a difference thereof will be discussed in detail.

Referring to FIGS. 1 and 22A to 22D, each of the channel patterns CH may include a plurality of semiconductor patterns SP that are stacked vertically (e.g., in the third direction D3) on the active pattern ACT. The semiconductor patterns SP may be spaced apart from each other along the third direction D3, and a lowermost one of the semiconductor patterns SP may be spaced apart in the third direction D3 from the active pattern ACT. The semiconductor patterns SP may be between the source/drain patterns SD. Each of the semiconductor patterns SP may be connected to and in direct contact with the source/drain patterns SD. Each of the source/drain patterns SD may be in contact with sidewalls of the semiconductor patterns SP. The semiconductor patterns SP may include the same semiconductor material.

The gate electrode GE of each of the gate structures GS may be on the semiconductor patterns SP of a corresponding channel pattern CH. The gate electrode GE may extend between the semiconductor patterns SP and between the active pattern ACT and the lowermost semiconductor pattern SP. The gate electrode GE may extend in the second direction D2, and may cover the top surface of the device isolation layer 102 and sidewalls of a corresponding channel pattern CH (or of each semiconductor pattern SP), which sidewalls of the corresponding channel pattern CH (or of each semiconductor pattern SP) face each other in the second direction D2.

The gate dielectric pattern GI of each of the gate structures GS may be between the gate electrode GE and the channel pattern CH, and may extend between the gate electrode GE and the gate spacers GSP. The gate dielectric pattern GI may be between the gate electrode GE and each of the semiconductor patterns SP, and may surround each of the semiconductor patterns SP. Each of the semiconductor patterns SP may be spaced apart from the gate electrode GE across the gate dielectric pattern GI. The gate dielectric pattern GI may extend between the gate electrode GE and the source/drain patterns SD. The gate dielectric pattern GI may extend along a bottom surface of the gate electrode GE and may be between the gate electrode GE and the device isolation layer 102.

The gate electrode GE, the channel pattern CH, and the source/drain patterns SD may constitute a gate-all-around type field effect transistor or a multi-channel field effect transistor (MBCFET).

By way of summation and review, a scale down of MOSFETs could deteriorate operating characteristics of the semiconductor device. Accordingly, manufacturing a semiconductor device having excellent performances while overcoming limitations due to integration of the semiconductor device may be considered.

According to an embodiment, a first isolation pattern and a second isolation pattern may be formed at the same time. In an implementation, the first isolation pattern and the second isolation pattern may be simultaneously formed into or as a single unitary body. Therefore, the first isolation pattern and the second isolation pattern may be substantially the same in terms of width, top surface level, and height, and a lower dielectric layer may be easily etched to form first contacts. Therefore, it may be possible to minimize the occurrence of pattern defects in the first contacts. As a result, a semiconductor device may exhibit improved electrical properties.

One or more embodiments may provide a semiconductor device including a field effect transistor.

One or more embodiments may provide a semiconductor device with improved electrical properties.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate;
   a plurality of gate structures that are spaced apart from each other in a first direction on the substrate, the plurality of gate structures extending in a second direction intersecting the first direction, each gate structure of the plurality of gate structures including a gate electrode and a gate capping pattern on the gate electrode;
   a plurality of source/drain patterns on opposite sides of each gate structure of the plurality of gate structures;
   a plurality of first isolation patterns that respectively penetrate adjacent gate structures of the plurality of gate structures; and
   a second isolation pattern that extends in the second direction and between adjacent source/drain patterns of the plurality of source/drain patterns, and penetrates at least one gate structure of the plurality of gate structures,
   wherein:
   each first isolation pattern of the plurality of first isolation patterns separates two gate structures of the plurality of gate structures such that the two gate structures of the plurality of gate structures are spaced apart from each other in the second direction,
   the plurality of first isolation patterns are aligned with each other along the first direction, and
   top surfaces of the plurality of first isolation patterns and a top surface of the second isolation pattern are each located at a level the same as or higher than a level of a top surface of the gate capping pattern of each gate structure of the plurality of gate structures.

2. The semiconductor device as claimed in claim 1, further comprising a lower dielectric layer between the plurality of gate structures and extending between adjacent first isolation patterns of the plurality of first isolation patterns,
   wherein a top surface of the lower dielectric layer is located at a level the same as or higher than the level of the top surface of the gate capping pattern of each gate structure of the plurality of gate structures.

3. The semiconductor device as claimed in claim 1, wherein at least one first isolation pattern of the plurality of first isolation patterns and the second isolation pattern are formed as a single unitary body.

4. The semiconductor device as claimed in claim 1, wherein the top surface of each first isolation pattern of the plurality of first isolation patterns and the top surface of the second isolation pattern are substantially coplanar with each other.

5. The semiconductor device as claimed in claim 1, further comprising a plurality of first contacts on opposite sides of each gate structure of the plurality of gate structures and respectively connected to the plurality of source/drain patterns,
   wherein at least one first contact of the plurality of first contacts extends between adjacent first isolation patterns of the plurality of first isolation patterns.

6. The semiconductor device as claimed in claim 1, further comprising:
   a plurality of active patterns that extend in the first direction on the substrate; and
   a device isolation layer between the plurality of active patterns,
   wherein bottom surfaces of the plurality of first isolation patterns and a bottom surface of the second isolation pattern are each located at a level lower than a level of a top surface of the device isolation layer.

7. The semiconductor device as claimed in claim 1, wherein a bottom surface of at least one first isolation pattern of the plurality of first isolation patterns and a bottom surface of the second isolation pattern are substantially coplanar with each other.

8. The semiconductor device as claimed in claim 1, wherein heights of the plurality of first isolation patterns and a height of the second isolation pattern are substantially the same as each other.

9. The semiconductor device as claimed in claim 1, wherein:
   each first isolation pattern of the plurality of first isolation patterns has a first width in the first direction, and
   the first width of an odd-numbered first isolation pattern of the plurality of first isolation patterns is different from the first width of an even-numbered first isolation pattern of the plurality of first isolation patterns.

10. The semiconductor device as claimed in claim 1, wherein:
    each first isolation pattern of the plurality of first isolation patterns has a first width in the first direction, and
    the first widths of the plurality of first isolation patterns are substantially the same as each other.

11. A semiconductor device, comprising:
    a substrate;
    a plurality of active patterns on the substrate and extending in a first direction;
    a plurality of gate structures that are spaced apart from each other in the first direction on the substrate, the plurality of gate structures extending in a second direction intersecting the first direction, and crossing the plurality of active patterns;
    a plurality of source/drain patterns on the plurality of active patterns on opposite sides of each gate structure of the plurality of gate structures;
    a plurality of first isolation patterns that correspondingly penetrate adjacent gate structures of the plurality of gate structures, the plurality of first isolation patterns being aligned in the first direction; and a second isolation pattern that extends in the second direction between adjacent source/drain patterns of the plurality of source/drain patterns, and that penetrates at least one gate structure of the plurality of gate structures, wherein each first isolation pattern of the plurality of first isolation patterns separates two gate structures of the plurality of gate structures such that the two gate structures of the plurality of gate structures are spaced apart from each other in the second direction, and wherein a bottom surface of the second isolation pattern is substantially coplanar with a bottom surface of one first isolation pattern of the plurality of first isolation patterns.

12. The semiconductor device as claimed in claim 11, wherein at least one first isolation pattern of the plurality of first isolation patterns and the second isolation pattern are formed as a single unitary body.

13. The semiconductor device as claimed in claim 11, wherein:

each gate structure of the plurality of gate structures includes a gate electrode and a gate capping pattern on the gate electrode, and top surfaces of the plurality of first isolation patterns and a top surface of the second isolation pattern are each located at a level the same as or higher than a level of a top surface of the gate capping pattern of each gate structure of the plurality of gate structures.

14. The semiconductor device as claimed in claim 13, further comprising a plurality of first contacts on opposite sides of each gate structure of the plurality of gate structures and correspondingly connected to the plurality of source/drain patterns, wherein top surfaces of the plurality of first contacts are located at a level higher than the level of the top surface of the gate capping pattern of each gate structure of the plurality of gate structures.

15. The semiconductor device as claimed in claim 11, further comprising a lower dielectric layer between the plurality of gate structures and extending between adjacent first isolation patterns of the plurality of first isolation patterns, wherein a top surface of the lower dielectric layer, top surfaces of the plurality of first isolation patterns, and a top surface of the second isolation pattern are located at substantially the same level.

16. A semiconductor device, comprising:
a substrate;
a plurality of active patterns on the substrate, the plurality of active patterns extending in a first direction and being aligned with each other in a second direction that intersects the first direction;
a device isolation layer between the plurality of active patterns;
a plurality of gate structures spaced apart from each other in the first direction, the plurality of gate structures running across the plurality of active patterns and extending in the second direction;
a plurality of source/drain patterns on opposite sides of each gate structure of the plurality of gate structures;
a plurality of channel patterns between adjacent source/drain patterns of the plurality of source/drain patterns, the plurality of channel patterns protruding upwardly from the device isolation layer;
a plurality of first isolation patterns that respectively penetrate the plurality of gate structures and are aligned with each other along the first direction, each first isolation pattern of the plurality of first isolation patterns separating two gate structures of the plurality of gate structures such that the two gate structures of the plurality of gate structures are spaced apart from each other in the second direction;
a second isolation pattern that extends between adjacent source/drain patterns of the plurality of source/drain patterns and in the second direction from one first isolation pattern of the plurality of first isolation patterns, the second isolation pattern penetrating at least one gate structure of the plurality of gate structures;
a lower dielectric layer between the plurality of gate structures and extending between adjacent first isolation patterns of the plurality of first isolation patterns;
an upper dielectric layer on the lower dielectric layer; and
a plurality of first contacts that penetrate the upper dielectric layer and the lower dielectric layer and correspondingly connect with the plurality of source/drain patterns, wherein each gate structure of the plurality of gate structures includes:
a gate electrode;
a gate capping pattern on the gate electrode;
a gate dielectric pattern that extends along a bottom surface of the gate electrode; and
a plurality of gate spacers on opposite sidewalls of the gate electrode, and wherein top surfaces of the plurality of first isolation patterns and a top surface of the second isolation pattern are each located at a level the same as or higher than a level of a top surface of the gate capping pattern of each gate structure of the plurality of gate structures.

17. The semiconductor device as claimed in claim 16, wherein a bottom surface of the second isolation pattern is substantially coplanar with a bottom surface of one first isolation pattern of the plurality of first isolation patterns.

18. The semiconductor device as claimed in claim 17, wherein bottom surfaces of the plurality of first isolation patterns and the bottom surface of the second isolation pattern are located at a level lower than a level of a top surface of the device isolation layer.

19. The semiconductor device as claimed in claim 16, wherein a top surface of the lower dielectric layer, the top surfaces of the plurality of first isolation patterns, and the top surface of the second isolation pattern are located at substantially the same level.

20. The semiconductor device as claimed in claim 16, wherein at least one gate spacer of the plurality of gate spacers is between the lower dielectric layer and one first isolation pattern of the plurality of first isolation patterns.

* * * * *